(12) United States Patent
Shiraki et al.

(10) Patent No.: US 7,224,032 B2
(45) Date of Patent: May 29, 2007

(54) ELECTRONIC DEVICE, DISPLAY DEVICE AND PRODUCTION METHOD THEREOF

(75) Inventors: Ichiro Shiraki, Nara (JP); Mutsumi Nakajima, Nara (JP); Keisuke Yoshida, Nara (JP); Shoichi Andou, Mie (JP); Masayuki Inoue, Mie (JP)

(73) Assignee: Sharp Kabushiki Kaisha, Osaka (JP)

( * ) Notice: Subject to any disclaimer, the term of this patent is extended or adjusted under 35 U.S.C. 154(b) by 212 days.

(21) Appl. No.: 11/049,235

(22) Filed: Feb. 3, 2005

(65) Prior Publication Data

US 2005/0173707 A1     Aug. 11, 2005

(30) Foreign Application Priority Data

Feb. 5, 2004    (JP)   ............... 2004-029375
Dec. 27, 2004   (JP)   ............... 2004-377220

(51) Int. Cl.
*H01L 27/01*   (2006.01)
(52) U.S. Cl. ............... 257/347; 257/72; 349/54
(58) Field of Classification Search ............... 257/59, 257/72, 347; 349/54
See application file for complete search history.

(56) References Cited

U.S. PATENT DOCUMENTS 6,833,882 B2   12/2004   Lee

2003/0085427 A1 *   5/2003   Green et al. ............... 257/347

FOREIGN PATENT DOCUMENTS

JP   7-104311 A    4/1995
KR   2002-0085206 A   11/2002

* cited by examiner

*Primary Examiner*—Sara Crane
(74) *Attorney, Agent, or Firm*—Birch, Stewart, Kolasch & Birch, LLP

(57) ABSTRACT

A display device of the present invention comprises: a source line; a pixel electrode; a first TFT for switching an electrical connection between the source line and the pixel electrode; and a second TFT as a spare. The second TFT includes a semiconductor film and a gate electrode. The semiconductor film includes a source electrode and a drain electrode. The gate electrode is provided on the semiconductor film with a gate insulation film interposed therebetween. The display device includes an interlayer insulation film between the source line and the semiconductor film of the second TFT. The interlayer insulation film is thicker than the gate insulation film. When the first TFT is unusable, a contact hole is formed in the interlayer insulation film such that the source line is electrically connected to the source electrode, whereby the electrical connection between the source line and the pixel electrode is rendered switchable by the second TFT.

24 Claims, 33 Drawing Sheets

Laser irradiation direction

ELECTRONIC DEVICE, DISPLAY DEVICE AND PRODUCTION METHOD THEREOF

CROSS-REFERENCE TO RELATED APPLICATIONS

This Nonprovisional application claims priority under 35 U.S.C. §119(a) on Japanese Patent Application No. 2004-29375 filed on Feb. 5, 2004 and Japanese Patent Application No. 2004-377220 filed on Dec. 27, 2004, and the entire contents disclosed in the claims, specification and drawings of these applications are hereby incorporated by reference.

BACKGROUND OF THE INVENTION

1. Field of the Invention

The present invention relates to an electronic device, a display device and a production method thereof and specifically to a defect repair method for repairing a defective pixel of a liquid crystal display device.

2. Description of the Prior Art

The active matrix-driven liquid crystal display device has a switching element, such as a thin film transistor (hereinafter, referred to as "TFT"), or the like, in each pixel, which is the minimum unit of an image, and is therefore capable of surely lighting each pixel. Thus, the active matrix-driven liquid crystal display device is capable of fine moving-picture display and has been used as various types of displays.

In general liquid crystal display devices developed in recent years, various attempts have been made for the purpose of improving the aperture ratio of a pixel. Especially, a wire is formed of a low-resistance material to make the wire thinner, and the characteristics of a TFT are improved to promote miniaturization of the TFT.

Along with the miniaturization of wires and TFTs, there has been an increasing possibility of a defect in a pixel, which can be caused by wire disconnection, short-circuit, deterioration in the characteristics of TFTs, or the like, due to particles (contaminant particulates), dust, etc., attached onto a substrate surface during the production process of the liquid crystal display device.

In view of such, there have conventionally been proposed techniques of repairing the pixel defect, and the techniques have been practically used in liquid crystal display devices.

For example, Japanese Unexamined Patent Publication No. 7-104311 discloses a liquid crystal display device wherein a plurality of TFTs are provided in each pixel.

FIG. 33 is a schematic plan view of an active matrix substrate 60 of a liquid crystal display device disclosed in Japanese Unexamined Patent Publication No. 7-104311. FIG. 34 is a schematic cross-sectional view of the substrate 60 taken along line XXXIV—XXXIV of FIG. 33. FIG. 35 is a schematic cross-sectional view of the substrate 60 taken along line XXXV—XXXV of FIG. 33.

This liquid crystal display device includes the active matrix substrate 60 which includes a plurality of pixel electrodes 8 arranged in a matrix, a counter substrate which includes a common electrode, and a liquid crystal layer interposed between the substrates.

In the active matrix substrate 60, a plurality of gate lines 1 and a plurality of source lines 2 extend over a glass substrate 10 so as to cross each other at right angles, and capacitor lines 3 run between the gate lines 1 so as to extend in parallel to the gate lines 1. A region enclosed by a pair of gate lines 1 and source lines 2 has a pixel electrode 8. On the gate line 1, a first TFT 5a and a second TFT 5b are provided.

The first TFT 5a includes: a gate electrode which is formed by a part of the gate line 1; a gate insulation film 12 provided so as to cover the gate electrode; a semiconductor film 4 provided on the gate insulation film 12 so as to correspond to the gate electrode; a source electrode provided on the semiconductor film 4, which is a branch of the source line 2; and a drain electrode 19a provided on the semiconductor film 4 and connected to the pixel electrode 8. The drain electrode 19a has a disconnection portion X which has a constricted shape so as to be readily disconnected.

The second TFT 5b has substantially the same structure as that of the first TFT 5a except for a portion between a drain electrode 19b and the pixel electrode 8.

In the portion between the drain electrode 19b and the pixel electrode 8, a drain electrode-extended electrode 19d is provided. The drain electrode-extended electrode 19d is connected to the second TFT drain electrode 19b through a contact hole 19c formed in the gate insulation film 12. An overlapping portion of the drain electrode-extended electrode 19d and the pixel electrode 8 constitutes a connection portion Y.

In this liquid crystal display device, in the process of displaying an image, a gate signal is transmitted through a predetermined gate line 1 so that a first TFT 5a connected to the gate line 1 is turned on. At the same time, a source signal is transmitted through a source line 2 so that a predetermined charge is written in the pixel electrode 8 through the source electrode and the drain electrode 19a. As a result, a potential difference occurs between the pixel electrode 8 and the common electrode, so that a predetermined voltage is applied to the liquid crystal capacitor, which is formed by the liquid crystal layer, and auxiliary capacitor. The applied voltage changes the orientation of liquid crystal molecules which constitute the liquid crystal layer, whereby the transmittance of light coming from the outside is adjusted to display an image.

In the case where any of the pixels is a defective pixel due to the characteristic deterioration of the first TFT 5a, the defective pixel is repaired by irradiating the disconnection portion X of the first TFT 5a with laser light to disconnect the drain electrode 19a and irradiating the connection portion Y with laser light to form a contact hole in the gate insulation film 12 such that a short circuit is caused between the pixel electrode 8 and the drain electrode 19b of the second TFT 5b through the drain electrode-extended electrode 19d.

As a result, the pixel electrode 8 of the defective pixel is not driven by the first TFT 5a having deteriorated characteristics but by the second TFT 5b.

However, there is a possibility of a short circuit between the pixel electrode 8 and the drain electrode-extended electrode 19d, i.e., between the conductive layers sandwiching the gate insulation film 12 in which a contact is formed, because the thickness of the gate insulation film 12 is generally as thin as 100 nm to 300 nm such that desirable TFT characteristics are obtained and further because of miniaturization of wires and TFTs in the above-described liquid crystal display device. In other words, when the second TFT 5b is provided in each pixel as a spare, there is a possibility that the fraction defective of the liquid crystal display device increases, and the production yield decreases, contrary to the intent.

SUMMARY OF THE INVENTION

The present invention was conceived in view of the above. An objective of the present invention is to provide an electronic device, a display device and a production method (repair method) thereof wherein a decrease in the production yield is suppressed even when a spare TFT is provided in each pixel.

An electronic device of the present invention comprises: a signal supplying section; a signal receiving section; a first switching element for switching an electrical connection between the signal supplying section and the signal receiving section; and a second switching element as a spare, wherein the second switching element includes a semiconductor film and a gate electrode, the semiconductor film including a source electrode and a drain electrode, the gate electrode being provided on the semiconductor film with a gate insulation film interposed therebetween, the electronic device includes an interlayer insulation film between the signal supplying section and the semiconductor film of the second switching element, the interlayer insulation film being thicker than the gate insulation film, the signal supplying section is electrically connectable to the source electrode of the semiconductor film by forming a contact hole in the interlayer insulation film, the electronic device includes an interlayer insulation film between the signal receiving section and the semiconductor film of the second switching element, the interlayer insulation film being thicker than the gate insulation film, the signal receiving section is electrically connectable to the drain electrode of the semiconductor film by forming a contact hole in the interlayer insulation film, and when the first switching element is unusable, the electrical connection between the signal supplying section and the signal receiving section is rendered switchable by the second switching element by forming a contact hole in the interlayer insulation film.

An electronic device of the present invention comprises: a signal supplying section; a signal receiving section; a first switching element for switching an electrical connection between the signal supplying section and the signal receiving section; and a second switching element as a spare, wherein the second switching element includes a semiconductor film and a gate electrode, the semiconductor film including a source electrode and a drain electrode, the gate electrode being provided on the semiconductor film with a gate insulation film interposed therebetween, the electronic device includes an interlayer insulation film between the signal supplying section and the semiconductor film of the second switching element, the interlayer insulation film being thicker than the gate insulation film, the signal supplying section is electrically connectable to the source electrode of the semiconductor film by forming a contact hole in the interlayer insulation film, and when the first switching element is unusable, the electrical connection between the signal supplying section and the signal receiving section is rendered switchable by the second switching element by forming a contact hole in the interlayer insulation film.

An electronic device of the present invention comprises: a signal supplying section; a signal receiving section; a first switching element for switching an electrical connection between the signal supplying section and the signal receiving section; and a second switching element as a spare, wherein the second switching element includes a semiconductor film and a gate electrode, the semiconductor film including a source electrode and a drain electrode, the gate electrode being provided on the semiconductor film with a gate insulation film interposed therebetween, the electronic device includes an interlayer insulation film between the signal receiving section and the semiconductor film of the second switching element, the interlayer insulation film being thicker than the gate insulation film, the signal receiving section is electrically connectable to the drain electrode of the semiconductor film by forming a contact hole in the interlayer insulation film, and when the first switching element is unusable, the electrical connection between the signal supplying section and the signal receiving section is rendered switchable by the second switching element by forming a contact hole in the interlayer insulation film.

In the above structures, the contact hole which enables switching of the electrical connection between the signal supplying section and the signal receiving section by the second switching element is formed in the interlayer insulation film which is thicker than the gate insulation film. Thus, the electrical insulation between the source electrode and the signal supplying section and the electrical insulation between the drain electrode and the signal receiving section are maintained.

When the first switching element is unusable, switching of the electrical connection between the signal supplying section and the signal receiving section using the spare second switching element is enabled as described below.

In the case where the signal supplying section is electrically connectable to the source electrode of the semiconductor film by forming a contact hole in the interlayer insulation film provided therebetween and the signal receiving section is electrically connectable to the drain electrode of the semiconductor film by forming a contact hole in the interlayer insulation film provided therebetween, both of the contact holes are formed, whereby switching of the electrical connection by the second switching element is enabled.

Alternatively, in the case where the signal receiving section and the drain electrode of the semiconductor film are electrically connected in advance and the signal supplying section is electrically connectable to the source electrode of the semiconductor film by forming a contact hole in the interlayer insulation film provided therebetween, the contact hole is formed, whereby switching of the electrical connection by the second switching element is enabled.

Alternatively, in the case where the signal supplying section and the source electrode of the semiconductor film are electrically connected in advance and the signal receiving section is electrically connectable to the drain electrode of the semiconductor film by forming a contact hole in the interlayer insulation film provided therebetween, the contact hole is formed, whereby switching of the electrical connection by the second switching element is enabled.

As described above, when the first switching element is unusable, the electrical connection between the signal supplying section and the signal receiving section is switchable using the second switching element. Further, since the electrical insulation between the source electrode and the signal supplying section and the electrical insulation between the drain electrode and the signal receiving section are maintained, the possibility of occurrence of a short circuit between the source electrode and the signal supplying section and between the drain electrode and the signal receiving section is decreased during production. Therefore, a decrease in the production yield is suppressed even if the spare second switching element is provided.

The first switching element may include a semiconductor film and a gate electrode, the semiconductor film including a source electrode and a drain electrode, the gate electrode being provided on the semiconductor film with a gate insulation film interposed therebetween. The drain electrodes of the first switching element and the second switching element may be electrically connected to the signal receiving section through a same contact hole.

In the above structure, the signal receiving section and the drain electrodes of the first switching element and the second switching element are electrically connected through the same contact hole. That is, part of the elements that constitute the first switching element and the second switching element, i.e., the contact hole for connecting the signal receiving section and the drain electrodes, is shared among the switching elements. Therefore, the area occupied by the contact hole in a pixel is decreased and, accordingly, the aperture ratio of the pixel is improved. In the case where the contact hole is formed under the reflector electrode, the area of the reflector electrode is decreased, and accordingly, the aperture ratio of the transmission region improves.

The first switching element may include a semiconductor film and a gate electrode, the semiconductor film including a source electrode and a drain electrode, the gate electrode being provided on the semiconductor film with a gate insulation film interposed therebetween. The source electrodes of the first switching element and the second switching element may be electrically connected to the signal supplying section through a same contact hole.

In the above structure, the signal supplying section and the source electrodes of the first switching element and the second switching element are electrically connected through the same contact hole. That is, part of the elements that constitute the first switching element and the second switching element, i.e., the contact hole for connecting the signal supplying section and the source electrodes, is shared among the switching elements. Therefore, the area occupied by the contact hole in a pixel is decreased and, accordingly, the aperture ratio of the pixel is improved. In the case where the contact hole is formed under the reflector electrode, the area of the reflector electrode is decreased, and accordingly, the aperture ratio of the transmission region improves.

A display device of the present invention comprises: a source line; a pixel electrode; a first switching element for switching an electrical connection between the source line and the pixel electrode; and a second switching element as a spare, wherein the second switching element includes a semiconductor film and a gate electrode, the semiconductor film including a source electrode and a drain electrode, the gate electrode being provided on the semiconductor film with a gate insulation film interposed therebetween, the display device includes an interlayer insulation film between the source line and the semiconductor film of the second switching element, the interlayer insulation film being thicker than the gate insulation film, the source line is electrically connectable to the source electrode of the semiconductor film by forming a contact hole in the interlayer insulation film, the display device includes an interlayer insulation film between the pixel electrode and the semiconductor film of the second switching element, the interlayer insulation film being thicker than the gate insulation film, the pixel electrode is electrically connectable to the drain electrode of the semiconductor film by forming a contact hole in the interlayer insulation film, and when the first switching element is unusable, the electrical connection between the source line and the pixel electrode is rendered switchable by the second switching element by forming a contact hole in the interlayer insulation film.

A display device of the present invention comprises: a source line; a pixel electrode; a first switching element for switching an electrical connection between the source line and the pixel electrode; and a second switching element as a spare, wherein the second switching element includes a semiconductor film and a gate electrode, the semiconductor film including a source electrode and a drain electrode, the gate electrode being provided on the semiconductor film with a gate insulation film interposed therebetween, the display device includes an interlayer insulation film between the source line and the semiconductor film of the second switching element, the interlayer insulation film being thicker than the gate insulation film, the source line is electrically connectable to the source electrode of the semiconductor film by forming a contact hole in the interlayer insulation film, and when the first switching element is unusable, the electrical connection between the source line and the pixel electrode is rendered switchable by the second switching element by forming a contact hole in the interlayer insulation film.

A display device of the present invention comprises: a source line; a pixel electrode; a first switching element for switching an electrical connection between the source line and the pixel electrode; and a second switching element as a spare, wherein the second switching element includes a semiconductor film and a gate electrode, the semiconductor film including a source electrode and a drain electrode, the gate electrode being provided on the semiconductor film with a gate insulation film interposed therebetween, the display device includes an interlayer insulation film between the pixel electrode and the semiconductor film of the second switching element, the interlayer insulation film being thicker than the gate insulation film, the pixel electrode is electrically connectable to the drain electrode of the semiconductor film by forming a contact hole in the interlayer insulation film, and when the first switching element is unusable, the electrical connection between the source line and the pixel electrode is rendered switchable by the second switching element by forming a contact hole in the interlayer insulation film.

In the above structures, the contact hole which enables switching of the electrical connection between the source line and the pixel electrode by the second switching element is formed in the interlayer insulation film which is thicker than the gate insulation film. Thus, the electrical insulation between the source electrode and the source line and the electrical insulation between the drain electrode and the pixel electrode are maintained.

When the first switching element is unusable, switching of the electrical connection between the source line and the pixel electrode using the spare second switching element is enabled as described below.

In the case where the source line is electrically connectable to the source electrode of the semiconductor film by forming a contact hole in the interlayer insulation film provided therebetween and the pixel electrode is electrically connectable to the drain electrode of the semiconductor film by forming a contact hole in the interlayer insulation film provided therebetween, both of the contact holes are formed, whereby switching of the electrical connection by the second switching element is enabled.

Alternatively, in the case where the pixel electrode and the drain electrode of the semiconductor film are electrically connected in advance and the source line is electrically connectable to the source electrode of the semiconductor film by forming a contact hole in the interlayer insulation film provided therebetween, the contact hole is formed, whereby switching of the electrical connection by the second switching element is enabled.

Alternatively, in the case where the source line and the source electrode of the semiconductor film are electrically connected in advance and the pixel electrode is electrically connectable to the drain electrode of the semiconductor film by forming a contact hole in the interlayer insulation film provided therebetween, the contact hole is formed, whereby switching of the electrical connection by the second switching element is enabled.

As described above, when the first switching element is unusable, the electrical connection between the source line and the pixel electrode is switchable using the second switching element. Further, since the electrical insulation between the source electrode and the source line and the electrical insulation between the drain electrode and the pixel electrode are maintained, the possibility of occurrence of a short circuit between the source electrode and the source line and between the drain electrode and the pixel electrode is decreased during production. Therefore, a decrease in the production yield is suppressed even if the spare second switching element is provided.

The source electrode of the semiconductor film of the second switching element may be electrically connected to the source line in advance.

In the above structure, the source electrode of the semiconductor film of the second switching element is electrically connected to the source line in advance. When the first switching element is unusable, the pixel electrode is connectable to the drain electrode of the semiconductor film by forming a contact hole in the interlayer insulation film. Thus, the parasitic capacitor which is caused when the switching element is off, which is dominant over the burden imposed on a source line, is reduced.

Specifically, since the source electrode of the semiconductor film is electrically connected to the source line in advance, the parasitic capacitor which is to be considered when the second switching element is off is only one that is caused between the source electrode and the gate electrode and one that is caused between the source electrode and the pixel electrode. Alternatively, in the case where the drain electrode of the semiconductor film is electrically connected to the pixel electrode in advance, the parasitic capacitor which is caused between the source electrode and the source line needs to be considered as well as one caused between the source electrode and the gate electrode and one caused between the source electrode and the pixel electrode.

With the above structure, the parasitic capacitor which is caused when the second switching element is off is reduced, the burden imposed on the source line is decreased, a driver can be designed to have a lower capacity, and as a result, the power consumption of the display device can be reduced.

The display device of the present invention further comprises a gate line electrically connected to the gate electrode of the second switching element. The first and second switching elements are provided at opposite sides of the gate line.

In the above structure, since the first and second switching elements are provided at opposite sides of the gate line, the first and second switching elements are away from each other. Thus, the influence of the formation of the second switching element on the formation of the first switching element is decreased. Therefore, a decrease in the production yield is suppressed even if the second switching element is provided as a spare. Further, the probability that both of the switching elements result in a characteristic deterioration, such as a pattern disorder, or the like, is decreased. Thus, the repairability of the display device increases.

The display device of the present invention further comprises a reflector electrode which covers the first and second switching elements.

In the above structure, since the reflector electrode covers the first and second switching elements, the regions of the first and second switching elements constitute a reflection region. Thus, the display device is a reflective or semitransmissive display device which has a reflection region, wherein the decrease of the aperture ratio is suppressed.

The first switching element may include a semiconductor film and a gate electrode, the semiconductor film including a source electrode and a drain electrode, the gate electrode being provided on the semiconductor film with a gate insulation film interposed therebetween. The drain electrodes of the first switching element and the second switching element may be electrically connected to the pixel electrode through a same contact hole.

In the above structure, the pixel electrode and the drain electrodes of the first switching element and the second switching element are electrically connected through the same contact hole. That is, part of the elements that constitute the first switching element and the second switching element, i.e., the contact hole for connecting the pixel electrode and the drain electrodes, is shared among the switching elements. Therefore, the area occupied by the contact hole in a pixel is decreased and, accordingly, the aperture ratio of the pixel is improved. In the case where the contact hole is formed under the reflector electrode, the area of the reflector electrode is decreased, and accordingly, the aperture ratio of the transmission region improves.

The first switching element may include a semiconductor film and a gate electrode, the semiconductor film including a source electrode and a drain electrode, the gate electrode being provided on the semiconductor film with a gate insulation film interposed therebetween. The source electrodes of the first switching element and the second switching element may be electrically connected to the source line through a same contact hole.

In the above structure, the source line and the source electrodes of the first switching element and the second switching element are electrically connected through the same contact hole. That is, part of the elements that constitute the first switching element and the second switching element, i.e., the contact hole for connecting the source line and the source electrodes, is shared among the switching elements. Therefore, the area occupied by the contact hole in a pixel is decreased and, accordingly, the aperture ratio of the pixel is improved. In the case where the contact hole is formed under the reflector electrode, the area of the reflector electrode is decreased, and accordingly, the aperture ratio of the transmission region improves.

A display device of the present invention comprises: a source line; a pixel electrode; a first switching element for switching an electrical connection between the source line and the pixel electrode; and a second switching element as a spare, wherein the second switching element includes a semiconductor film and a gate electrode, the semiconductor film including a source electrode and a drain electrode, the gate electrode being provided on the semiconductor film with a gate insulation film interposed therebetween, the display device includes an interlayer insulation film between the source line and the semiconductor film of the second switching element, the interlayer insulation film being thicker than the gate insulation film, the source line is electrically connectable to the source electrode of the semiconductor film by forming a contact hole in the interlayer insulation film, the display device includes an interlayer insulation film between the pixel electrode and the semiconductor film of the second switching element, the interlayer insulation film being thicker than the gate insulation film, the pixel electrode is electrically connectable to the drain electrode of the semiconductor film by forming a contact hole in the interlayer insulation film, and the first switching element is unusable, and the interlayer insulation film has the contact hole such that the electrical connection between the source line and the pixel electrode is switchable by the second switching element.

A display device of the present invention comprises: a source line; a pixel electrode; a first switching element for switching an electrical connection between the source line and the pixel electrode; and a second switching element as a spare, wherein the second switching element includes a semiconductor film and a gate electrode, the semiconductor film including a source electrode and a drain electrode, the gate electrode being provided on the semiconductor film with a gate insulation film interposed therebetween, the display device includes an interlayer insulation film between the source line and the semiconductor film of the second switching element, the interlayer insulation film being thicker than the gate insulation film, the source line is electrically connectable to the source electrode of the semiconductor film by forming a contact hole in the interlayer insulation film, and the first switching element is unusable, and the interlayer insulation film has the contact hole such that the electrical connection between the source line and the pixel electrode is switchable by the second switching element.

A display device of the present invention comprises: a source line; a pixel electrode; a first switching element for switching an electrical connection between the source line and the pixel electrode; and a second switching element as a spare, wherein the second switching element includes a semiconductor film and a gate electrode, the semiconductor film including a source electrode and a drain electrode, the gate electrode being provided on the semiconductor film with a gate insulation film interposed therebetween, the display device includes an interlayer insulation film between the pixel electrode and the semiconductor film of the second switching element, the interlayer insulation film being thicker than the gate insulation film, the pixel electrode is electrically connectable to the drain electrode of the semiconductor film by forming a contact hole in the interlayer insulation film, and the first switching element is unusable, and the interlayer insulation film has the contact hole such that the electrical connection between the source line and the pixel electrode is switchable by the second switching element.

In the above structures, the contact hole is formed in the interlayer insulation film, whereby switching of the electrical connection between the source line and the pixel electrode by the second switching element is enabled. Switching of the electrical connection between the source line and the pixel electrode is performed not by the unusable first switching element but by the spare second switching element, whereby normal display is achieved.

Specifically, when the first switching element is unusable, switching of the electrical connection between the source line and the pixel electrode using the spare second switching element is enabled as described below.

In the case where the source line is electrically connectable to the source electrode of the semiconductor film by forming a contact hole in the interlayer insulation film provided therebetween and the pixel electrode is electrically connectable to the drain electrode of the semiconductor film by forming a contact hole in the interlayer insulation film provided therebetween, both of the contact holes are formed, whereby switching of the electrical connection by the second switching element is enabled.

Alternatively, in the case where the pixel electrode and the drain electrode of the semiconductor film are electrically connected in advance and the source line is electrically connectable to the source electrode of the semiconductor film by forming a contact hole in the interlayer insulation film provided therebetween, the contact hole is formed, whereby switching of the electrical connection by the second switching element is enabled.

Alternatively, in the case where the source line and the source electrode of the semiconductor film are electrically connected in advance and the pixel electrode is electrically connectable to the drain electrode of the semiconductor film by forming a contact hole in the interlayer insulation film provided therebetween, the contact hole is formed, whereby switching of the electrical connection by the second switching element is enabled.

The first switching element may include a semiconductor film and a gate electrode, the semiconductor film including a source electrode and a drain electrode, the gate electrode being provided on the semiconductor film with a gate insulation film interposed therebetween. The drain electrodes of the first switching element and the second switching element may be electrically connected to the pixel electrode through a same contact hole.

In the above structure, the pixel electrode and the drain electrodes of the first switching element and the second switching element are electrically connected through the same contact hole. That is, part of the elements that constitute the first switching element and the second switching element, i.e., the contact hole for connecting the pixel electrode and the drain electrodes, is shared among the switching elements. Therefore, the area occupied by the contact hole in a pixel is decreased and, accordingly, the aperture ratio of the pixel is improved. In the case where the contact hole is formed under the reflector electrode, the area of the reflector electrode is decreased, and accordingly, the aperture ratio of the transmission region improves.

The first switching element may include a semiconductor film and a gate electrode, the semiconductor film including a source electrode and a drain electrode, the gate electrode being provided on the semiconductor film with a gate insulation film interposed therebetween. The source electrodes of the first switching element and the second switching element may be electrically connected to the source line through a same contact hole.

In the above structure, the source line and the source electrodes of the first switching element and the second switching element are electrically connected through the same contact hole. That is, part of the elements that constitute the first switching element and the second switching element, i.e., the contact hole for connecting the source line and the source electrodes, is shared among the switching elements. Therefore, the area occupied by the contact hole in a pixel is decreased and, accordingly, the aperture ratio of the pixel is improved. In the case where the contact hole is formed under the reflector electrode, the area of the reflector electrode is decreased, and accordingly, the aperture ratio of the transmission region improves.

A display device production method of the present invention is a method for producing a display device including: a source line; a pixel electrode; a first switching element for switching an electrical connection between the source line and the pixel electrode; and a second switching element as a spare, wherein the second switching element includes a semiconductor film and a gate electrode, the semiconductor film including a source electrode and a drain electrode, the gate electrode being provided on the semiconductor film with a gate insulation film interposed therebetween, the display device includes an interlayer insulation film between the source line and the semiconductor film of the second switching element, the interlayer insulation film being thicker than the gate insulation film, the source line is electrically connectable to the source electrode of the semiconductor film by forming a contact hole in the interlayer insulation film, the display device includes an interlayer insulation film between the pixel electrode and the semiconductor film of the second switching element, the interlayer insulation film being thicker than the gate insulation film, and the pixel electrode is electrically connectable to the drain electrode of the semiconductor film by forming a contact hole in the interlayer insulation film, the production method comprising the step of forming a contact hole in an interlayer insulation film corresponding to the second switching element of a pixel which is to be repaired.

A display device production method of the present invention is a method for producing a display device including: a source line; a pixel electrode; a first switching element for switching an electrical connection between the source line and the pixel electrode; and a second switching element as a spare, wherein the second switching element includes a semiconductor film and a gate electrode, the semiconductor film including a source electrode and a drain electrode, the gate electrode being provided on the semiconductor film with a gate insulation film interposed therebetween, the display device includes an interlayer insulation film between the source line and the semiconductor film of the second switching element, the interlayer insulation film being thicker than the gate insulation film, and the source line is electrically connectable to the source electrode of the semiconductor film by forming a contact hole in the interlayer insulation film, the production method comprising the step of forming a contact hole in an interlayer insulation film corresponding to the second switching element of a pixel which is to be repaired.

A display device production method of the present invention is a method for producing a display device including: a source line; a pixel electrode; a first switching element for switching an electrical connection between the source line and the pixel electrode; and a second switching element as a spare, wherein the second switching element includes a semiconductor film and a gate electrode, the semiconductor film including a source electrode and a drain electrode, the gate electrode being provided on the semiconductor film with a gate insulation film interposed therebetween, the display device includes an interlayer insulation film between the pixel electrode and the semiconductor film of the second switching element, the interlayer insulation film being thicker than the gate insulation film, and the pixel electrode is electrically connectable to the drain electrode of the semiconductor film by forming a contact hole in the interlayer insulation film, the production method comprising the step of forming a contact hole in an interlayer insulation film corresponding to the second switching element of a pixel which is to be repaired.

A display device production method of the present invention is a method for producing a display device including: a source line; a pixel electrode; a first switching element for switching an electrical connection between the source line and the pixel electrode; and a second switching element as a spare, wherein the second switching element includes a semiconductor film and a gate electrode, the semiconductor film including a source electrode and a drain electrode, the gate electrode being provided on the semiconductor film with a gate insulation film interposed therebetween, the display device includes an interlayer insulation film between the source line and the semiconductor film of the second switching element, the interlayer insulation film being thicker than the gate insulation film, the source line is electrically connectable to the source electrode of the semiconductor film by forming a contact hole in the interlayer insulation film, the display device includes an interlayer insulation film between the pixel electrode and the semiconductor film of the second switching element, the interlayer insulation film being thicker than the gate insulation film, and the pixel electrode is electrically connectable to the drain electrode of the semiconductor film by forming a contact hole in the interlayer insulation film, the production method comprising: a defective pixel detection step of detecting a defective pixel; and a defect repair step of repairing the defective pixel by forming a contact hole in an interlayer insulation film of the defective pixel such that the source electrode of the second switching element is electrically connected to the source line and the drain electrode of the second switching element is electrically connected to the pixel electrode.

A display device production method of the present invention is a method for producing a display device including: a source line; a pixel electrode; a first switching element for switching an electrical connection between the source line and the pixel electrode; and a second switching element as a spare, wherein the second switching element includes a semiconductor film and a gate electrode, the semiconductor film including a source electrode and a drain electrode, the gate electrode being provided on the semiconductor film with a gate insulation film interposed therebetween, the display device includes an interlayer insulation film between the source line and the semiconductor film of the second switching element, the interlayer insulation film being thicker than the gate insulation film, and the source line is electrically connectable to the source electrode of the semiconductor film by forming a contact hole in the interlayer insulation film, the production method comprising: a defective pixel detection step of detecting a defective pixel; and a defect repair step of repairing the defective pixel by forming a contact hole in an interlayer insulation film of the defective pixel such that the source electrode of the second switching element is electrically connected to the source line.

A display device production method of the present invention is a method for producing a display device including: a source line; a pixel electrode; a first switching element for switching an electrical connection between the source line and the pixel electrode; and a second switching element as a spare, wherein the second switching element includes a semiconductor film and a gate electrode, the semiconductor film including a source electrode and a drain electrode, the gate electrode being provided on the semiconductor film with a gate insulation film interposed therebetween, the display device includes an interlayer insulation film between the pixel electrode and the semiconductor film of the second switching element, the interlayer insulation film being thicker than the gate insulation film, and the pixel electrode is electrically connectable to the drain electrode of the semiconductor film by forming a contact hole in the interlayer insulation film, the production method comprising: a defective pixel detection step of detecting a defective pixel; and a defect repair step of repairing the defective pixel by forming a contact hole in an interlayer insulation film of the defective pixel such that the drain electrode of the second switching element is electrically connected to the pixel electrode.

According to the above methods, a contact hole is formed in an interlayer insulation film corresponding to a second switching element in a pixel to be repaired, whereby switching of the electrical connection between a source line and a pixel electrode by a second switching element is enabled. As a result, normal display is achieved. Further, since a display device which includes an unusable first switching element can be repaired to restore normal display, the production yield of the display device also can be improved.

Specifically, in the defective pixel detection step, a defective pixel wherein the first switching element is unusable is detected, and then, the defective pixel is subjected to the defect repair step which is described below, whereby switching of the electrical connection between the source line and the pixel electrode using the spare second switching element is enabled.

In the case where the source line is electrically connectable to the source electrode of the semiconductor film by forming a contact hole in the interlayer insulation film provided therebetween and the pixel electrode is electrically connectable to the drain electrode of the semiconductor film by forming a contact hole in the interlayer insulation film provided therebetween, both of the contact holes are formed, whereby switching of the electrical connection by the second switching element is enabled.

Alternatively, in the case where the pixel electrode and the drain electrode of the semiconductor film are electrically connected in advance and the source line is electrically connectable to the source electrode of the semiconductor film by forming a contact hole in the interlayer insulation film provided therebetween, the contact hole is formed, whereby switching of the electrical connection by the second switching element is enabled.

Alternatively, in the case where the source line and the source electrode of the semiconductor film are electrically connected in advance and the pixel electrode is electrically connectable to the drain electrode of the semiconductor film by forming a contact hole in the interlayer insulation film provided therebetween, the contact hole is formed, whereby switching of the electrical connection by the second switching element is enabled.

The first switching element may include a semiconductor film and a gate electrode, the semiconductor film including a source electrode and a drain electrode, the gate electrode being provided on the semiconductor film with a gate insulation film interposed therebetween. The drain electrodes of the first switching element and the second switching element may be electrically connected to the pixel electrode through a same contact hole.

In the above method, the pixel electrode and the drain electrodes of the first switching element and the second switching element are electrically connected through the same contact hole. That is, part of the elements that constitute the first switching element and the second switching element, i.e., the contact hole for connecting the pixel electrode and the drain electrodes, is shared among the switching elements. Therefore, the area occupied by the contact hole in a pixel is decreased and, accordingly, the aperture ratio of the pixel is improved. In the case where the contact hole is formed under the reflector electrode, the area of the reflector electrode is decreased, and accordingly, the aperture ratio of the transmission region improves.

The first switching element may include a semiconductor film and a gate electrode, the semiconductor film including a source electrode and a drain electrode, the gate electrode being provided on the semiconductor film with a gate insulation film interposed therebetween. The source electrodes of the first switching element and the second switching element may be electrically connected to the source line through a same contact hole.

In the above structure, the source line and the source electrodes of the first switching element and the second switching element are electrically connected through the same contact hole. That is, part of the elements that constitute the first switching element and the second switching element, i.e., the contact hole for connecting the source line and the source electrodes, is shared among the switching elements. Therefore, the area occupied by the contact hole in a pixel is decreased and, accordingly, the aperture ratio of the pixel is improved. In the case where the contact hole is formed under the reflector electrode, the area of the reflector electrode is decreased, and accordingly, the aperture ratio of the transmission region improves.

As described above, in a display device of the present invention, a contact hole which enables switching of the electrical connection between the source line and the pixel electrode by the second switching element is formed in the interlayer insulation film which is thicker than the gate insulation film. Thus, the electrical insulation between the source electrode and the source line and the electrical insulation between the drain electrode and the pixel electrode are maintained. With such a structure, the possibility of a short circuit between the source electrode and the source line and between the drain electrode and the pixel electrode is decreased during production. Therefore, a decrease in the production yield is suppressed even if the spare second switching element is provided.

DESCRIPTION OF THE PREFERRED EMBODIMENTS

Hereinafter, embodiments of the present invention will be described in detail with reference to the drawings. In the following sections, a liquid crystal display device which uses a TFT as a switching element will be described as an example of the display device of the present invention. It should be noted, however, that the present invention is not limited to the following examples but may be carried out in different forms.

Embodiment 1

Hereinafter, a liquid crystal display device 50 of embodiment 1 of the present invention is described.

Figure 1:
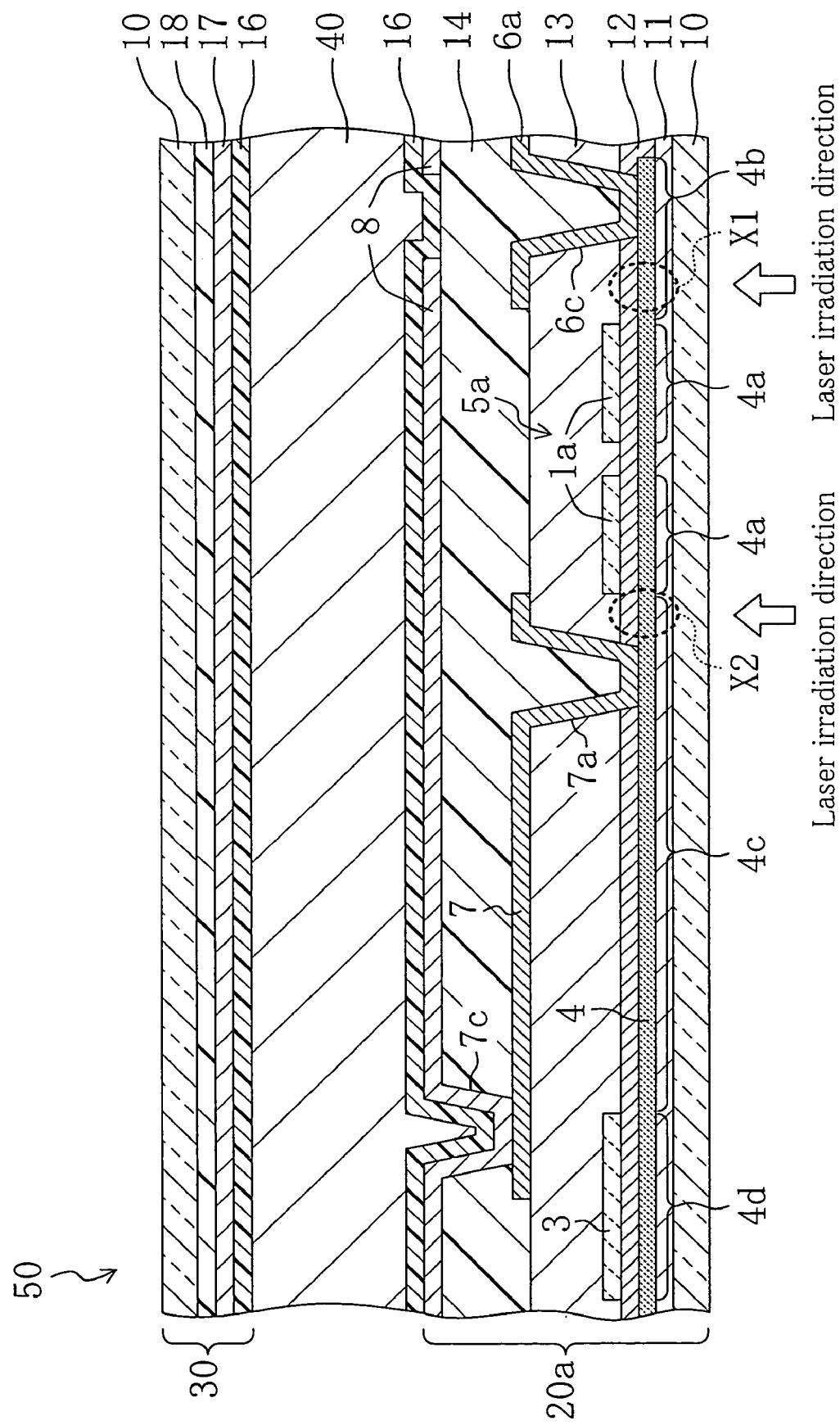
FIG. 1 is a schematic cross-sectional view of a liquid crystal display device according to embodiment 1 of the present invention.
Figure 2:
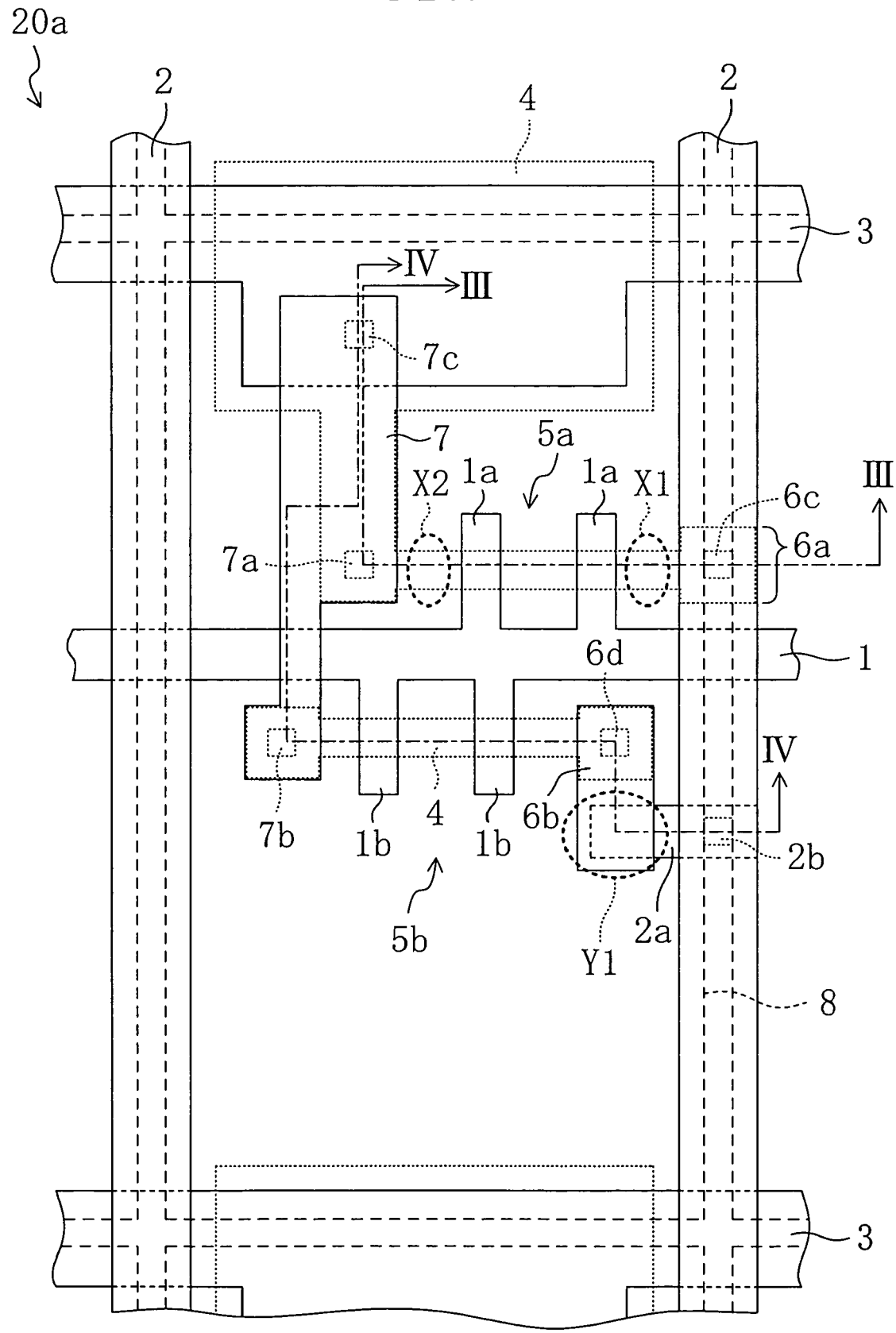
FIG. 2 is a schematic plan view of an active matrix substrate according to embodiment 1 of the present invention.
Figure 3:
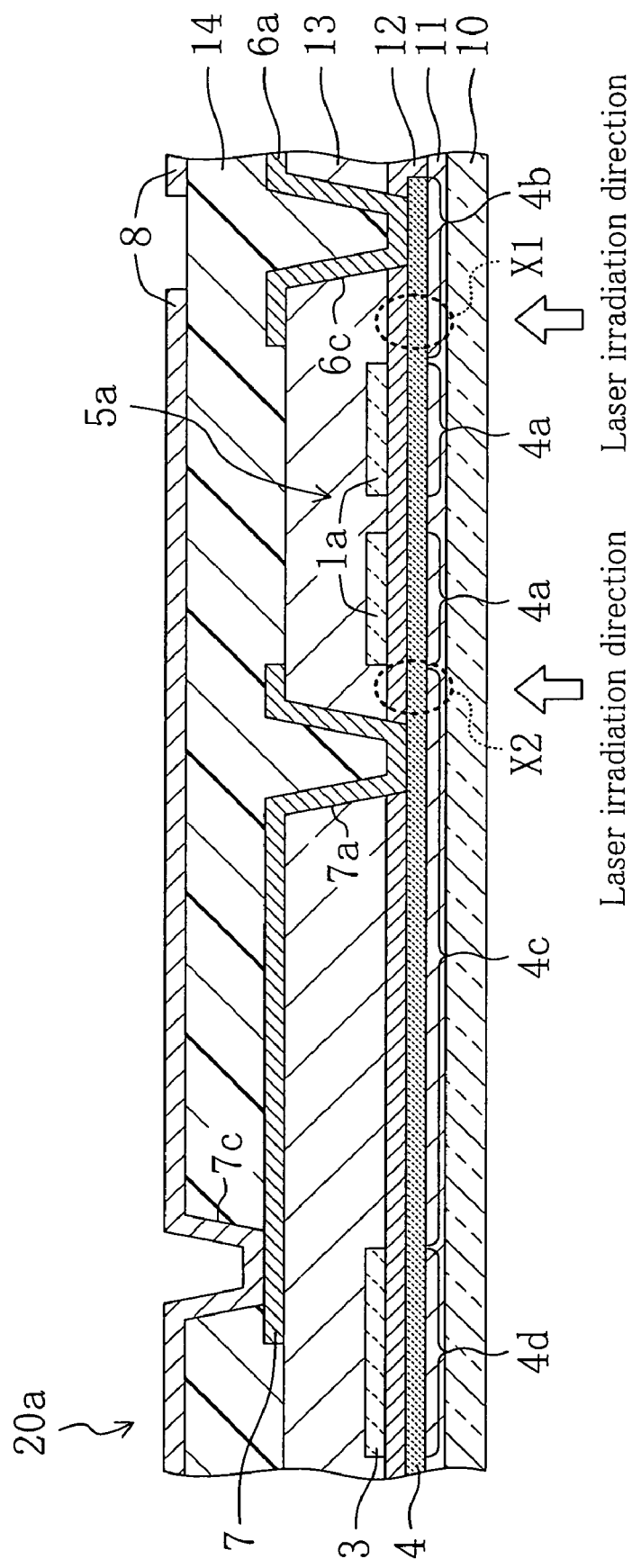
FIG. 3 is a schematic cross-sectional view of the active matrix substrate (before defect repair) according to embodiment 1 of the present invention, which is taken along line III—III of FIG. 2.
Figure 4:
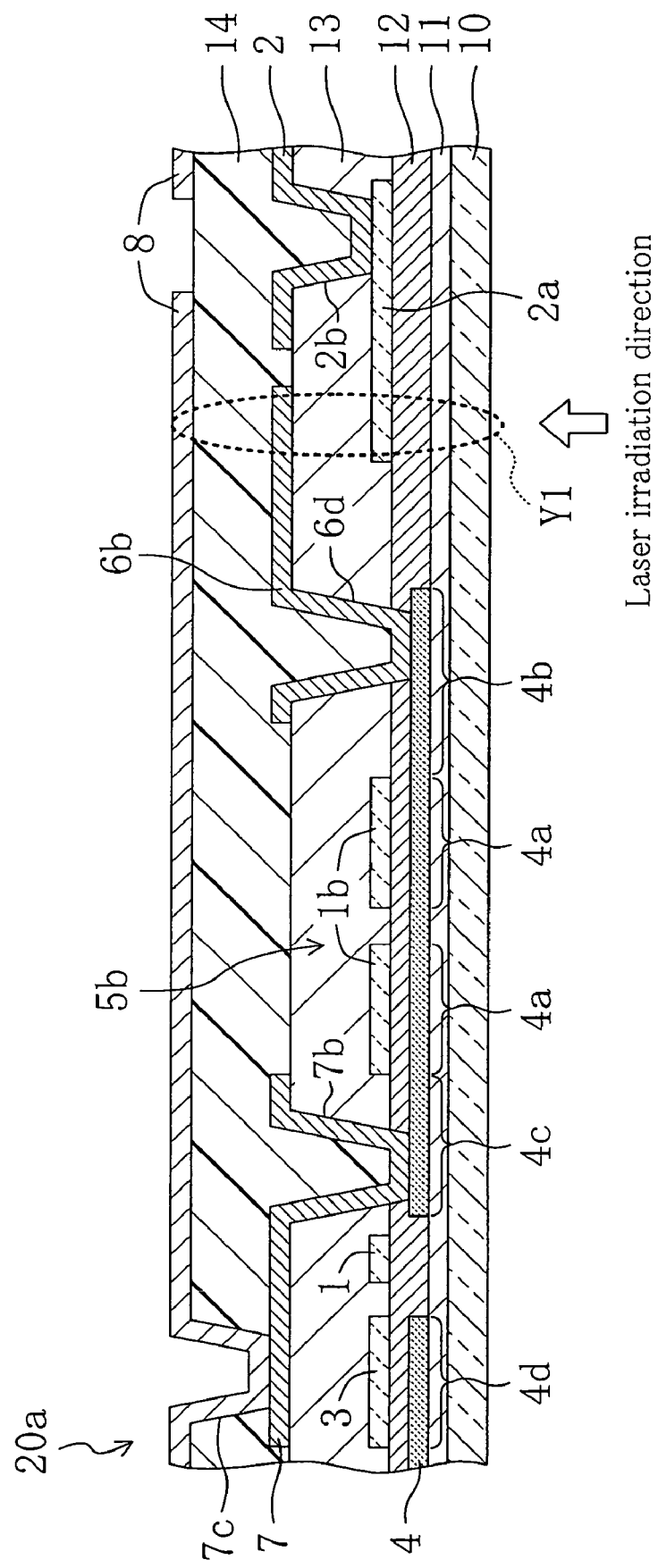
FIG. 4 is a schematic cross-sectional view of the active matrix substrate (before defect repair) according to embodiment 1 of the present invention, which is taken along line IV—IV of FIG. 2.

FIG. 1 is a schematic cross-sectional view of the liquid crystal display device 50. FIG. 2 is a schematic plan view of an active matrix substrate 20a of the liquid crystal display device 50. FIG. 3 is a schematic cross-sectional view of the active matrix substrate 20a taken along line III—III of FIG. 2. FIG. 4 is a schematic cross-sectional view of the active matrix substrate 20a taken along line IV—IV of FIG. 2.

The liquid crystal display device 50 includes an active matrix substrate 20a, a counter substrate 30 that faces the active matrix substrate 20a, and a liquid crystal layer 40 interposed between the substrates 20a and 30.

As shown in FIG. 2, in the active matrix substrate 20a, a plurality of gate lines 1 and a plurality of source lines 2 which function as signal supplying sections extend over an insulation substrate 10 so as to cross each other at right angles, and capacitor lines 3 run between the gate lines 1 so as to extend in parallel to the gate lines 1. The active matrix substrate 20a includes a first TFT 5a and a second TFT 5b at each intersection of the gate lines 1 and the source lines 2. A display region enclosed by a pair of source lines 2 and capacitor lines 3 has a pixel electrode 8. The pixel electrode 8 functions as a signal receiving section of the first TFT 5a and second TFT 5b and constitutes a pixel.

The active matrix substrate 20a has a multilayered structure wherein a base coat film 11, a gate insulation film 12, an interlayer insulation film 13 and a resin layer 14 are sequentially provided on the insulation substrate 10 as shown in FIGS. 3 and 4.

A semiconductor film 4, which includes a channel region 4a, a source electrode 4b, a drain electrode 4c and an auxiliary capacitor electrode 4d, is provided between the base coat film 11 and the gate insulation film 12.

The interlayer space between the gate insulation film 12 and the interlayer insulation film 13 includes the gate line 1, gate electrodes 1a and 1b which are branches of the gate line 1, the capacitor line 3, and a source line-extended electrode 2a.

The interlayer space between the interlayer insulation film 13 and the resin layer 14 includes a first TFT source electrode-extended electrode 6a which is connected to the source electrode 4b through a contact hole 6c and is a part of the source line 2, a second TFT source electrode-extended electrode 6b which is connected to the source electrode 4b through a contact hole 6d, the source line 2 which is connected to the source line-extended electrode 2a through a contact hole 2b, and a drain electrode-extended electrode 7 which is connected to the drain electrode 4c through a contact hole 7a and a contact hole 7b.

Provided over the resin layer 14 is the pixel electrode 8 which is connected to the drain electrode-extended electrode 7 through a contact hole 7c. An alignment film 16 is provided over the pixel electrode 8.

The source electrode-extended electrode 6a of the first TFT 5a is connected to the source line 2 (precisely, the source electrode-extended electrode 6a is a part of the source line 2), and the drain electrode-extended electrode 7 of the first TFT 5a is connected to the pixel electrode 8. Normally, the first TFT 5a functions as a switching element to drive the pixel electrode 8.

The second TFT 5b is a spare TFT which itself does not function as a switching element in the normal state because the source electrode-extended electrode 6b is not connected to the source line 2 although the drain electrode-extended electrode 7 is connected to the pixel electrode 8. The source electrode-extended electrode 6b has an overlapping region with the source line-extended electrode 2a (region Y1 in FIGS. 2 and 4).

The first TFT 5a and the second TFT 5b are provided at opposite sides of the gate line 1. Thus, the TFTs 5a and 5b are positioned away from each other. With such a structure, the influence of the formation of the second TFT 5b on the formation of the first TFT 5a is decreased. Therefore, a decrease in the production yield is suppressed even if the second TFT 5b is provided as a spare. Further, the probability that both the TFTs 5a and 5b result in a characteristic deterioration, such as a pattern disorder, or the like, is decreased. Thus, the repairability of the liquid crystal display device increases.

The first TFT 5a (the second TFT 5b) has two gate electrodes 1a and two gate electrodes 1b, i.e., has a multi-gate structure wherein one TFT has a plurality of gate electrodes. With this structure, even if the off-current is reduced and any of the transistor portions (gate electrodes) constituting a TFT results in a continuous conductive state, critical characteristic deterioration of the multi-gate TFT itself can be avoided as long as the other transistor portion (gate electrode) normally operates.

The auxiliary capacitor electrode 4d of the semiconductor film 4 overlaps the capacitor line 3 with the gate insulation film 12 interposed therebetween to constitute an auxiliary capacitor.

As shown in FIG. 1, the counter substrate 30 has a multilayered structure wherein a color filter layer 18, an overcoat layer (not shown), a common electrode 17 and an alignment film 16 are sequentially provided on an insulation substrate 10.

The color filter layer 18 includes color layer segments of red, green and blue such that each pixel corresponds to any one of the color layer segments. The color filter layer 18 further includes a black matrix as a light shielding film between the color layer segments.

The liquid crystal layer 40 is formed of a nematic liquid crystal material which has electrooptical characteristics.

In the liquid crystal display device 50, each pixel electrode 8 corresponds to a single pixel. In each pixel, when a gate signal is transmitted through the gate line 1 to turn on the first TFT 5a, a source signal is transmitted through the source line 2 so that a predetermined charge is written in the pixel electrode 8 through the source electrode 4b and the drain electrode 4c. As a result, a potential difference occurs between the pixel electrode 8 and the common electrode 17, so that a predetermined voltage is applied to the liquid crystal capacitor, which is formed by the liquid crystal layer 40, and the auxiliary capacitor. In the liquid crystal display device 50, the transmittance of light coming from the outside is adjusted using the mechanism that the orientation of liquid crystal molecules changes according to the largeness of the applied voltage, whereby an image is displayed.

Next, a production method of the liquid crystal display device 50 according to embodiment 1 of the present invention is described.

<Active Matrix Substrate Fabrication Process>

Hereinafter, the fabrication process of the active matrix substrate 20a is described.

At the first step, a SiON film (about 100 nm thick) is formed over the entire surface of a glass substrate (insulation substrate) 10 by plasma CVD (Chemical Vapor Deposition) to form a base coat film 11.

Then, an amorphous silicon film (about 50 nm thick) is formed over the entire surface of the base coat film 11 by plasma CVD using disilane ($Si_2H_6$) as a source gas. The amorphous silicon film is subjected to a heat process to be crystallized (i.e., the amorphous silicon film changes into a polysilicon film). Thereafter, the polysilicon film is patterned by photolithography (Photo Engraving Process: hereinafter, referred to as "PEP technology") to form a semiconductor film 4.

Then, a SiON film (about 115 nm thick) is formed over the entire surface of the resultant structure, i.e., over the base coat film 11 on which the semiconductor film 4 has been formed, by plasma CVD to form a gate insulation film 12.

Then, a tantalum nitride film (about 50 nm thick) and a tungsten film (about 370 nm thick) are sequentially formed by sputtering over the entire surface of the gate insulation film 12. The tantalum nitride film and the tungsten film are patterned using PEP technology to form a gate line 1, gate electrodes 1a and 1b, a capacitor line 3 and a source line-extended electrode 2a. It should be noted that the layered film of the tantalum nitride film and the tungsten film may be replaced by a film formed of a single-element material of a metallic element selected from a group consisting of tantalum, tungsten, titanium, molybdenum, aluminum, and copper or a film formed of an alloy or compound material containing such a metallic element as a principal constituent.

The semiconductor film 4 is then doped with phosphorus through the gate insulation film using the gate electrodes 1a and 1b as a mask, whereby a channel region 4a is formed in a portion corresponding to the gate electrodes 1*a* and 1*b*, and a source electrode 4*b* and a drain electrode 4*c* (auxiliary capacitor electrode 4*d*) are formed outside the channel region 4*a*. Thereafter, the resultant structure is subjected to a heat process to activate the implanted phosphorus. It should be noted that, if the film is doped with phosphorus, an N-channel TFT is formed. If the film is doped with boron, a P-channel TFT is formed.

Then, over the entire surface of the resultant structure wherein the gate line 1, the gate electrodes 1*a* and 1*b*, the capacitor line 3 and the source line-extended electrode 2*a* have been formed on the gate insulation film 12, a layered film (about 950 nm thick) consisting of a silicon nitride film and a silicon oxide film is formed by CVD to form an interlayer insulation film 13.

Then, portions of a layered film consisting of the gate insulation film 12 and the interlayer insulation film 13 which correspond to the source electrode 4*b* and the drain electrode 4*c* and a portion of the interlayer insulation film 13 which corresponds to the source line-extended electrode 2*a* are etched away to form contact holes 6*c*, 6*d*, 7*a*, 7*b*, and 2*b*.

Then, a titanium film (about 100 nm thick), an aluminum film (about 500 nm thick), and a titanium film (about 100 nm thick) are sequentially formed by sputtering over the resultant structure, i.e., on the interlayer insulation film 13. Thereafter, the resultant films are patterned using PEP technology to form source electrode-extended electrodes 6*a* and 6*b*, a source line 2 and a drain electrode-extended electrode 7.

The wire width of the source line-extended electrode 2*a* is about 6.75 μm, and the wire width of the source electrode-extended electrode 6*b* is about 8.75 μm. The electrodes 2*a* and 6*b* cross each other at right angles to form an overlapping region (Y1) of about 6.75 μm×8.75 μm.

The resultant structure is subjected to a heat process to hydrogenate the semiconductor film 4 so that a dangling bond (unassociated bond) of the semiconductor film 4 is terminated.

Over the entire surface of the resultant structure wherein the source electrode-extended electrodes 6*a* and 6*b*, the source line 2 and the drain electrode-extended electrode 7 have been formed on the interlayer insulation film 13, an organic insulating material, such as acrylic resin, or the like, is applied so as to have a thickness of about 1.6 μm, thereby forming a resin layer 14.

Then, a portion of the resin layer 14 which corresponds to the drain electrode-extended electrode 7 is etched away to form a contact hole 7*c*.

Then, an ITO (Indium Tin Oxide) film is formed over the resultant structure, i.e., over the resin layer 14, by sputtering so as to have a thickness of about 100 nm. The ITO film is patterned using PEP technology to form a pixel electrode 8.

Thus, as described above, the active matrix substrate 20*a* of the present invention has been fabricated. Thereafter, a thin film of a polyimide resin is formed by printing over the active matrix substrate 20*a*. The surface of the thin film is subjected to an alignment treatment by a rubbing method to form an alignment film 16.

<Counter Substrate Fabrication Process>

Hereinafter, the fabrication process of the counter substrate 30 is described.

At the first step, a thin chromium film is formed over a glass substrate 10 so as to have a thickness of about 100 nm. The chromium film is patterned using PEP technology to form a black matrix.

Then, color layer segments of red, green and blue are formed in the interstitial spaces of the black matrix by patterning so as to have a thickness of about 2 μm, thereby forming a color filter layer 18.

Then, an acrylic resin is applied over the color filter layer 18 so as to have a thickness of about 1 μm to form a over coat layer.

Then, an ITO film is formed over the over coat layer so as to have a thickness of about 100 nm to form a common electrode 17.

Then, a thin film of a polyimide resin is formed by printing over the common electrode 17. The surface of the thin film is subjected to an alignment treatment by a rubbing method to form an alignment film 16.

Thus, as described above, the counter substrate 30 of the present invention has been fabricated.

<Liquid Crystal Display Device Production Process>

Over the active matrix substrate 20*a*, a sealing portion is formed of a thermosetting resin by printing. Thereafter, spherical spacers are sprayed over the alignment film of the active matrix substrate 20*a*. The resultant active matrix substrate 20*a* is combined with the counter substrate 30. Then, a liquid crystal material is injected in between the substrates 20*a* and 30 by a reduced pressure method and sealed up in there, whereby a liquid crystal layer 40 is formed.

Thus, as described above, the liquid crystal display device 50 of the present invention has been fabricated.

In the liquid crystal display device 50, the interlayer insulation film 13 (950 nm thick in the above example), which is thicker than the gate insulation film 12 (115 nm thick in the above example), is provided between the source line 2 and the semiconductor film 4 of the second TFT 5*b*, and the source line 2 is substantially electrically connectable to the source electrode 4*b* of the semiconductor film 4 by forming a contact hole in the interlayer insulation film 13. With such a structure, when the first TFT 5*a* is unusable, a contact hole is formed in the interlayer insulation film 13 such that electrical connection between the source line 2 and the pixel electrode 8 is switchable by the second TFT 5*b*.

Thus, electrical insulation between the source electrode 4*b* and the source line 2, specifically, between the source electrode-extended electrode 6*b* and the source line-extended electrode 2*a*, is maintained. Therefore, occurrence of a short circuit between the source electrode 4*b* and the source line 2 is suppressed in the production of the liquid crystal display device. Accordingly, the decrease of the production yield is suppressed even if the second TFT 5*b* is provided as a spare.

In normal operation, in the liquid crystal display device 50, the pixel electrode 8 is driven by the first TFT 5*a*. So long as the first TFT 5*a* normally operates, a pixel also normally operates so that no display problem occurs. However, when an abnormality occurs in the first TFT 5*a*, the first TFT 5*a* becomes unusable as a switching element. In the inspection process, a pixel corresponding to this abnormal first TFT 5*a* is identified as a defective pixel which causes a display problem.

Next, a defect repair method used in the liquid crystal display device 50 of embodiment 1 of the present invention is described on a step by step basis.

Figure 5:
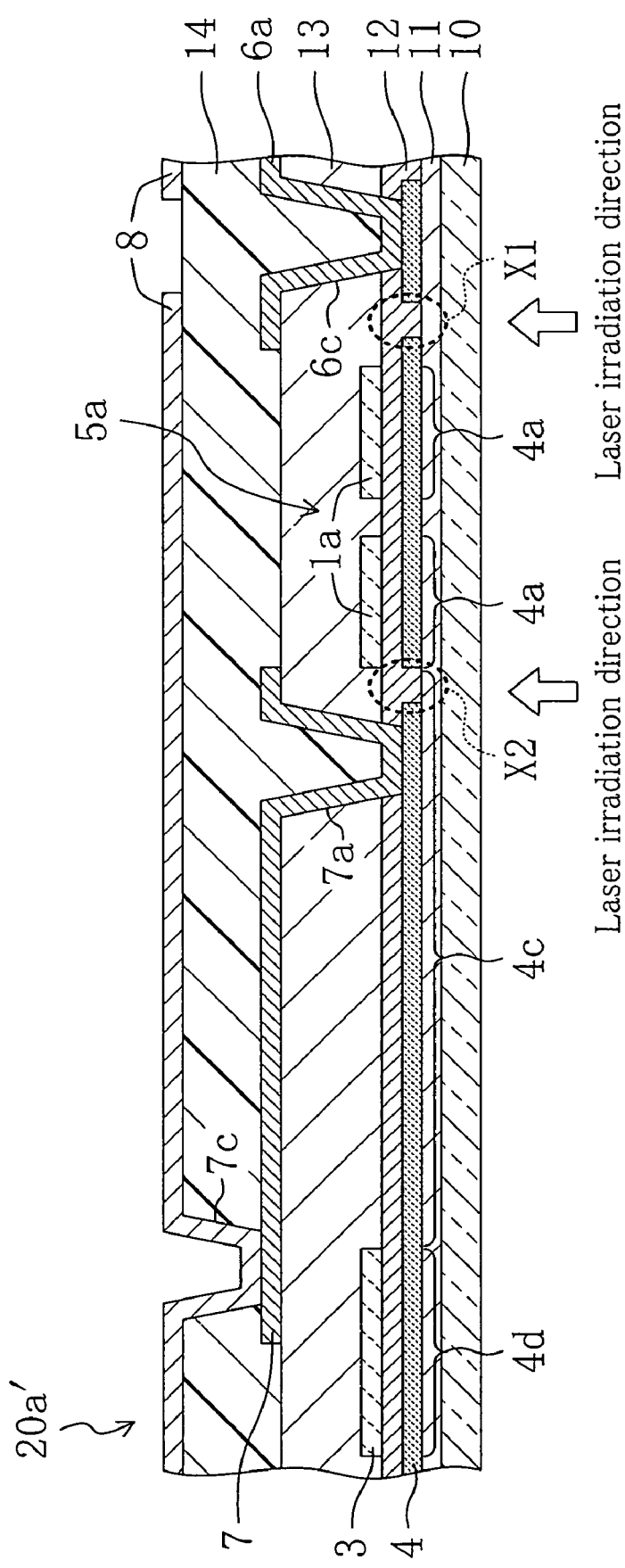
FIG. 5 is a schematic cross-sectional view of the active matrix substrate (after defect repair) according to embodiment 1 of the present invention, which corresponds to the schematic cross-sectional view of FIG. 3.
Figure 6:
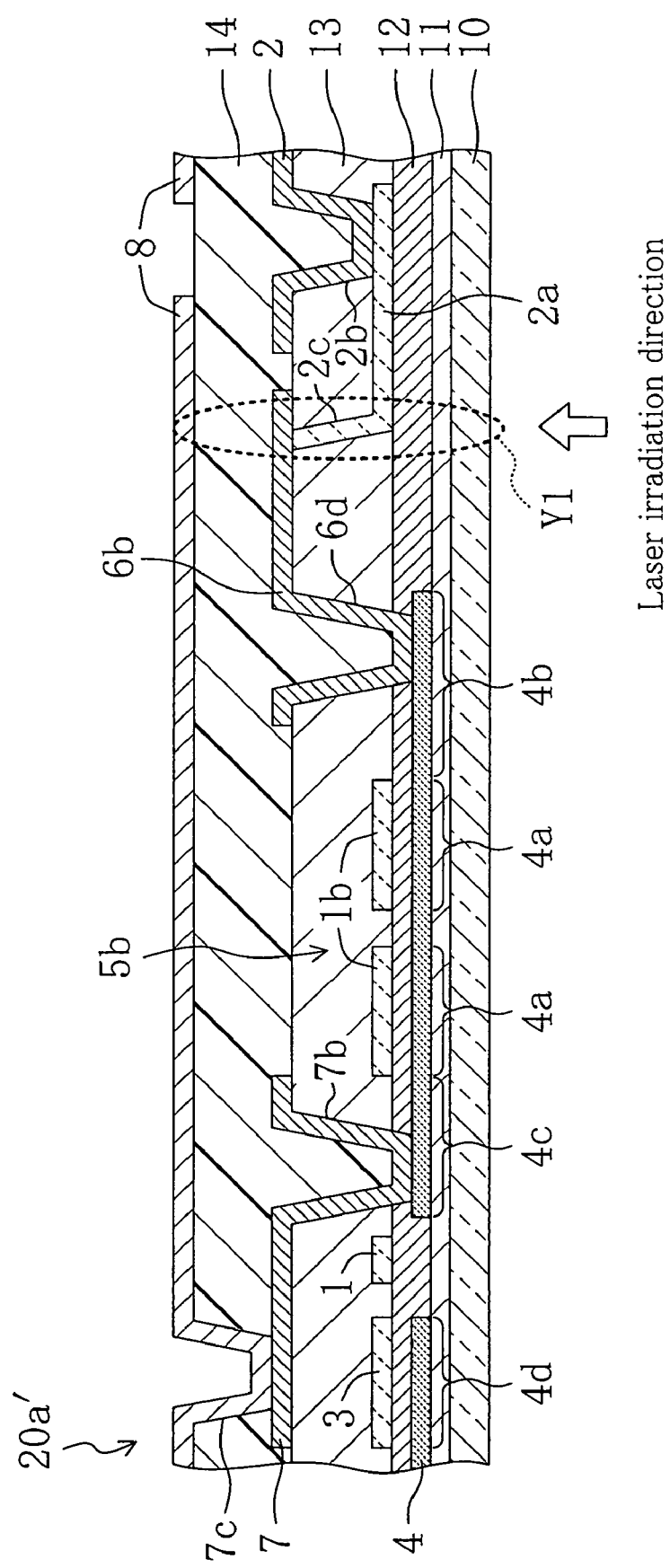
FIG. 6 is a schematic cross-sectional view of the active matrix substrate (after defect repair) according to embodiment 1 of the present invention, which corresponds to the schematic cross-sectional view of FIG. 4.

FIG. 5 is a schematic cross-sectional view of the active matrix substrate 20*a*' of the liquid crystal display device 50 obtained after the defect repair process, which corresponds to the schematic cross-sectional view of FIG. 3 (before defect repair). FIG. 6 is a schematic cross-sectional view of the active matrix substrate 20*a*' of the liquid crystal display device 50 obtained after the defect repair process, which corresponds to the schematic cross-sectional view of FIG. 4 (before defect repair).

<Defective Pixel Detection Process>

Hereinafter, a defective pixel detection process is described.

For example, a gate test signal (bias voltage of −10V; pulse voltages of +15V with pulse width of 50 μsec at a frequency of 16.7 msec) is input to the gate lines 1 to turn on all the first TFTs 5a. Further, a source test signal of ±2 V potential whose polarity is inverted every 16.7 msec is applied to the source lines 2, whereby the electric charge corresponding to ±2 V is written in the pixel electrode 8 through the source electrode 4b and the drain electrode 4c of the first TFT 5a. At the same time, a common electrode test signal, which is a DC (direct current) signal of −1 V potential, is input to the common electrode 17. As a result, a voltage is applied to the liquid crystal capacitor formed between the pixel electrode 8 and the common electrode 17, and a pixel corresponding to this pixel electrode 8 enters the ON state so that, in the case of normally white mode (white display with no voltage application), the display state changes from white display to black display.

At this point in time, in a pixel having an unusable first TFT 5a, a predetermined charge cannot be written in the pixel electrode 8 so that the pixel is in the OFF state (bright spot).

By such a process, the position of a pixel which has an unusable first TFT 5a is identified.

In the case of a driver monolithic substrate wherein a source ling driving circuit and a gate line driving circuit are formed in the same active matrix substrate, driving signals (clock, start pulse, video signals, etc.) are supplied to corresponding driver circuits such that the normal display state is achieved, and an OFF pixel (bright spot) is identified in the same manner as described above.

<Defect Repair Process>

Hereinafter, a defect repair process is described on a step by step basis.

[Semiconductor Film Disconnection step]

Referring to FIG. 3, disconnection portions X1 and X2 of the semiconductor film 4 which correspond to the first TFT 5a of a defective pixel detected in the defective pixel detection process are irradiated with laser light emitted through the glass substrate 10 such that the thin semiconductor film 4 is dispersed away therefrom, whereby the source electrode 4b and the drain electrode 4c of the semiconductor film 4 are disconnected as shown in FIG. 5. As a result, electrical connection between the pixel electrode 8 and the first TFT 5a and electrical connection between the source line 2 and the first TFT 5a are canceled. It should be noted that the disconnection point in the semiconductor film 4 with laser light may be any of the disconnection portions X1 and X2.

[Source Electrode Connection Step]

Referring to FIG. 4, an overlapping region Y1 of the source line-extended electrode 2a and the source electrode-extended electrode 6b of the second TFT 5b which corresponds to the first TFT 5a wherein the semiconductor film 4 has been disconnected is irradiated with laser light emitted through the glass substrate 10. Accordingly, the interlayer insulation film 13 between the electrodes 2a and 6b is broken in the overlapping region Y1, and the metal thin films which constitute the electrodes 2a and 6b are melted so that a contact hole 2c is formed in the overlapping region Y1. As a result, the conductive state is achieved between the source electrode-extended electrode 6b of the second TFT 5b and the source line 2 through the source line-extended electrode 2a and the contact hole 2c, so that the electrode 6b of the second TFT 5b and the source line 2 are short-circuited.

Irradiation with laser light is now described. The description provided below is a typical example, but the present invention is not limited thereto.

Laser Light

An example of laser light is YAG laser light. After the laser power is measured by a laser power measurement device, the laser light is adjusted to an optimum power using a filter, such as an attenuator (optical fixed attenuator), or the like.

Alignment of Irradiation Position

A laser irradiation area is set in advance according to the wiring pattern, and the alignment of the irradiation area with the pattern is adjusted. Then, the irradiation area is irradiated with the laser light adjusted as described above.

For example, in the disconnection portions X1 and X2, a laser light spot of about 3 μm×8 μm is formed. In the overlapping region Y1, a laser light spot of about 2.5 μm×2.5 μm is formed.

In the liquid crystal display device 50, a defective pixel which is defective due to an unusable first TFT 5a can be repaired as described above.

In a liquid crystal display device which has undergone the above-described defect repair process, in the case of displaying an image, when a gate signal is transmitted through a gate line 1 so that a second TFT 5b is turned on in a repaired pixel, a source signal is transmitted through a source line 2 such that a predetermined charge is written in a pixel electrode 8 through the source electrode 4b and the drain electrode 4c. As a result, in the defective pixel, the second TFT 5b is driven instead of an unusable first TFT 5a, whereby the image is normally displayed. Further, a liquid crystal display device including an unusable first TFT 5a can be repaired to provide normal display, and accordingly, the production yield of the liquid crystal display device can also be improved.

Embodiment 2

Hereinafter, a liquid crystal display device according to embodiment 2 of the present invention is described. It should be noted that, in the following sections, the same elements as those illustrated in FIG. 1 through FIG. 6 are denoted by the same reference numerals, and the detailed descriptions thereof are omitted.

Figure 7:
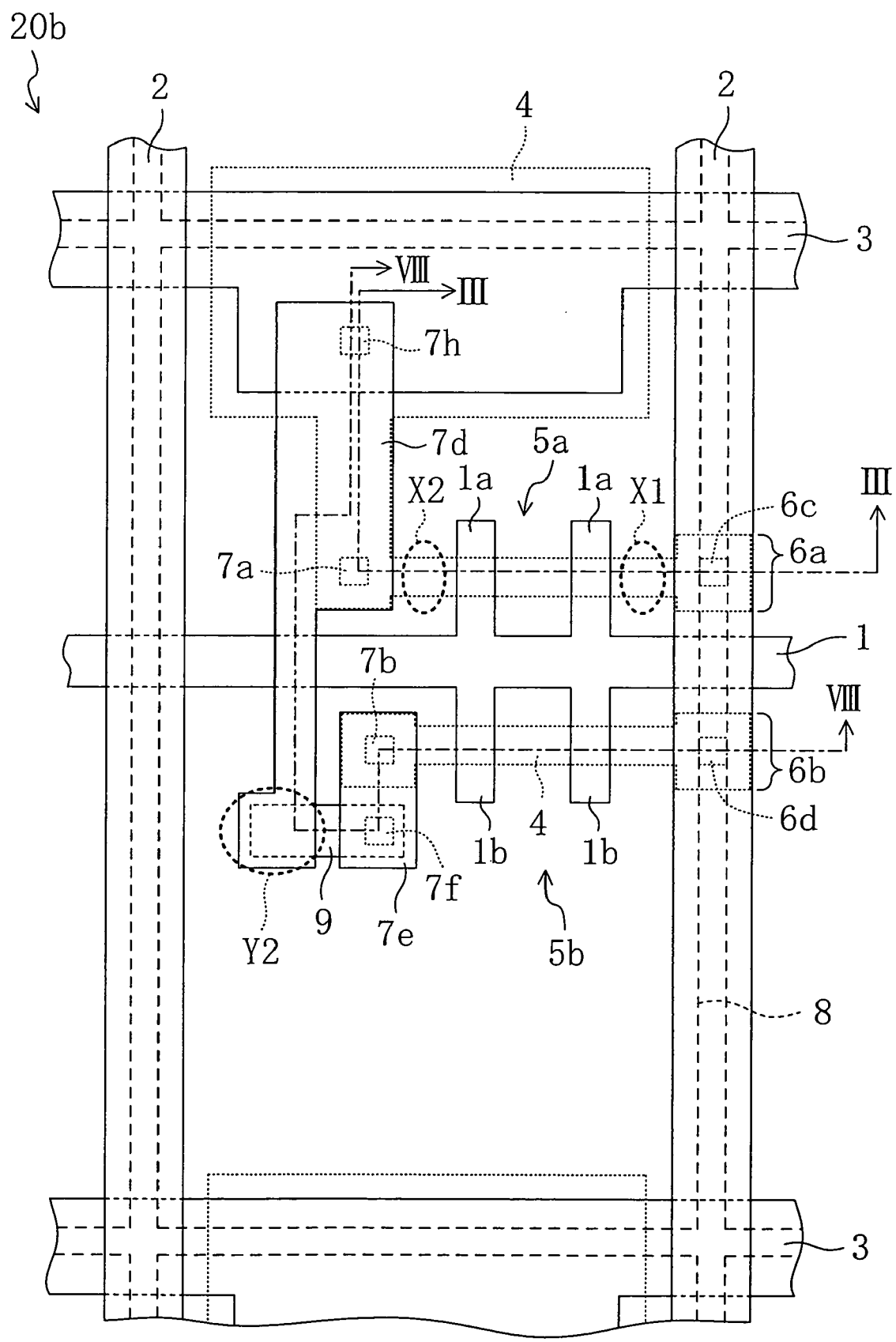
FIG. 7 is a schematic plan view of an active matrix substrate according to embodiment 2 of the present invention.
Figure 8:
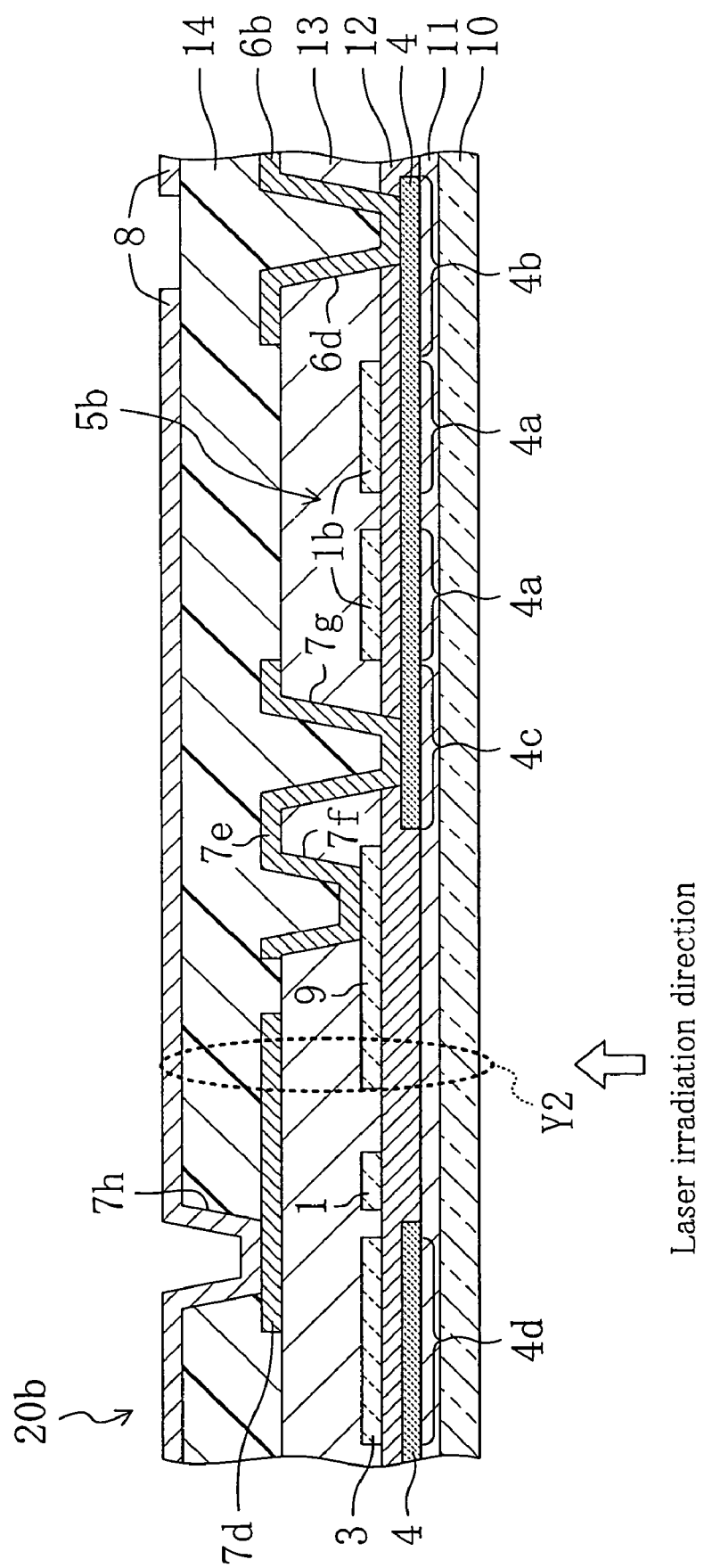
FIG. 8 is a schematic cross-sectional view of the active matrix substrate (before defect repair) according to embodiment 2 of the present invention, which is taken along line VIII—VIII of FIG. 7.

FIG. 7 is a schematic plan view of an active matrix substrate 20b of a liquid crystal display device. FIG. 8 is a schematic cross-sectional view of the active matrix substrate 20b taken along line VIII—VIII of FIG. 7. The cross-sectional structure of the active matrix substrate 20b taken along line III—III of FIG. 7 is substantially the same as that of the active matrix substrate 20a of FIG. 3, and therefore, the cross-sectional view thereof is not provided herein.

The liquid crystal display device of embodiment 2 includes an active matrix substrate 20b, a counter substrate that faces the active matrix substrate 20b, and a liquid crystal layer interposed between these substrates.

As shown in FIG. 7, in the active matrix substrate 20b, a plurality of gate lines 1 and a plurality of source lines 2 which function as signal supplying sections extend over an insulation substrate 10 so as to cross each other at right angles, and capacitor lines 3 run between the gate lines 1 so as to extend in parallel to the gate lines 1. The active matrix substrate 20b includes a first TFT 5a and a second TFT 5b at each intersection of the gate lines 1 and the source lines 2. A display region enclosed by a pair of capacitor lines 3 and a pair of source lines 2 has a pixel electrode 8. The pixel electrode 8 functions as a signal receiving section of the first TFT 5a and second TFT 5b and constitutes a pixel.

The active matrix substrate 20b has a multilayered structure wherein a base coat film 11, a gate insulation film 12, an interlayer insulation film 13 and a resin layer 14 are sequentially provided on the insulation substrate 10 as shown in FIG. 8.

In the active matrix substrate 20b, a region including the first TFT 5a has the same structure as that of a region of the active matrix substrate 20a of embodiment 1 which includes the first TFT 5a, and therefore, the structure of the second TFT 5b is mainly described below.

A semiconductor film 4, which includes a channel region 4a, a source electrode 4b, a drain electrode 4c and an auxiliary capacitor electrode 4d, is provided between the base coat film 11 and the gate insulation film 12.

The interlayer space between the gate insulation film 12 and the interlayer insulation film 13 includes the gate line 1, gate electrode 1b which is a branch of the gate line 1, the capacitor line 3, and a second drain electrode-extended electrode 9.

The interlayer space between the interlayer insulation film 13 and the resin layer 14 includes a source electrode-extended electrode 6b which is connected to the source electrode 4b through a contact hole 6d, a first drain electrode-extended electrode 7e which is connected to the drain electrode 4c through a contact hole 7g and to a second drain electrode-extended electrode 9 through a contact hole 7f, and a pixel-electrode relaying electrode 7d.

Provided over the resin layer 14 is the pixel electrode 8 which is connected to the pixel-electrode relaying electrode 7d through a contact hole 7h. An alignment film 16 is provided over the pixel electrode 8.

The source electrode-extended electrode 6a of the first TFT 5a is connected to the source line 2 (precisely, the source electrode-extended electrode 6a is a part of the source line 2), and the drain electrode-extended electrode 7 (the pixel-electrode relaying electrode 7d in FIG. 7) of the first TFT 5a is connected to the pixel electrode 8. Normally, the first TFT 5a functions as a switching element to drive the pixel electrode 8.

The second TFT 5b is a spare TFT which itself does not function as a switching element in the normal state because the second drain electrode-extended electrode 9 is not connected to the pixel-electrode relaying electrode 7d although the source electrode-extended electrode 6b is connected to the source line 2 (precisely, the source electrode-extended electrode 6b is a part of the source line 2). The second drain electrode-extended electrode 9 has an overlapping region with the pixel-electrode relaying electrode 7d (region Y2 in FIGS. 7 and 8).

In the second TFT 5b of the active matrix substrate 20b of embodiment 2, the source electrode side (the source electrode-extended electrode 6b) is connected in advance, whereas in the second TFT 5b of the active matrix substrate 20a of embodiment 1 the drain electrode side (the drain electrode-extended electrode 7) is connected in advance. With such a structure, the burden imposed on the source line 2 is reduced, and a driver can be designed to have a lower capacity. Thus, the power consumption of the liquid crystal display device can be reduced. The reasons thereof are specifically described below.

In general, the burden imposed on a source line is dominated by parasitic capacitor which is caused when a TFT is off. The parasitic capacitance is now compared in view of the second TFT 5b which is different between the substrates 20a and 20b. The parasitic capacitance at the drain side does not need to be considered because the second TFT 5b is off. In the case of the active matrix substrate 20a of embodiment 1, the sum of the capacitance between the semiconductor film 4 and the gate electrode 1b (e.g., 0.6 fF), the capacitance between the semiconductor film 4 and the pixel electrode 8 (e.g., 0.1 fF), the capacitance between the source electrode 6a and the pixel electrode 8 (e.g., 3 fF), and the capacitance between the source line-extended electrode 2a and the source electrode 6a (e.g., 2 fF) constitute the parasitic capacitance (1.3 fF). In the case of the active matrix substrate 20b of embodiment 2, the sum of the capacitance between the semiconductor film 4 and the gate electrode 1b (e.g., 0.6 fF) and the capacitance between the semiconductor film 4 and the pixel electrode 8 (e.g., 0.1 fF) constitute the parasitic capacitance (0.7 fF). Thus, the burden imposed on the source line 2 is smaller in the substrate 20b.

The counter substrate and the liquid crystal layer of embodiment 2 are substantially the same as those of embodiment 1 and, therefore, the detailed descriptions thereof are herein omitted.

The production method of the liquid crystal display device of embodiment 2 of the present invention is not specifically described because it is only necessary to modify the thin film pattern shape which is used for forming the layered film of the active matrix substrate 20a of embodiment 1.

In the liquid crystal display device of embodiment 2, the interlayer insulation film 13, which is thicker than the gate insulation film 12, is provided between the pixel electrode and the semiconductor film 4 of the second TFT 5b, and the pixel electrode is substantially electrically connectable to the drain electrode 4c of the semiconductor film 4 by forming a contact hole in the interlayer insulation film 13. With such a structure, when the first TFT 5a is unusable, a contact hole is formed in the interlayer insulation film 13 such that electrical connection between the source line 2 and the pixel electrode 8 is switchable by the second TFT 5b.

Thus, electrical insulation between the drain electrode 4c and the pixel electrode 8, specifically, between the second drain electrode-extended electrode 9 and the pixel-electrode relaying electrode 7d, is maintained. Therefore, occurrence of a short circuit between the drain electrode 4c and the pixel electrode 8 is suppressed in the production of the liquid crystal display device. Accordingly, the decrease of the production yield is suppressed even if the second TFT 5b is provided as a spare.

Next, a defect repair method used in the liquid crystal display device of embodiment 2 of the present invention is described.

Figure 9:
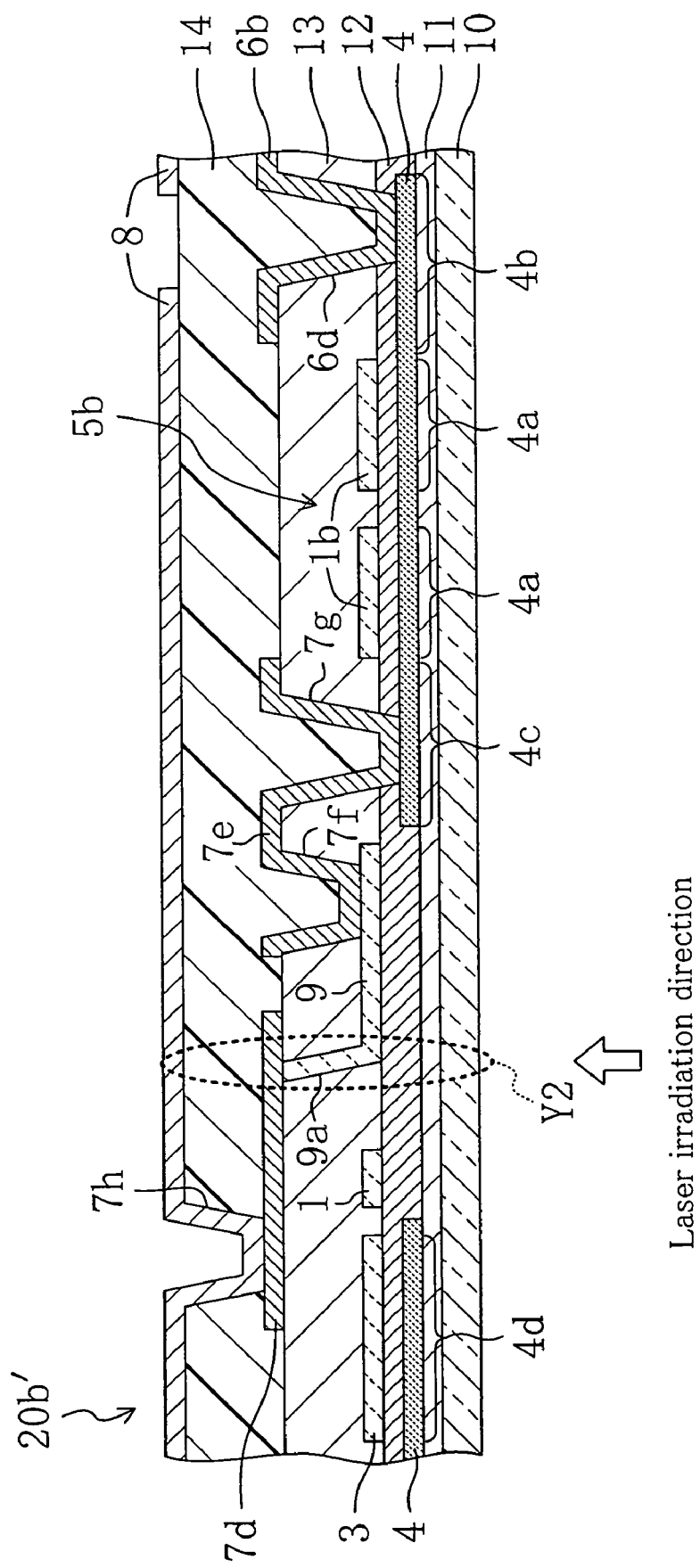
FIG. 9 is a schematic cross-sectional view of the active matrix substrate (after defect repair) according to embodiment 2 of the present invention, which corresponds to the schematic cross-sectional view of FIG. 8.

FIG. 9 is a schematic cross-sectional view of an active matrix substrate 20b' obtained after the defect repair process, which corresponds to the schematic cross-sectional view of FIG. 8 (before defect repair).

The defective pixel detection process and the semiconductor film disconnection step of the defect repair process are the same as those of embodiment 1 and, therefore, the detailed description thereof are herein omitted. The drain electrode connection step of the defect repair process, which is a difference from embodiment 1, is described below.

<Defect Repair Process>

[Drain Electrode Connection Step]

Referring to FIG. 9, an overlapping region Y2 of the second drain electrode-extended electrode 9 and the pixel-electrode relaying electrode 7d of the second TFT 5b which corresponds to the first TFT 5a wherein the semiconductor film 4 has been disconnected in the semiconductor film disconnection step is irradiated with laser light emitted through the glass substrate 10. Accordingly, the interlayer insulation film 13 between the electrodes 9 and 7*d* is broken in the overlapping region Y2, and the metal thin films which constitute the electrodes 9 and 7*d* are melted so that a contact hole 9*a* is formed in the overlapping region Y2. As a result, the conductive state is achieved between the drain electrode 4*c* of the second TFT 5*b* and the pixel electrode 8 through the contact hole 7*g*, a first drain electrode-extended electrode 7*e*, the contact hole 7*f*, the second drain electrode-extended electrode 9, the contact hole 9*a*, the pixel-electrode relaying electrode 7*d* and the contact hole 7*h*, so that the drain electrode 4*c* of the second TFT 5*b* and the pixel electrode 8 are short-circuited.

Irradiation of laser light is performed in the same way as that of embodiment 1 and, therefore, the description thereof is herein omitted.

According to embodiment 2 of the present invention, a defective pixel which is defective due to an unusable first TFT 5*a* can be repaired as described above.

In a liquid crystal display device which has undergone the above-described defect repair process, in the case of displaying an image, when a gate signal is transmitted through a gate line 1 so that a second TFT 5*b* is turned on in a repaired pixel, a source signal is transmitted through a source line 2 such that a predetermined charge is written in a pixel electrode 8 through the source electrode 4*b* and the drain electrode 4*c* as in embodiment 1. As a result, in the defective pixel, the second TFT 5*b* is driven instead of an unusable first TFT 5*a*, whereby the image is normally displayed.

Embodiment 3

A liquid crystal display device of the present invention may have a structure described below, which is a variation of the structure of embodiment 1.

Figure 10:
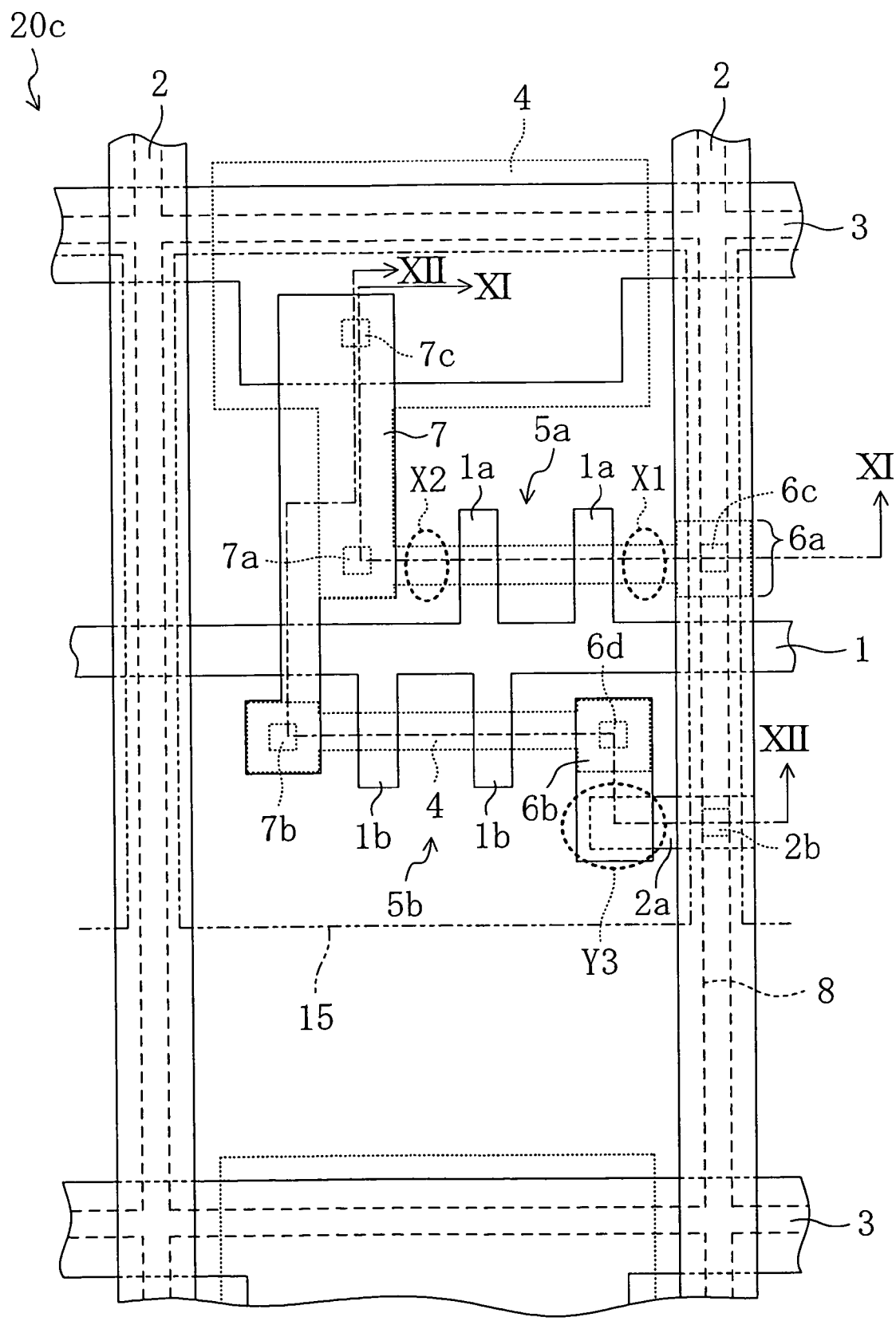
FIG. 10 is a schematic plan view of an active matrix substrate according to embodiment 3 of the present invention.
Figure 11:
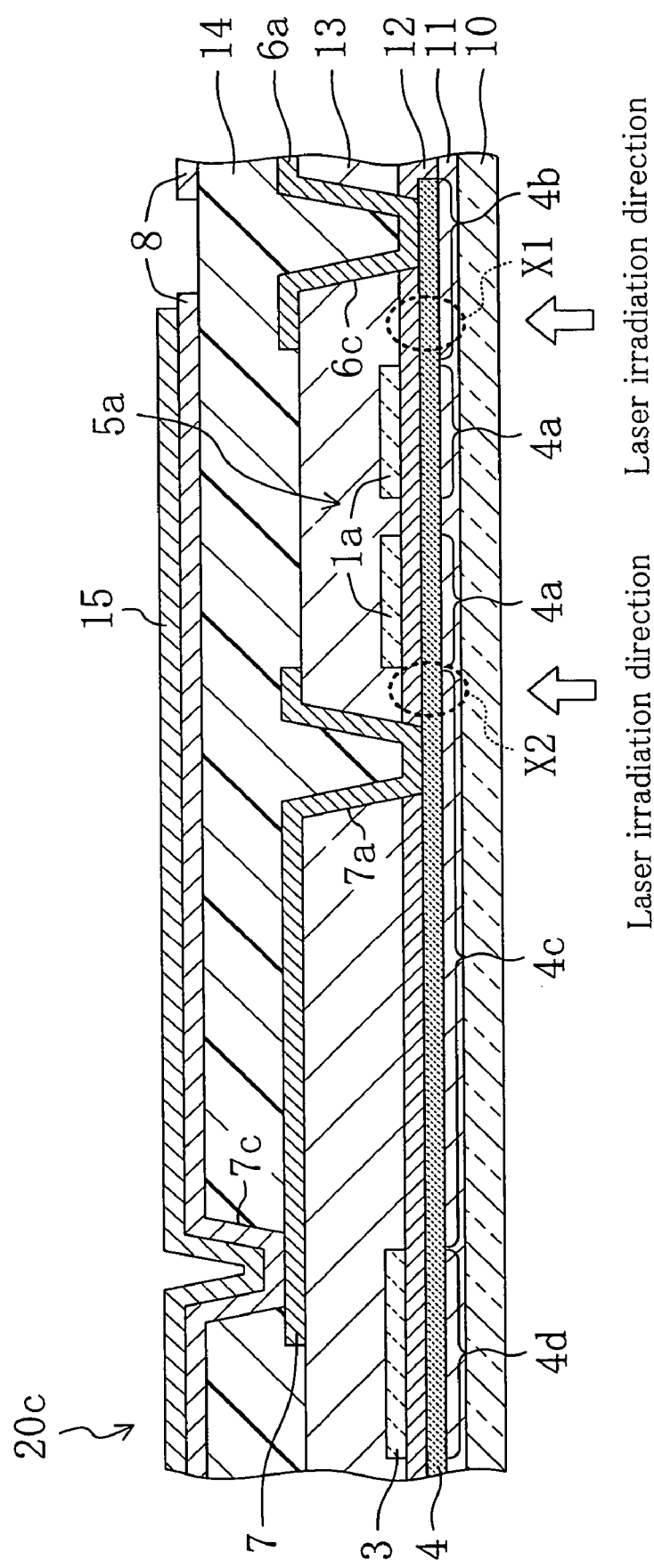
FIG. 11 is a schematic cross-sectional view of the active matrix substrate (before defect repair) according to embodiment 3 of the present invention, which is taken along line XI—XI of FIG. 10.
Figure 12:
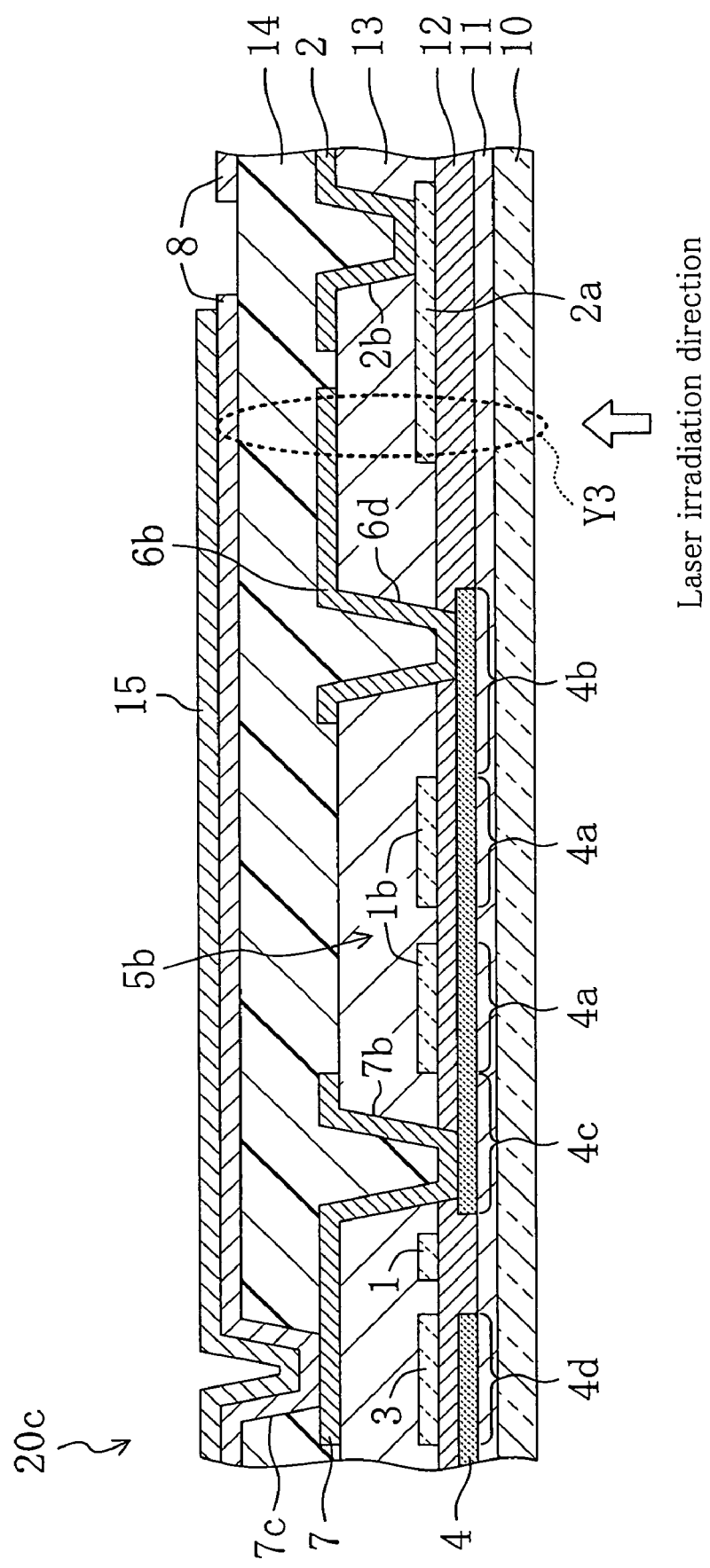
FIG. 12 is a schematic cross-sectional view of the active matrix substrate (before defect repair) according to embodiment 3 of the present invention, which is taken along line XII—XII of FIG. 10.

FIG. 10 is a schematic plan view of an active matrix substrate 20*c* of a liquid crystal display device of embodiment 3. FIG. 11 is a schematic cross-sectional view of the active matrix substrate 20*c* taken along line XI—XI of FIG. 10. FIG. 12 is a schematic cross-sectional view of the active matrix substrate 20*c* taken along line XII—XII of FIG. 10.

The liquid crystal display device of embodiment 3 includes the active matrix substrate 20*c*, a counter substrate that faces the active matrix substrate 20*c*, and a liquid crystal layer interposed between these substrates.

As shown in FIG. 11, in the active matrix substrate 20*c*, a layered film structure between a base coat film 11 and a pixel electrode 8 is substantially the same as that of the active matrix substrate 20*a* of embodiment 1. A reflector electrode 15 is provided on the pixel electrode 8 so as to cover a first TFT 5*a* and a second TFT 5*b*, and an alignment film 16 is provided so as to cover the pixel electrode 8 and the reflector electrode 15.

The reflector electrode 15 overlaps about 70% area of the pixel electrode 8. The reflector electrode 15 constitutes a reflection region. The remaining area, i.e., about 30%, of the pixel electrode 8 that the reflector electrode 15 does not overlap constitutes a transmission region.

The counter substrate and the liquid crystal layer of embodiment 3 are substantially the same as those of embodiment 1 and, therefore, the detailed descriptions thereof are herein omitted.

In the liquid crystal display device of embodiment 3, a predetermined charge is written in the pixel electrode 8 and the reflector electrode 15 in each pixel, so that a potential difference occurs between the pixel electrode 8 and reflector electrode 15 and the common electrode 17, whereby a predetermined voltage is applied to the liquid crystal capacitor and the auxiliary capacitor. The transmittance of light coming from the outside is adjusted using the mechanism that the orientation of liquid crystal molecules changes according to the largeness of the applied voltage, whereby an image is displayed. In the reflection region, light coming from the outside through the counter substrate is reflected by the reflector electrode 15, while the transmission region transmits light coming through the active matrix substrate 20*c*, whereby an image is displayed.

The reflector electrode 15 is provided so as to cover the first TFT 5*a* and the second TFT 5*b* and therefore functions as a light shielding film which prevents light from coming into the first TFT 5*a* and the second TFT 5*b*. Further, the reflector electrode 15 as a reflector efficiently uses the limited space of the pixel, and therefore, the decrease of the aperture ratio can be suppressed.

Next, a fabrication method of the active matrix substrate 20*c* included in a liquid crystal device of embodiment 3 is partially described.

At the first step, an active matrix substrate 20*a* is prepared according to the fabrication method of the active matrix substrate 20*a* of embodiment 1.

Then, a molybdenum film (about 100 nm thick) and an aluminum film (about 150 nm thick) are formed on the pixel electrode 8 over the active matrix substrate 20*a* by sputtering. The films are patterned using PEP technology to form a reflector electrode 15.

Thus, as described above, the active matrix substrate 20*c* has been fabricated. Thereafter, a thin film of a polyimide resin is formed by printing over the active matrix substrate 20*c*. The surface of the thin film is subjected to an alignment treatment by a rubbing method to form an alignment film.

Next, a defect repair method used in the liquid crystal display device of embodiment 3 of the present invention is described.

Figure 13:
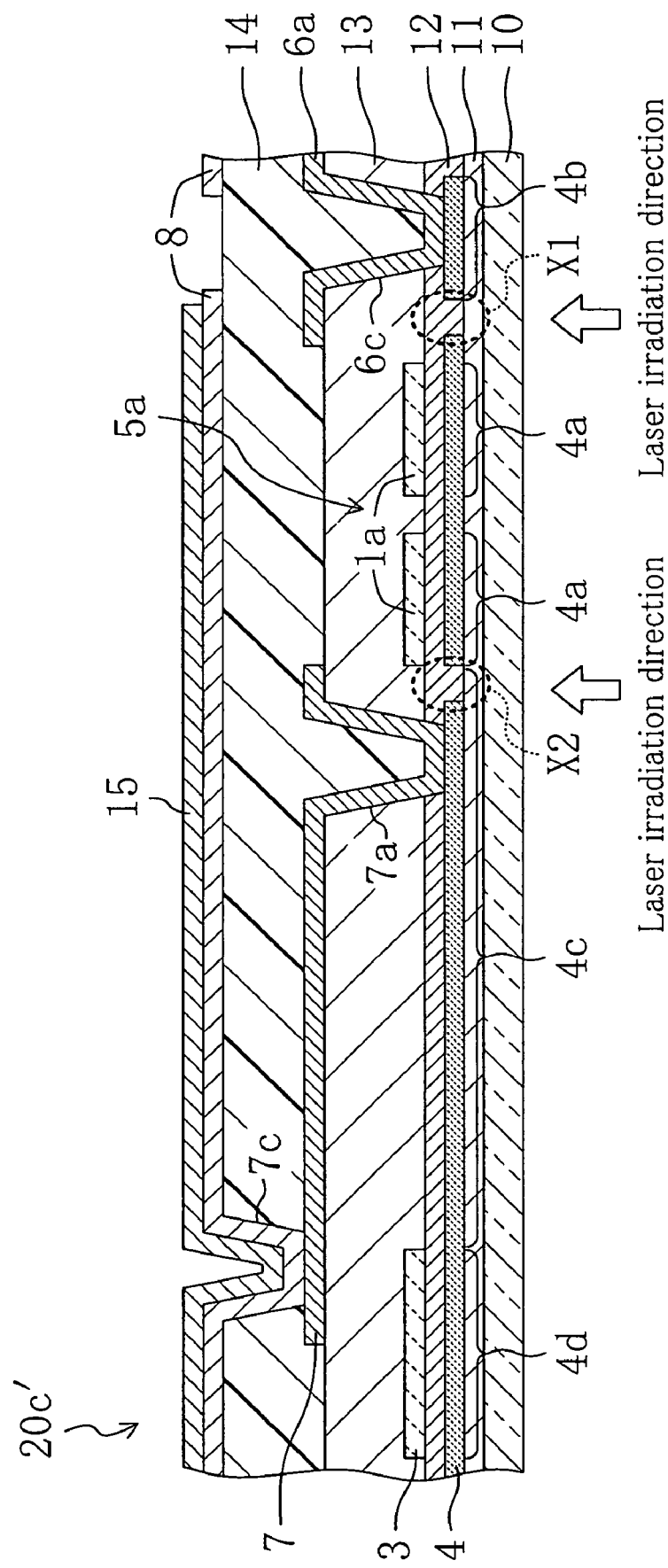
FIG. 13 is a schematic cross-sectional view of the active matrix substrate (after defect repair) according to embodiment 3 of the present invention, which corresponds to the schematic cross-sectional view of FIG. 11.
Figure 14:
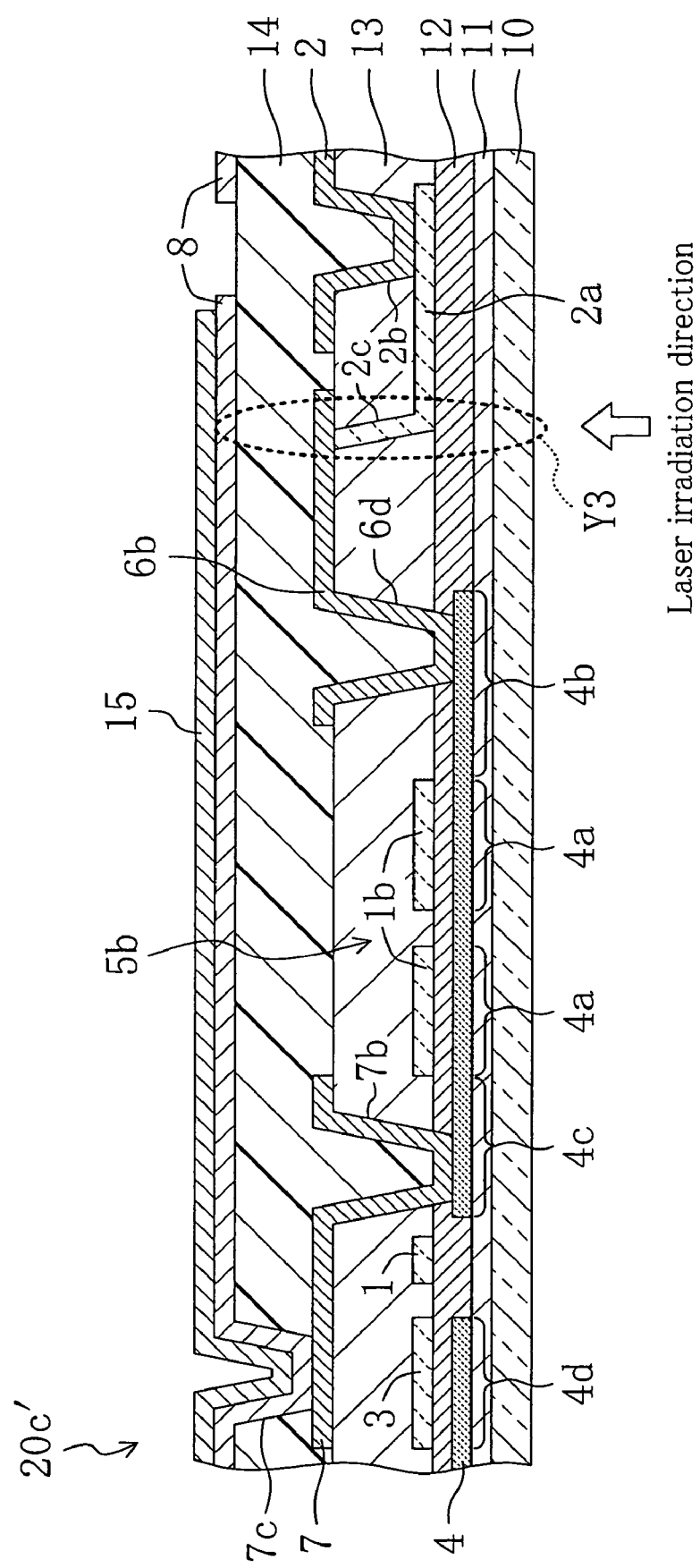
FIG. 14 is a schematic cross-sectional view of the active matrix substrate (after defect repair) according to embodiment 3 of the present invention, which corresponds to the schematic cross-sectional view of FIG. 12.

FIG. 13 is a schematic cross-sectional view of an active matrix substrate 20*c'* obtained after the defect repair process, which corresponds to the schematic cross-sectional view of FIG. 11 (before defect repair). FIG. 14 is a schematic cross-sectional view of an active matrix substrate 20*c'* obtained after the defect repair process, which corresponds to the schematic cross-sectional view of FIG. 12 (before defect repair).

The disconnection portions X1 and X2 are irradiated with laser light coming though the glass substrate 10 such that the source electrode 4*b* and the drain electrode 4*c* of the semiconductor film 4 are disconnected as shown in the cross section of FIG. 13.

An overlapping region Y3 is irradiated with laser light coming though the glass substrate 10 such that a contact hole 2*c* is formed in the overlapping region Y3 as shown in FIG. 14.

The defect repair method of the liquid crystal display device of embodiment 2 and the effects of the method are the same as those of embodiment 1, and therefore, the detailed descriptions thereof are herein omitted.

In the above-described example of embodiment 3, the semitransmissive liquid crystal display device which has both a reflection region and a transmission region in each pixel has been described. However, the liquid crystal display device of embodiment 3 may be a reflective liquid crystal display device wherein the reflective region extends over the entire area of each pixel. In this case, the pixel electrode 8 formed of ITO may be replaced by a reflector electrode 15 formed of an aluminum film. Alternatively, a reflector electrode may be added to the active matrix substrate 20*b* of embodiment 2.

COMPARATIVE EXAMPLE 1

Hereinafter, a liquid crystal display device of comparative example 1 is described.

Figure 15:
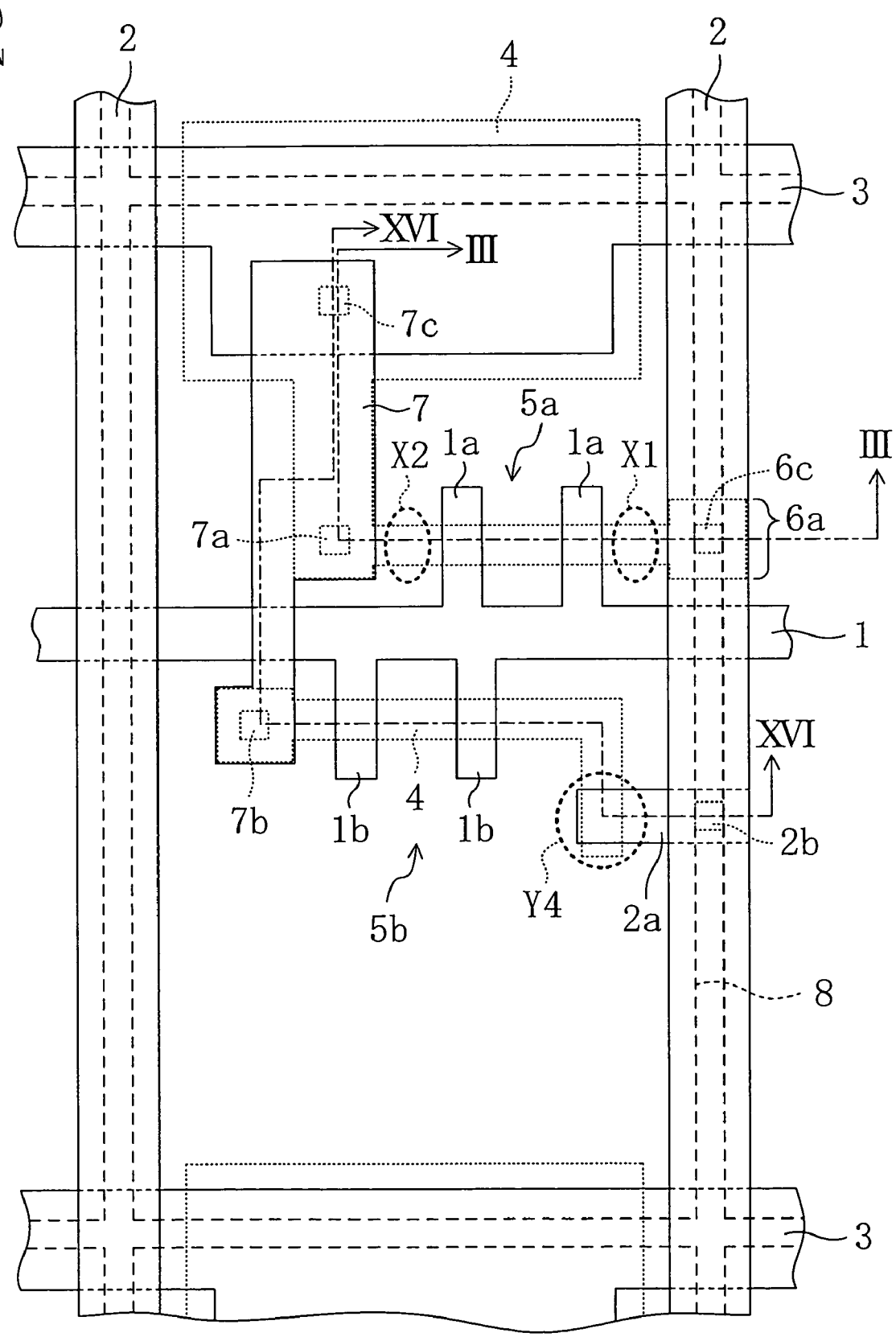
FIG. 15 is a schematic plan view of an active matrix substrate according to comparative example 1 of the present invention.
Figure 16:
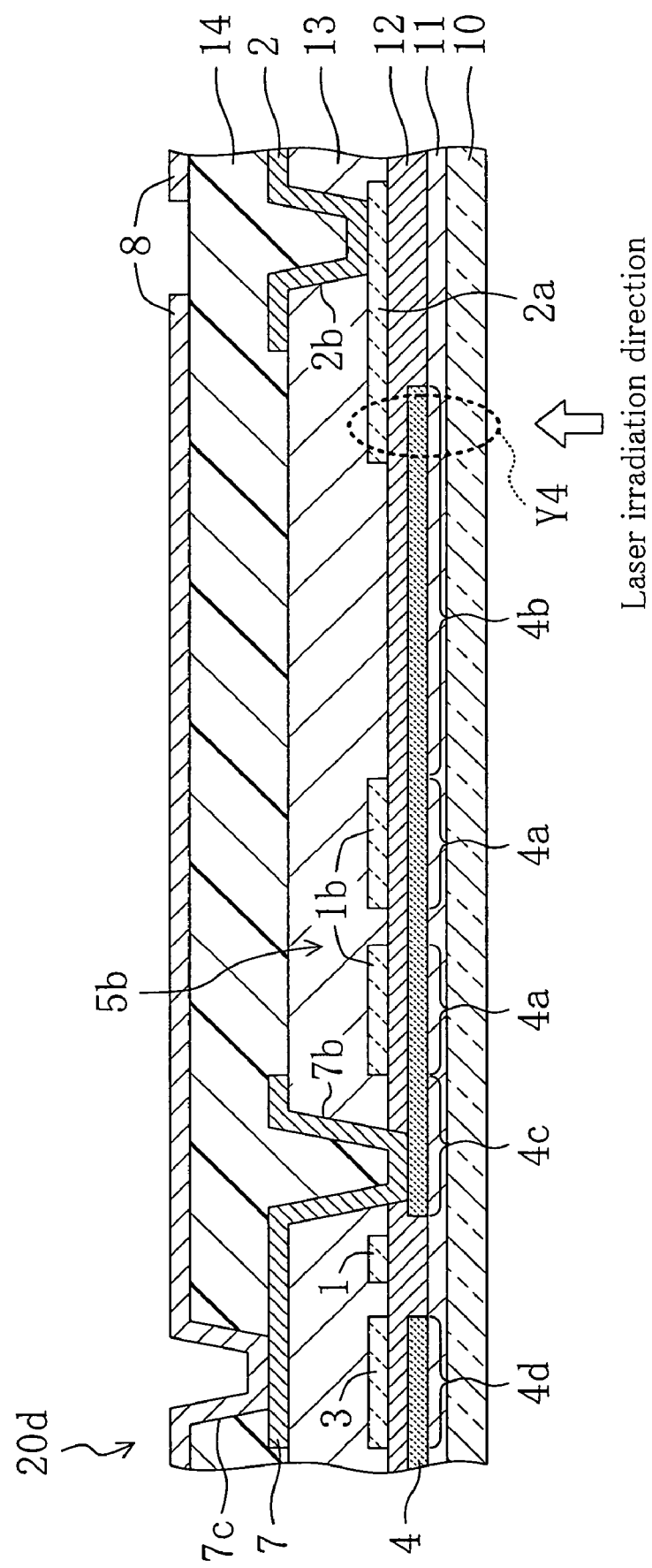
FIG. 16 is a schematic cross-sectional view of the active matrix substrate (before defect repair) according to comparative example 1 of the present invention, which is taken along line XVI—XVI of FIG. 15.

FIG. 15 is a schematic plan view of an active matrix substrate 20d of the liquid crystal display device of comparative example 1. FIG. 16 is a schematic cross-sectional view of the active matrix substrate 20d taken along line XVI—XVI of FIG. 15. The cross-sectional structure of the active matrix substrate 20d taken along line III—III of FIG. 15 is substantially the same as that of the active matrix substrate 20a of FIG. 3, and therefore, the cross-sectional view thereof is not provided herein.

The liquid crystal display device of comparative example 1 includes the active matrix substrate 20d, a counter substrate that faces the active matrix substrate 20d, and a liquid crystal layer interposed between these substrates.

As shown in FIG. 15, in the active matrix substrate 20d, a plurality of gate lines 1 and a plurality of source lines 2 which function as signal supplying sections extend over an insulation substrate 10 so as to cross each other at right angles, and capacitor lines 3 run between the gate lines 1 so as to extend in parallel to the gate lines 1. The active matrix substrate 20d includes a first TFT 5a and a second TFT 5b at each intersection of the gate lines 1 and the source lines 2. A display region enclosed by a pair of capacitor lines 3 and a pair of source lines 2 has a pixel electrode 8. The pixel electrode 8 functions as a signal receiving section of the first TFT 5a and second TFT 5b and constitutes a pixel.

The active matrix substrate 20d has a multilayered structure wherein a base coat film 11, a gate insulation film 12, an interlayer insulation film 13 and a resin layer 14 are sequentially provided on the insulation substrate 10 as shown in FIG. 16.

In the active matrix substrate 20d, a region including the first TFT 5a has the same structure as that of a region of the active matrix substrate 20a of embodiment 1 which includes the first TFT 5a, and therefore, the structure of the second TFT 5b is mainly described below.

A semiconductor film 4, which includes a channel region 4a, a source electrode 4b, a drain electrode 4c and an auxiliary capacitor electrode 4d, is provided between the base coat film 11 and the gate insulation film 12.

The interlayer space between the gate insulation film 12 and the interlayer insulation film 13 includes the gate line 1, gate electrode 1b which is a branch of the gate line 1, the capacitor line 3, and a source line-extended electrode 2a.

The interlayer space between the interlayer insulation film 13 and the resin layer 14 includes the source line 2 which is connected to the source line-extended electrode 2a through a contact hole 2b, and a drain electrode-extended electrode 7 which is connected to the drain electrode 4c through a contact hole 7b.

Provided over the resin layer 14 is the pixel electrode 8 which is connected to the drain electrode-extended electrode 7 through a contact hole 7c. An alignment film 16 is provided over the pixel electrode 8.

The source electrode-extended electrode 6a of the first TFT 5a is connected to the source line 2 (precisely, the source electrode-extended electrode 6a is a part of the source line 2), and the drain electrode-extended electrode 7 of the first TFT 5a is connected to the pixel electrode 8. Normally, the first TFT 5a functions as a switching element to drive the pixel electrode 8.

The second TFT 5b is a spare TFT which itself does not function as a switching element in the normal state because the source electrode 4b is not connected to the source line-extended electrode 2a although the drain electrode-extended electrode 7 is connected to the pixel electrode 8 as in embodiments 1 and 3. The source electrode 4b has an overlapping region with the source line-extended electrode 2a (region Y4 in FIGS. 15 and 16).

The wire width of the source electrode 4b is about 7.25 μm, and the wire width of the source line-extended electrode 2a is about 5.5 μm. The electrodes 4b and 2a cross each other at right angles to form an overlapping region Y4 of about 7.25 μm×5.5 μm, for example.

The counter substrate and the liquid crystal layer of comparative example 1 are substantially the same as those of embodiment 1 and, therefore, the detailed descriptions thereof are herein omitted.

The production method of the liquid crystal display device of comparative example 1 is not specifically described because it is only necessary to modify the thin film pattern shape which is used for forming the layered film of the active matrix substrate 20a of embodiment 1.

Next, a defect repair method used in the liquid crystal display device of comparative example 1 is described.

Figure 17:
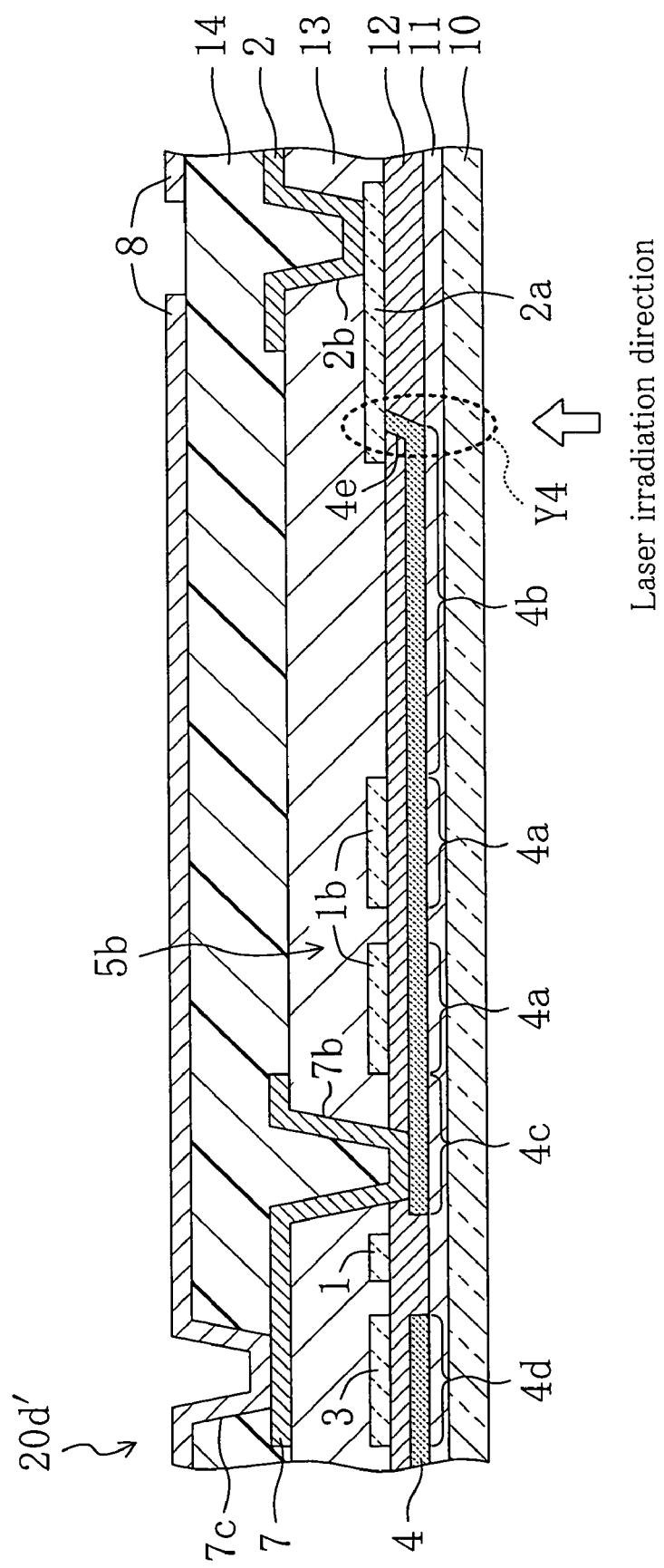
FIG. 17 is a schematic cross-sectional view of the active matrix substrate (after defect repair) according to comparative example 1 of the present invention, which corresponds to the schematic cross-sectional view of FIG. 16.

FIG. 17 is a schematic cross-sectional view of an active matrix substrate 20d' obtained after the defect repair process, which corresponds to the schematic cross-sectional view of FIG. 16 (before defect repair).

The defective pixel detection process and the semiconductor film disconnection step of the defect repair process are the same as those of embodiment 1 and, therefore, the detailed description thereof are herein omitted. The source electrode connection step of the defect repair process, which is a difference from embodiment 1, is described below.

<Defect Repair Process>

[Source Electrode Connection Step]

Referring to FIG. 17, an overlapping region Y4 (about 7.25 μm×5.5 μm) of the source line-extended electrode 2a and the source electrode 4b of the second TFT 5b which corresponds to the first TFT 5a wherein the semiconductor film 4 has been disconnected in the semiconductor film disconnection step is irradiated with laser light emitted through the glass substrate 10 which has a laser spot size of about 4.5 μm×5.75 μm. Accordingly, the gate insulation film 12 between the electrodes 2a and 4b is broken in the overlapping region Y4, and the metal thin films which constitute the electrodes 2a and 4b are melted so that a contact hole 4e is formed in the overlapping region Y4. As a result, the conductive state is achieved between the source electrode 4b of the second TFT 5b and the source line 2 through the contact hole 4e, the source line-extended electrode 2a and the contact hole 2b, so that the source electrode 4b of the second TFT 5b and the source line 2 are short-circuited.

Thus, in the liquid crystal display device, a defective pixel which is defective due to an unusable first TFT 5a can be repaired as described above.

In the source electrode connection step of embodiment 1, there is a possibility that laser light emitted for forming a contact hole damages other elements on the active matrix substrate 20a in the vicinity of the irradiation region of the laser light, e.g., the pixel electrode 8, the liquid crystal layer 40, the alignment film 16, the common electrode 17, etc. If so, the success rate of defect repair in the liquid crystal display device decreases, and it becomes difficult to increase the production yield. In view of such, it is also demanded to readily form a contact hole such that a defect is surely repaired.

In the active matrix substrate 20d of comparative example 1, a contact hole is formed not in the interlayer insulation film but in the gate insulation film. Thus, the possibility of damaging other elements is decreased. This is because of the following reason. In the defect repair process, laser light is emitted through the glass substrate 10 of the active matrix substrate 20d. The overlapping region Y4 is closer to the glass substrate 10 than the overlapping region Y1 of embodiment 1 is. The gate insulation film 12 in the overlapping region Y4 has a thickness (about 115 nm) smaller than that of the interlayer insulation film 13 in the overlapping region Y1 (about 950 nm). Thus, the energy of laser light required for connection in the overlapping region Y4 is smaller than that required for connection in the overlapping region Y1. As a result, the possibility of damaging other elements in the vicinity of the laser light irradiation region (the pixel electrode 8, the liquid crystal layer 40, the alignment film 16, the common electrode 17, etc.) is decreased. Accordingly, a contact hole can readily be formed such that a defect is surely repaired.

In a liquid crystal display device which has undergone the above-described defect repair process, in the case of displaying an image, when a gate signal is transmitted through a gate line 1 so that a second TFT 5b is turned on in a repaired pixel, a source signal is transmitted through a source line 2 such that a predetermined charge is written in a pixel electrode 8 through the source electrode 4b and the drain electrode 4c as in embodiments 1 to 3. As a result, in the defective pixel, the second TFT 5b is driven instead of an unusable first TFT 5a, whereby the image is normally displayed.

As described above, in the active matrix substrate of comparative example 1, a contact hole which enables switching of electrical connection between the source line 2 and the pixel electrode 8 by the second TFT 5b is formed not in the interlayer insulation film 13 but in the gate insulation film 12. Thus, a contact hole can readily be formed, and a defect is surely repaired. Further, a liquid crystal display device including an unusable first TFT 5a can be repaired to provide normal display, and accordingly, the production yield of the liquid crystal display device can also be improved.

COMPARATIVE EXAMPLE 2

Hereinafter, a liquid crystal display device of comparative example 2 is described.

Figure 18:
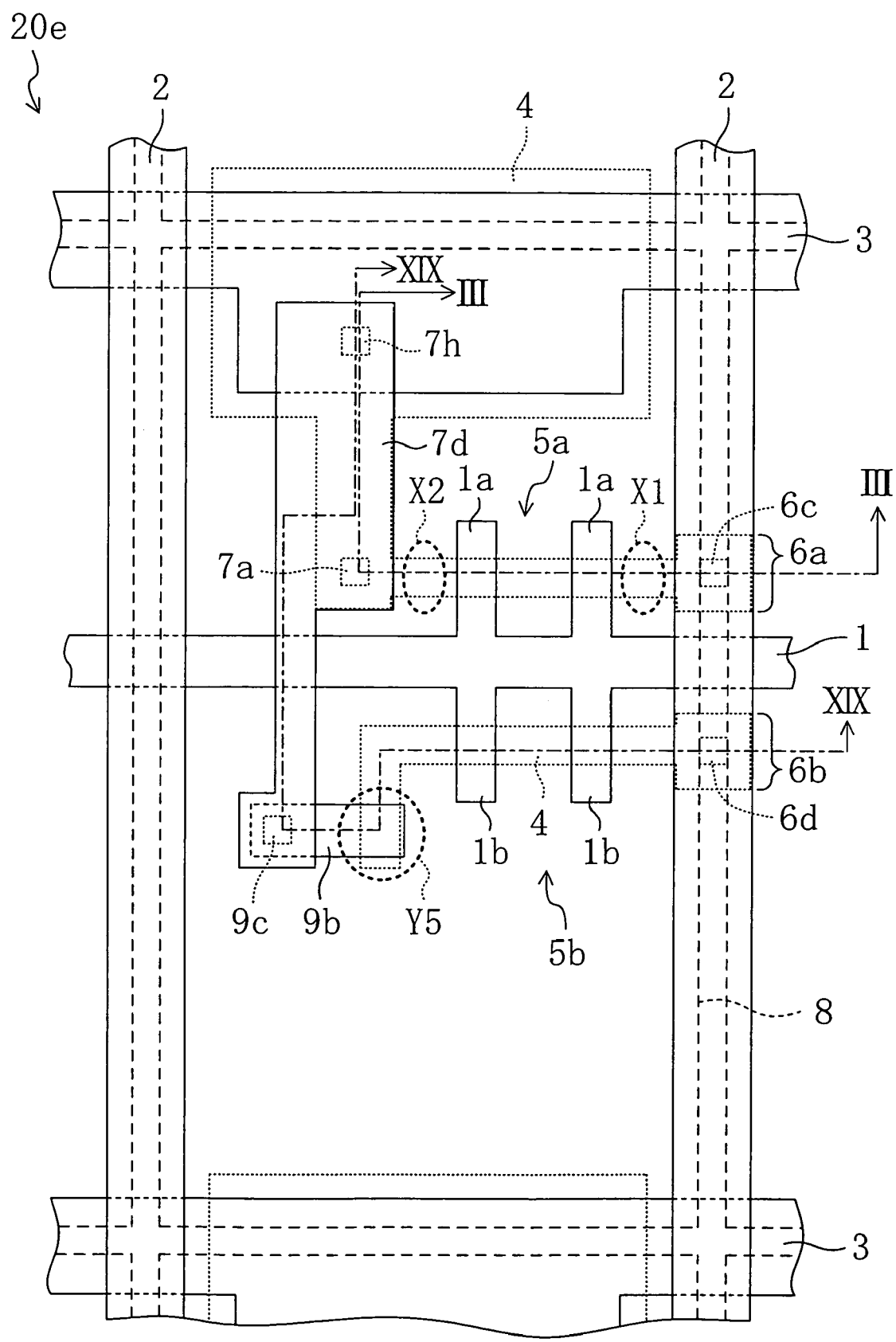
FIG. 18 is a schematic plan view of an active matrix substrate according to comparative example 2 of the present invention.
Figure 19:
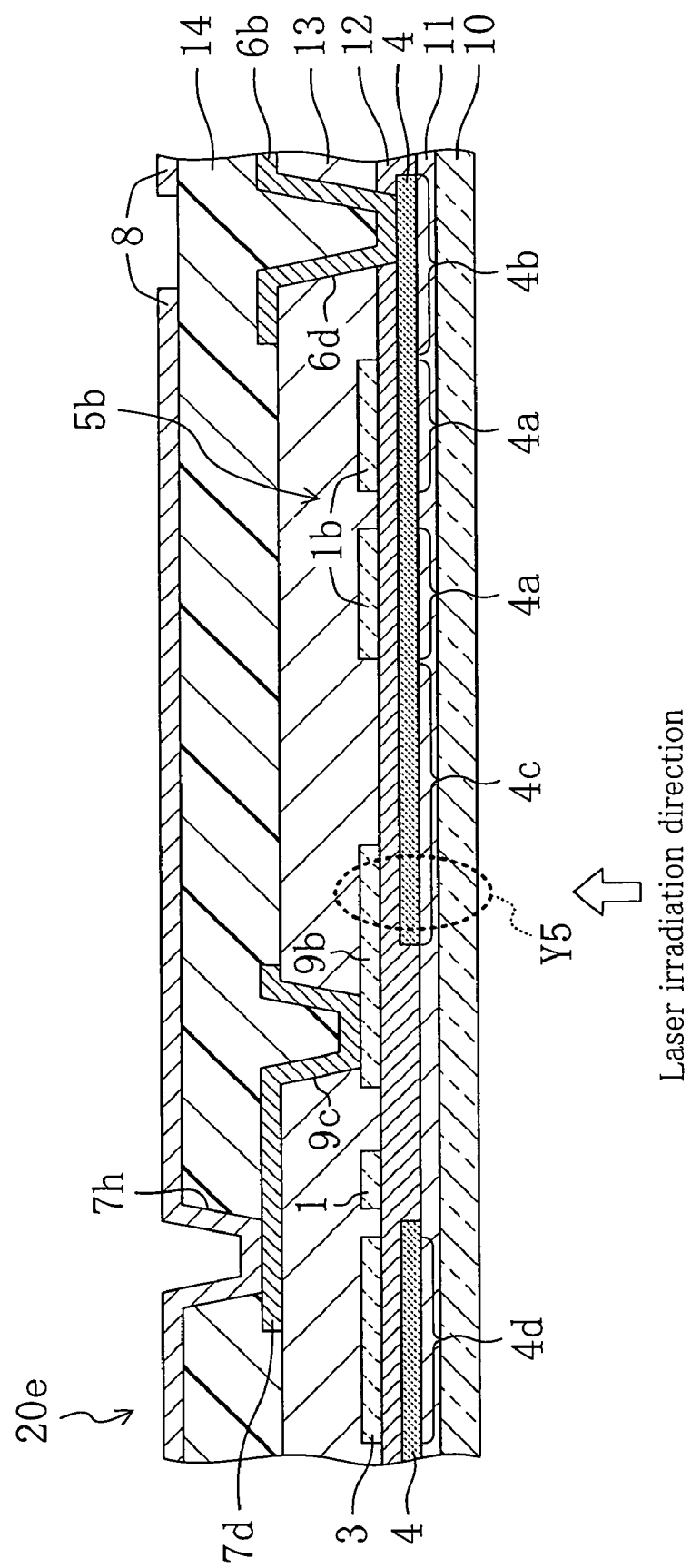
FIG. 19 is a schematic cross-sectional view of the active matrix substrate (before defect repair) according to comparative example 2 of the present invention, which is taken along line XIX—XIX of FIG. 18.

FIG. 18 is a schematic plan view of an active matrix substrate 20e of the liquid crystal display device of comparative example 2. FIG. 19 is a schematic cross-sectional view of the active matrix substrate 20e taken along line XIX—XIX of FIG. 18. The cross-sectional structure of the active matrix substrate 20e taken along line III—III of FIG. 18 is substantially the same as that of the active matrix substrate 20a of FIG. 3, and therefore, the cross-sectional view thereof is not provided herein.

The liquid crystal display device of comparative example 2 includes the active matrix substrate 20e, a counter substrate that faces the active matrix substrate 20e, and a liquid crystal layer interposed between these substrates.

As shown in FIG. 18, in the active matrix substrate 20e, a plurality of gate lines 1 and a plurality of source lines 2 which function as signal supplying sections extend over an insulation substrate 10 so as to cross each other at right angles, and capacitor lines 3 run between the gate lines 1 so as to extend in parallel to the gate lines 1. The active matrix substrate 20e includes a first TFT 5a and a second TFT 5b at each intersection of the gate lines 1 and the source lines 2. A display region enclosed by a pair of capacitor lines 3 and a pair of source lines 2 has a pixel electrode 8. The pixel electrode 8 functions as a signal receiving section of the first TFT 5a and second TFT 5b and constitutes a pixel.

The active matrix substrate 20e has a multilayered structure wherein a base coat film 11, a gate insulation film 12, an interlayer insulation film 13 and a resin layer 14 are sequentially provided on the insulation substrate 10 as shown in FIG. 19.

In the active matrix substrate 20e, a region including the first TFT 5a has the same structure as that of a region of the active matrix substrate 20a of embodiment 1 which includes the first TFT 5a, and therefore, the structure of the second TFT 5b is mainly described below.

A semiconductor film 4, which includes a channel region 4a, a source electrode 4b, a drain electrode 4c and an auxiliary capacitor electrode 4d, is provided between the base coat film 11 and the gate insulation film 12.

The interlayer space between the gate insulation film 12 and the interlayer insulation film 13 includes the gate line 1, gate electrode 1b which is a branch of the gate line 1, the capacitor line 3, and a drain-electrode relaying electrode 9b.

The interlayer space between the interlayer insulation film 13 and the resin layer 14 includes a source electrode-extended electrode 6b which is connected to the source electrode 4b through a contact hole 6d and a pixel-electrode relaying electrode 7d which is connected to the drain-electrode relaying electrode 9b through a contact hole 9c.

Provided over the resin layer 14 is the pixel electrode 8 which is connected to the pixel-electrode relaying electrode 7d through a contact hole 7c. An alignment film 16 is provided over the pixel electrode 8.

The source electrode-extended electrode 6a of the first TFT 5a is connected to the source line 2 (precisely, the source electrode-extended electrode 6a is a part of the source line 2), and the drain electrode-extended electrode 7 of the first TFT 5a is connected to the pixel electrode 8 as in embodiments 1 to 3 and comparative example 1. Normally, the first TFT 5a functions as a switching element to drive the pixel electrode 8.

The second TFT 5b is a spare TFT which itself does not function as a switching element in the normal state because the drain electrode 4c is not connected to the drain-electrode relaying electrode 9b although the source electrode-extended electrode 6b is connected to the source line 2 (precisely, the source electrode-extended electrode 6b is a part of the source line 2). The drain electrode 4c has an overlapping region with the drain-electrode relaying electrode 9b (region Y5 in FIGS. 18 and 19).

In the second TFT 5b of the active matrix substrate 20e, the source electrode side (the source electrode-extended electrode 6b) is connected in advance as in the active matrix substrate 20b of embodiment 2. With such a structure, the burden imposed on the source line 2 is reduced, and a driver can be designed to have a lower capacity. Thus, the power consumption of the liquid crystal display device can be reduced as in embodiment 2.

The counter substrate and the liquid crystal layer of comparative example 2 are substantially the same as those of embodiment 1 and, therefore, the detailed descriptions thereof are herein omitted.

The production method of the liquid crystal display device of comparative example 2 is not specifically described because it is only necessary to modify the thin film pattern shape which is used for forming the layered film of the active matrix substrate 20b of embodiment 2.

Next, a defect repair method used in the liquid crystal display device of comparative example 2 is described.

Figure 20:
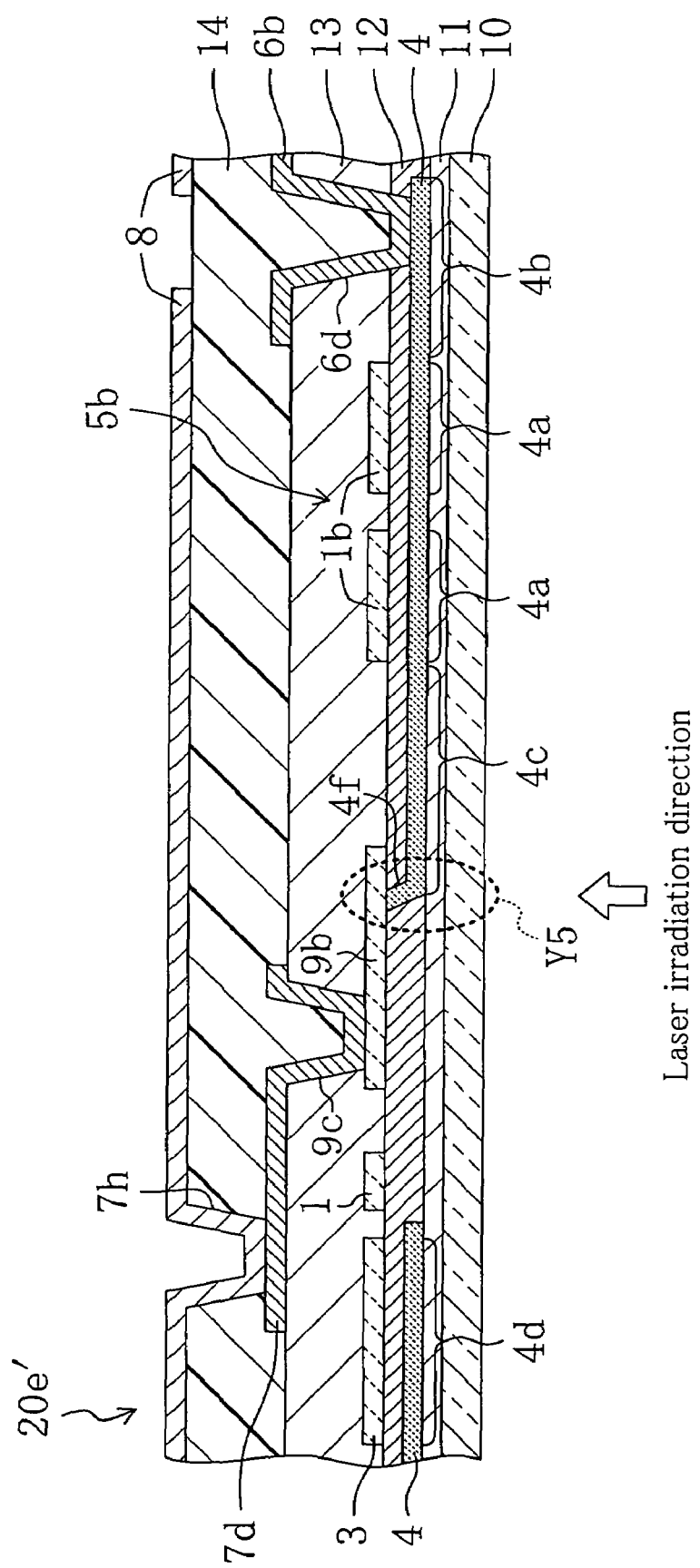
FIG. 20 is a schematic cross-sectional view of the active matrix substrate (after defect repair) according to comparative example 2 of the present invention, which corresponds to the schematic cross-sectional view of FIG. 19.

FIG. 20 is a schematic cross-sectional view of an active matrix substrate 20e' obtained after the defect repair process, which corresponds to the schematic cross-sectional view of FIG. 19 (before defect repair).

The defective pixel detection process and the semiconductor film disconnection step of the defect repair process are the same as those of embodiment 1 and, therefore, the detailed description thereof are herein omitted. The drain electrode connection step of the defect repair process, which is a difference from embodiment 1, is described below.

<Defect Repair Process>

[Drain Electrode Connection Step]

Referring to FIG. 20, the overlapping region Y5 of the drain electrode 4c and the drain-electrode relaying electrode 9b of the second TFT 5b which corresponds to the first TFT 5a wherein the semiconductor film 4 has been disconnected in the semiconductor film disconnection step is irradiated with laser light emitted through the glass substrate 10. Accordingly, the gate insulation film 12 between the electrodes 4c and 9b is broken in the overlapping region Y5, and the metal thin films which constitute the electrodes 4c and 9b are melted so that a contact hole 4f is formed in the overlapping region Y5. As a result, the conductive state is achieved between the drain electrode 4c of the second TFT 5b and the pixel electrode 8 through the contact hole 4f, the drain-electrode relaying electrode 9b, the contact hole 9c, the pixel-electrode relaying electrode 7d and the contact hole 7h, so that the drain electrode 4c of the second TFT 5b and the pixel electrode 8 are short-circuited.

In the liquid crystal display device of comparative example 2, a defective pixel which is defective due to an unusable first TFT 5a can be repaired as described above. Irradiation of laser light is performed in the same way as that of comparative example 1 and, therefore, the description thereof is herein omitted.

In a liquid crystal display device which has undergone the above-described defect repair process, in the case of displaying an image, when a gate signal is transmitted through a gate line 1 so that a second TFT 5b is turned on in a repaired pixel, a source signal is transmitted through a source line 2 such that a predetermined charge is written in a pixel electrode 8 through the source electrode 4b and the drain electrode 4c as in embodiments 1 to 3 and comparative example 1. As a result, in the defective pixel, the second TFT 5b is driven instead of an unusable first TFT 5a, whereby the image is normally displayed.

As described above, in the active matrix substrate of comparative example 2, a contact hole which enables switching of electrical connection between the source line 2 and the pixel electrode 8 by the second TFT 5b is formed not in the interlayer insulation film 13 but in the gate insulation film 12 as in comparative example 1. Thus, in the case where the first TFT 5a is unusable and a contact hole is formed by laser light irradiation such that the second TFT 5b can be used, the energy of laser light required for forming the contact hole is small. Accordingly, the possibility of damaging other elements in the vicinity of the laser light irradiation region is decreased. Further, a contact hole can readily be formed, and a defect is surely repaired. Furthermore, a liquid crystal display device including an unusable first TFT 5a can be repaired to provide normal display, and accordingly, the production yield of the liquid crystal display device can also be improved.

COMPARATIVE EXAMPLE 3

Hereinafter, a liquid crystal display device of comparative example 3 is described.

Figure 21:
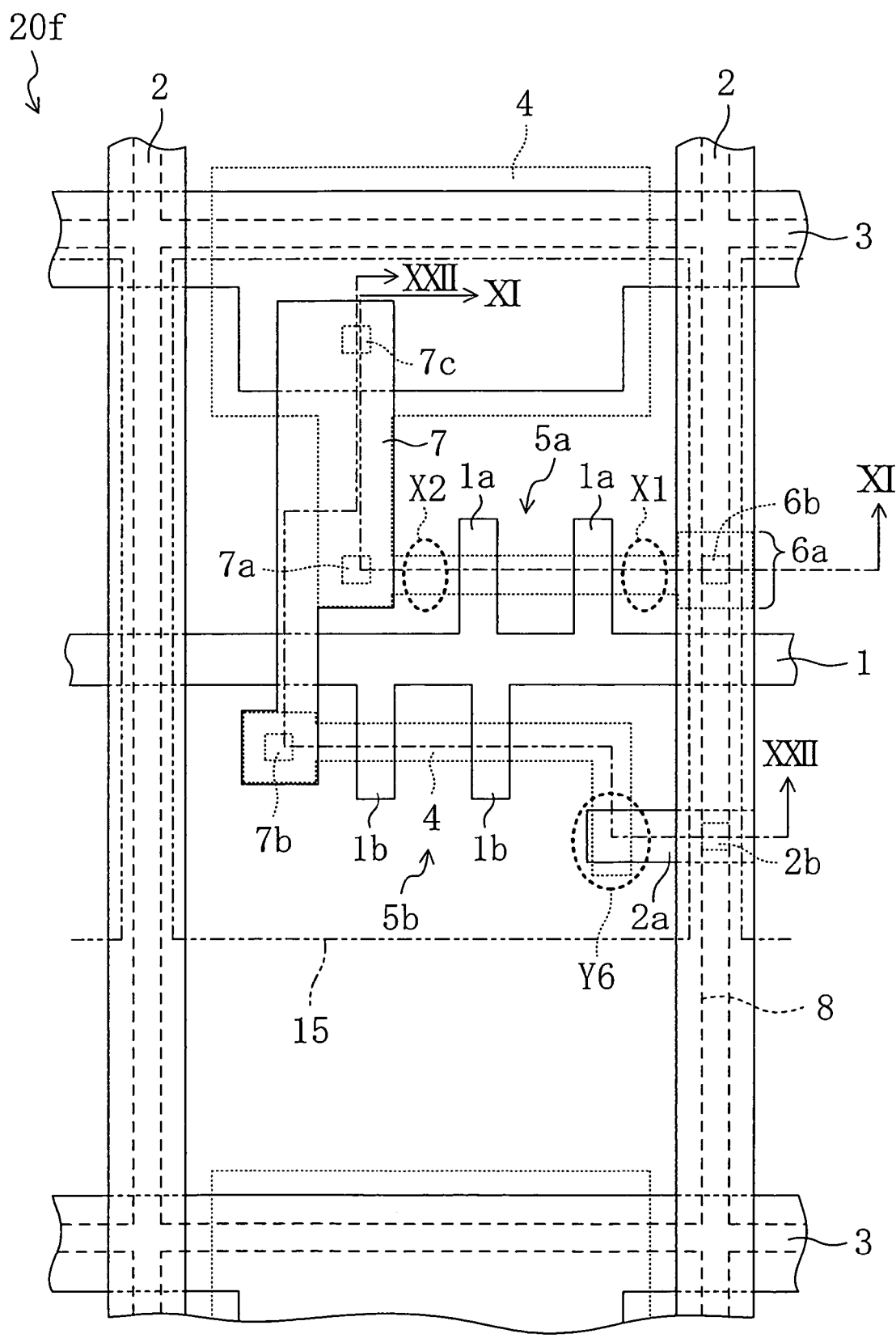
FIG. 21 is a schematic plan view of an active matrix substrate according to comparative example 3 of the present invention.
Figure 22:
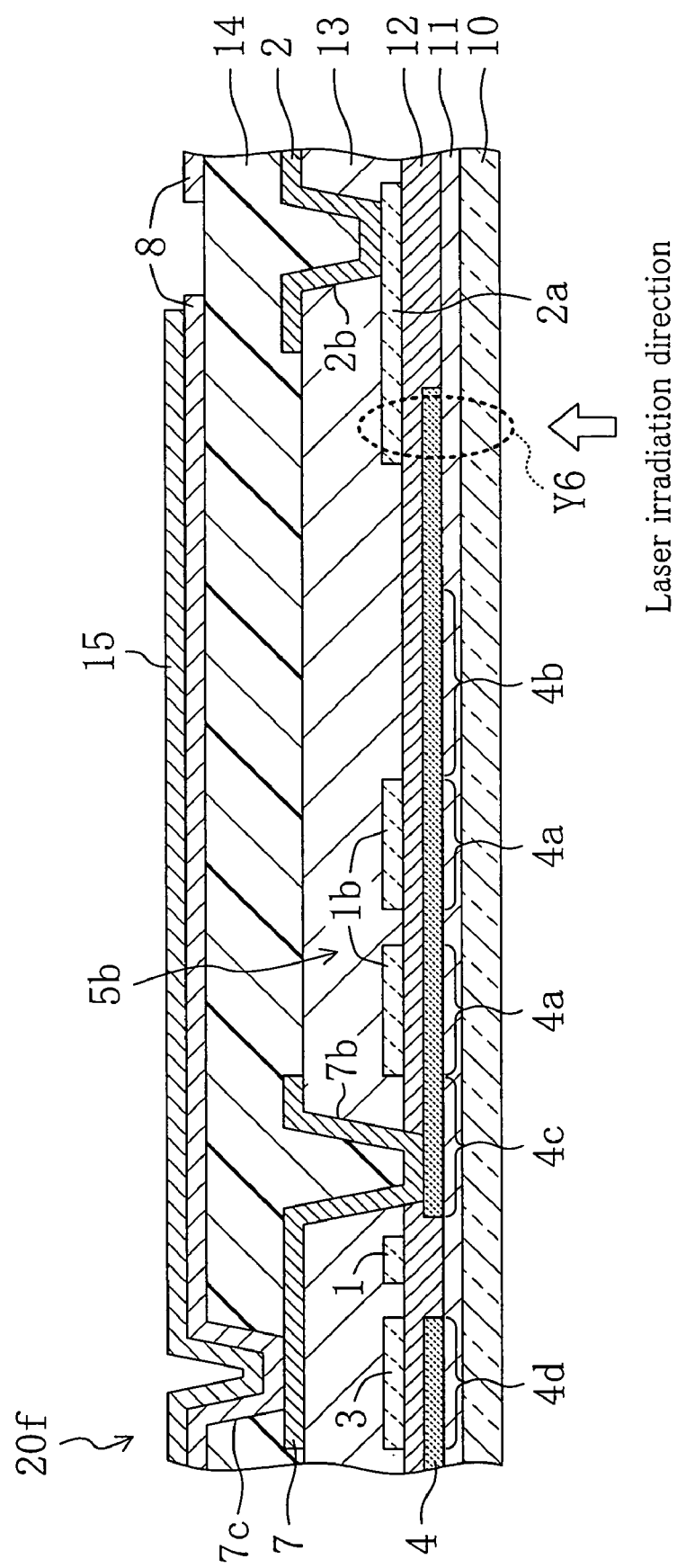
FIG. 22 is a schematic cross-sectional view of the active matrix substrate (before defect repair) according to comparative example 3 of the present invention, which is taken along line XXII—XXII of FIG. 21.

FIG. 21 is a schematic plan view of an active matrix substrate 20f of the liquid crystal display device of comparative example 3. FIG. 22 is a schematic cross-sectional view of the active matrix substrate 20f taken along line XXII—XXII of FIG. 21. The cross-sectional structure of the active matrix substrate 20f taken along line XI—XI of FIG. 21 is substantially the same as that of the active matrix substrate 20c of FIG. 11, and therefore, the cross-sectional view thereof is not provided herein.

The liquid crystal display device of comparative example 3 includes the active matrix substrate 20f, a counter substrate that faces the active matrix substrate 20f, and a liquid crystal layer interposed between these substrates.

As shown in FIG. 22, in the active matrix substrate 20f, a layered film structure between a base coat film 11 and a pixel electrode 8 is substantially the same as that of the active matrix substrate 20d of comparative example 1. A reflector electrode 15 is provided on the pixel electrode 8 so as to cover a first TFT 5a and a second TFT 5b, and an alignment film 16 is provided so as to cover the pixel electrode 8 and the reflector electrode 15.

The reflector electrode 15 overlaps about 70% area of the pixel electrode 8 as in embodiment 3. The reflector electrode 15 constitutes a reflection region. The remaining area, i.e., about 30%, of the pixel electrode 8 that the reflector electrode 15 does not overlap constitutes a transmission region.

The counter substrate and the liquid crystal layer of comparative example 3 are substantially the same as those of embodiment 1 and, therefore, the detailed descriptions thereof are herein omitted.

In the liquid crystal display device of comparative example 3, a predetermined charge is written in the pixel electrode 8 and the reflector electrode 15 in each pixel, so that a potential difference occurs between the pixel electrode 8 and reflector electrode 15 and the common electrode 17, whereby a predetermined voltage is applied to the liquid crystal capacitor formed by the liquid crystal layer 40 and the auxiliary capacitor, as in embodiment 3. The transmittance of light coming from the outside is adjusted using the mechanism that the orientation of liquid crystal molecules changes according to the largeness of the applied voltage, whereby an image is displayed. In the reflection region, light coming from the outside through the counter substrate is reflected by the reflector electrode 15, while the transmission region transmits light coming from the outside through the active matrix substrate 20f, whereby an image is displayed.

Next, a fabrication method of the active matrix substrate 20f included in a liquid crystal device of comparative example 3 is partially described.

At the first step, an active matrix substrate 20d is prepared according to the fabrication method of the active matrix substrate 20d of comparative example 1.

Then, a molybdenum film (about 100 nm thick) and an aluminum film (about 150 nm thick) are formed on the pixel electrode 8 over the active matrix substrate 20d by sputtering. The films are patterned using PEP technology to form a reflector electrode 15.

Thus, as described above, the active matrix substrate 20f has been fabricated. Thereafter, a thin film of a polyimide resin is formed by printing over the active matrix substrate 20f. The surface of the thin film is subjected to an alignment treatment by a rubbing method to form an alignment film 16.

Next, a defect repair method used in the liquid crystal display device of comparative example 3 is described.

Figure 23:
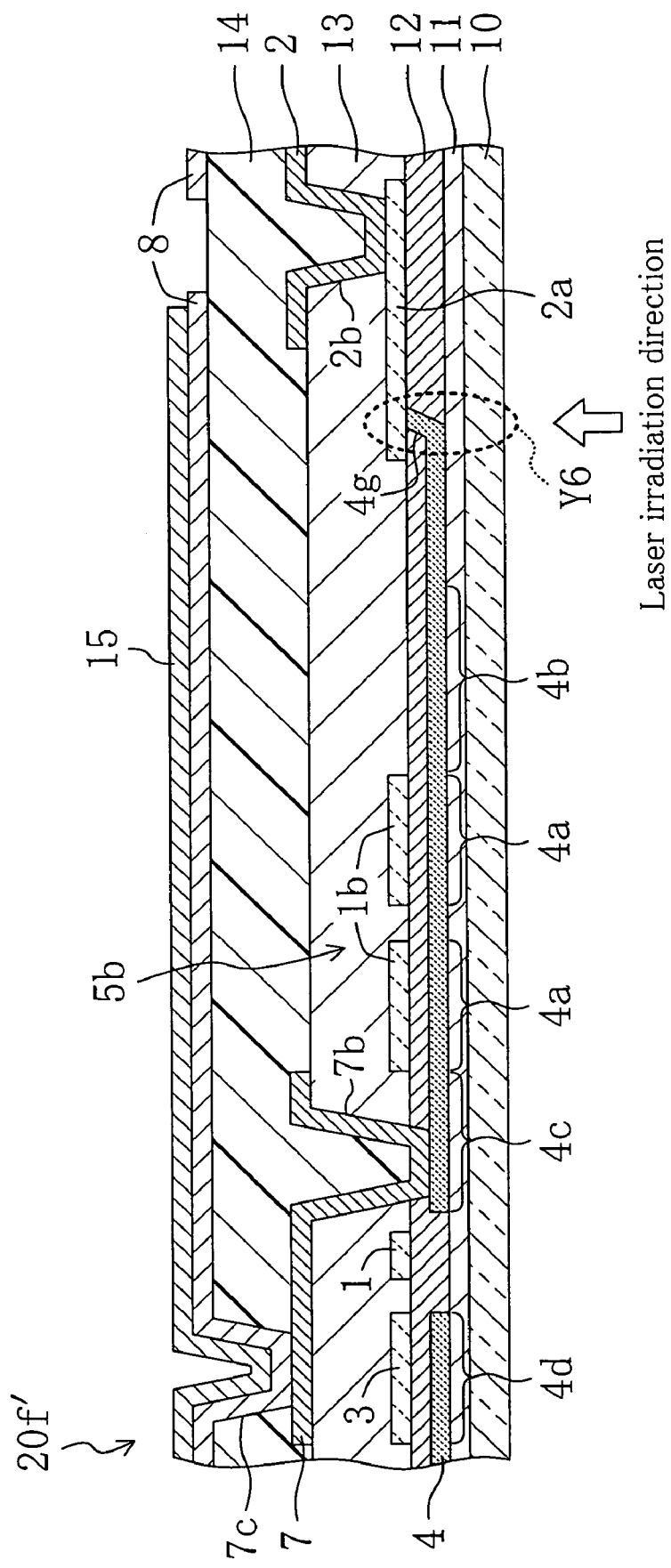
FIG. 23 is a schematic cross-sectional view of the active matrix substrate (after defect repair) according to comparative example 3 of the present invention, which corresponds to the schematic cross-sectional view of FIG. 22.

FIG. 23 is a schematic cross-sectional view of an active matrix substrate 20f obtained after the defect repair process, which corresponds to the schematic cross-sectional view of FIG. 22 (before defect repair).

The defective pixel detection process and the semiconductor film disconnection step of the defect repair process are the same as those of embodiment 1 and, therefore, the detailed description thereof are herein omitted. The source electrode connection step of the defect repair process, which is a difference from embodiment 1, is described below.

<Defect Repair Process>

[Source Electrode Connection Step]

Referring to FIG. 23, an overlapping region Y6 of the source electrode 4b and the source line-extended electrode 2a of the second TFT 5b which corresponds to the first TFT 5a wherein the semiconductor film 4 has been disconnected in the semiconductor film disconnection step is irradiated with laser light emitted through the glass substrate 10. Accordingly, the gate insulation film 12 between the electrodes 4b and 2a is broken in the overlapping region Y6, and the metal thin films which constitute the electrodes 4b and 2a are melted so that a contact hole 4g is formed in the overlapping region Y6. As a result, the conductive state is achieved between the source electrode 4b of the second TFT 5b and the source line 2 through the contact hole 4g, the source line-extended electrode 2a and the contact hole 2b, so that the source electrode 4b of the second TFT 5b and the source line 2 are short-circuited.

In comparative example 3, irradiation of laser light is performed in the same way as that of embodiment 1 and, therefore, the description thereof is herein omitted.

Thus, in the liquid crystal display device, a defective pixel which is defective due to an unusable first TFT 5a can be repaired as described above.

In a liquid crystal display device which has undergone the above-described defect repair process, in the case of displaying an image, when a gate signal is transmitted through a gate line 1 so that a second TFT 5b is turned on in a repaired pixel, a source signal is transmitted through a source line 2 such that a predetermined charge is written in a pixel electrode 8 through the source electrode 4b and the drain electrode 4c as in embodiments 1 to 3 and comparative examples 1 and 2. As a result, in the defective pixel, the second TFT 5b is driven instead of an unusable first TFT 5a, whereby the image is normally displayed.

The defect repair method of the liquid crystal display device of comparative example 3 and the effects of the method are the same as those of comparative example 1, and therefore, the detailed descriptions thereof are herein omitted.

In the above-described example of comparative example 3, the semitransmissive liquid crystal display device which has both a reflection region and a transmission region in each pixel has been described. However, the liquid crystal display device of comparative example 3 may be a reflective liquid crystal display device wherein the reflective region extends over the entire area of each pixel. In this case, the pixel electrode 8 formed of ITO may be replaced by a reflector electrode 15 formed of an aluminum film. Alternatively, a reflector electrode may be added to the active matrix substrate 20e of comparative example 2.

Embodiment 4

Hereinafter, a liquid crystal display device of embodiment 4 of the present invention is described.

Figure 24:
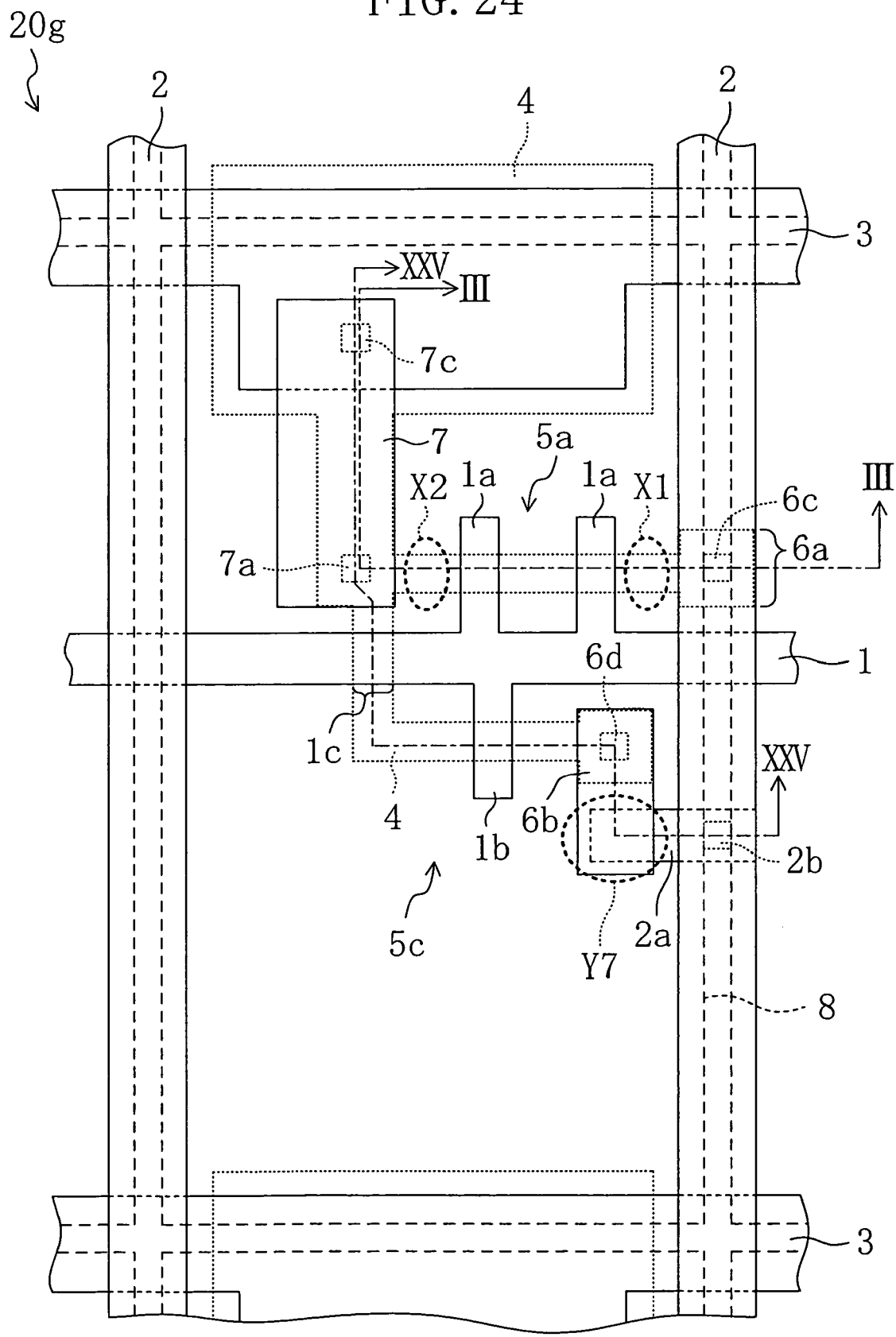
FIG. 24 is a schematic plan view of an active matrix substrate according to embodiment 4 of the present invention.
Figure 25:
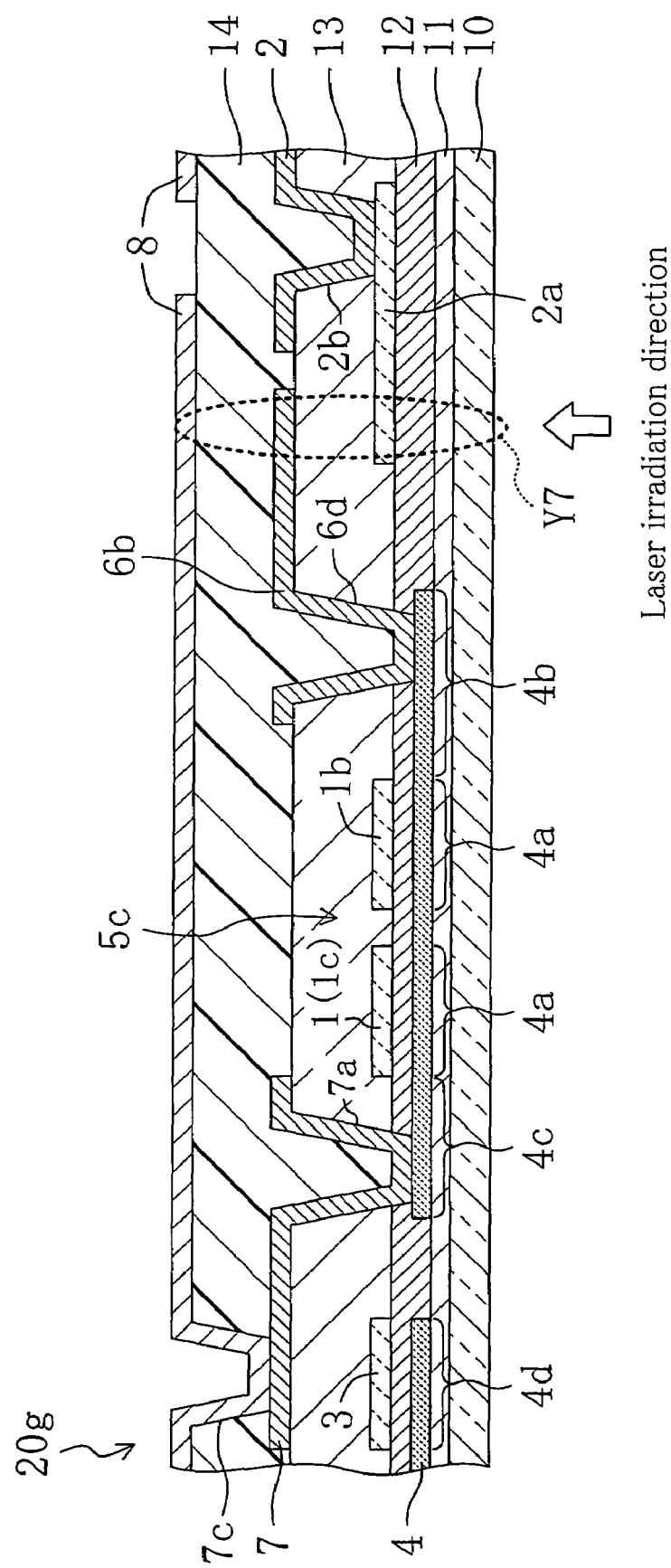
FIG. 25 is a schematic cross-sectional view of the active matrix substrate (before defect repair) according to embodiment 4 of the present invention, which is taken along line XXV—XXV of FIG. 24.

FIG. 24 is a schematic plan view of an active matrix substrate 20g of the liquid crystal display device of embodiment 4. FIG. 25 is a schematic cross-sectional view of the active matrix substrate 20g taken along line XXV—XXV of FIG. 24. The cross-sectional structure of the active matrix substrate 20g taken along line III—III of FIG. 24 is substantially the same as that of the active matrix substrate 20a of FIG. 3, and therefore, the cross-sectional view thereof is not provided herein.

The liquid crystal display device of embodiment 4 includes the active matrix substrate 20g, a counter substrate that faces the active matrix substrate 20g, and a liquid crystal layer interposed between these substrates.

As shown in FIG. 24, in the active matrix substrate 20g, a plurality of gate lines 1 and a plurality of source lines 2 which function as signal supplying sections extend over an insulation substrate 10 so as to cross each other at right angles, and capacitor lines 3 run between the gate lines 1 so as to extend in parallel to the gate lines 1. The active matrix substrate 20d includes a first TFT 5a and a second TFT 5c at each intersection of the gate lines 1 and the source lines 2. A display region enclosed by a pair of capacitor lines 3 and a pair of source lines 2 has a pixel electrode 8. The pixel electrode 8 functions as a signal receiving section of the first TFT 5a and second TFT 5c and constitutes a pixel.

The source electrode-extended electrode 6a of the first TFT 5a is connected to the source line 2 (precisely, the source electrode-extended electrode 6a is a part of the source line 2), and the drain electrode-extended electrode 7 of the first TFT 5a is connected to the pixel electrode 8 as in embodiments 1 to 3 and comparative examples 1 to 3. Normally, the first TFT 5a functions as a switching element to drive the pixel electrode 8.

The second TFT 5c is a spare TFT which itself does not function as a switching element in the normal state because the source electrode-extended electrode 6b is not connected to the source line 2 although the drain electrode-extended electrode 7 is connected to the pixel electrode 8.

The structure of the second TFT 5c is different from that of the second TFT 5b described in embodiments 1 to 3 and comparative examples 1 to 3 in that the drain electrode 4c of the second TFT 5c is connected to the drain electrode 4c of the semiconductor film 4 of the first TFT 5a. A portion of the gate line 1 which overlaps the semiconductor film 4 constitutes a gate electrode 1c. The gate electrodes 1b and 1c constitute a multi-gate. The source electrode-extended electrode 6b has an overlapping region with the source line-extended electrode 2a (region Y7 in FIGS. 24 and 25).

The counter substrate and the liquid crystal layer of embodiment 4 are substantially the same as those of embodiment 1 and, therefore, the detailed descriptions thereof are herein omitted.

The production method of the liquid crystal display device of embodiment 4 of the present invention is not specifically described because it is only necessary to modify the thin film pattern shape which is used for forming the layered film of the active matrix substrate 20a of embodiment 1.

Next, a defect repair method used in the liquid crystal display device of embodiment 4 of the present invention is described.

Figure 26:
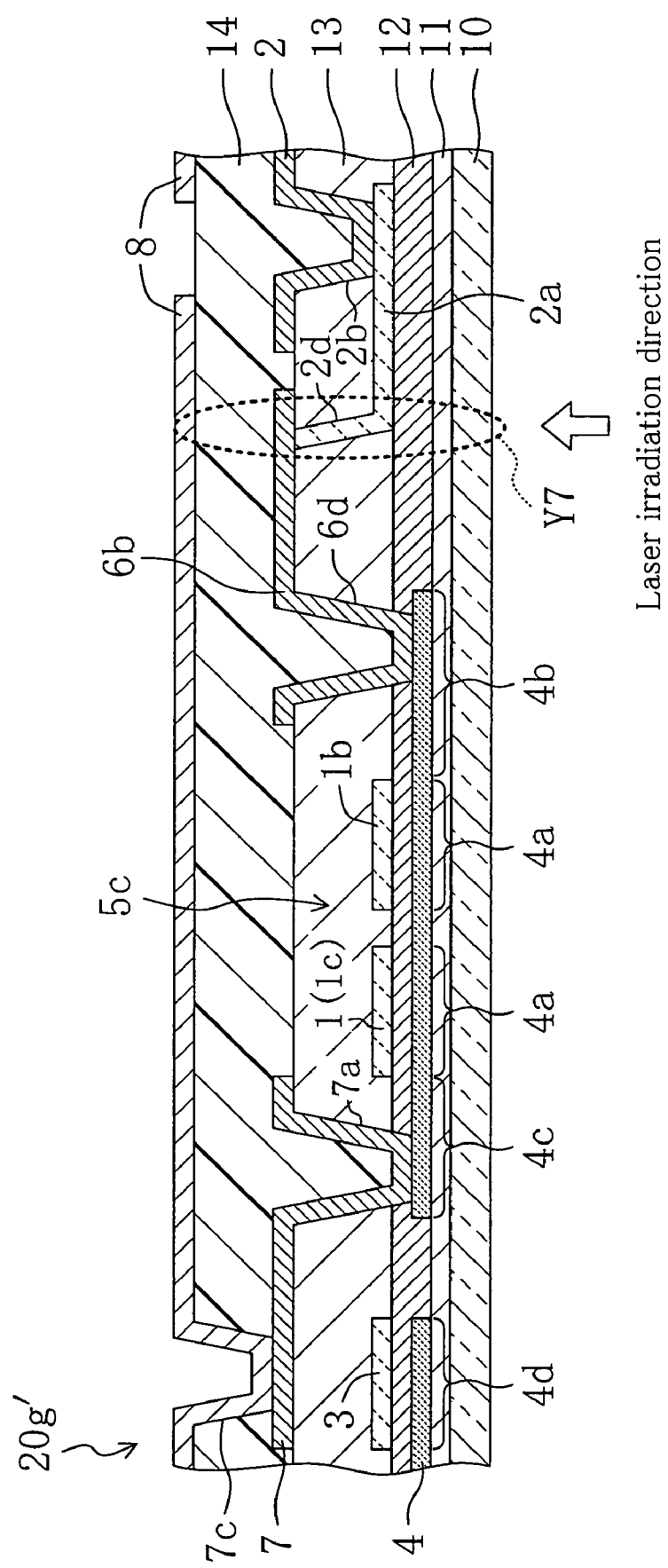
FIG. 26 is a schematic cross-sectional view of the active matrix substrate (after defect repair) according to embodiment 4 of the present invention, which corresponds to the schematic cross-sectional view of FIG. 25.

FIG. 26 is a schematic cross-sectional view of an active matrix substrate 20g' obtained after the defect repair process, which corresponds to the schematic cross-sectional view of FIG. 25 (before defect repair).

In the example of FIG. 26, the overlapping region Y7 is irradiated with laser light emitted through the glass substrate 10 such that a contact hole 2d is formed in the overlapping region Y7.

The defect repair method of the liquid crystal display device of embodiment 4 and the effects of the method are the same as those of embodiment 1, and therefore, the detailed descriptions thereof are herein omitted.

As described above, in the liquid crystal display device of embodiment 4, the pixel electrode 8 and the drain electrodes 4c of the first TFT 5a and the second TFT 5c are electrically connected through the same contact hole 7a and, therefore, part of the elements that constitute the first TFT 5a and the second TFT 5c, i.e., the contact hole for connecting the pixel electrode 8 and the drain electrodes 4c, is shared among the first TFT 5a and the second TFT 5c. Thus, the area occupied by the contact hole in a pixel is decreased and, accordingly, the aperture ratio of the pixel is increased. Further, the number of elements that constitute a TFT is decreased and, accordingly, the production yield is improved.

Embodiment 5

Hereinafter, a liquid crystal display device of embodiment 5 of the present invention is described.

Figure 27:
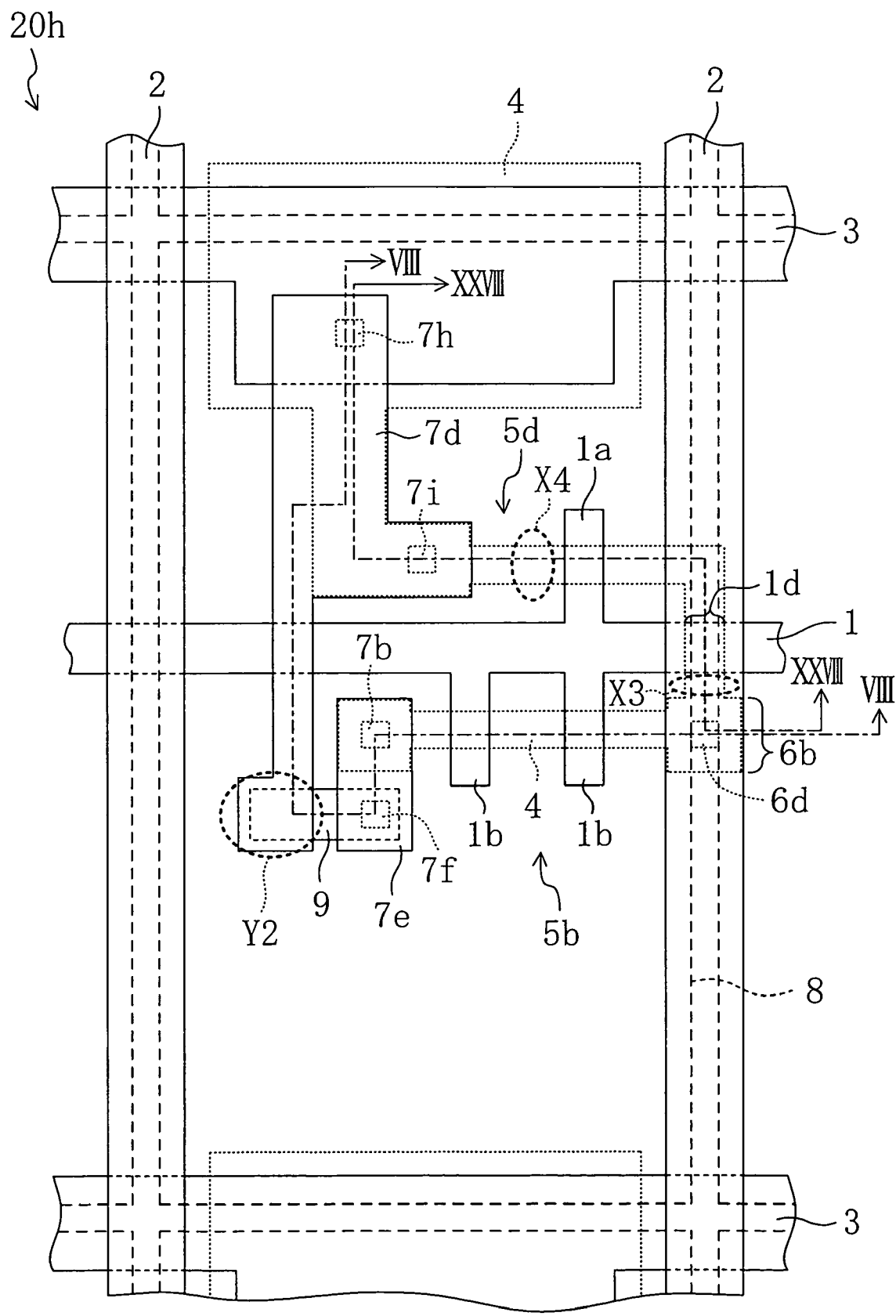
FIG. 27 is a schematic plan view of an active matrix substrate according to embodiment 5 of the present invention.
Figure 28:
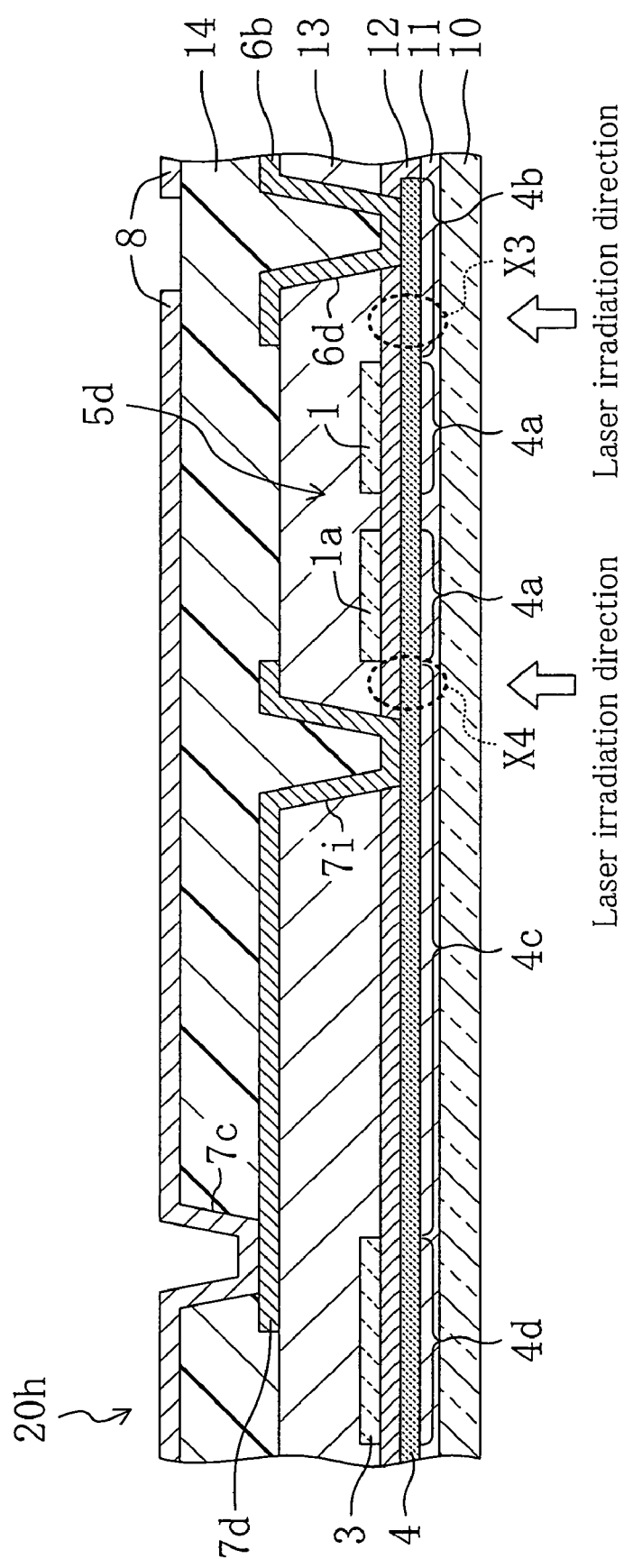
FIG. 28 is a schematic cross-sectional view of the active matrix substrate (before defect repair) according to embodiment 5 of the present invention, which is taken along line XXVIII—XXVIII of FIG. 27.

FIG. 27 is a schematic plan view of an active matrix substrate 20h of the liquid crystal display device of embodiment 5. FIG. 28 is a schematic cross-sectional view of the active matrix substrate 20h taken along line XXVIII—XXVIII of FIG. 27. The cross-sectional structure of the active matrix substrate 20h taken along line VIII—VIII of FIG. 27 is substantially the same as that of the active matrix substrate 20b of FIG. 8, and therefore, the cross-sectional view thereof is not provided herein.

The liquid crystal display device of embodiment 5 includes the active matrix substrate 20h, a counter substrate that faces the active matrix substrate 20h, and a liquid crystal layer interposed between these substrates.

As shown in FIG. 27, in the active matrix substrate 20h, a plurality of gate lines 1 and a plurality of source lines 2 which function as signal supplying sections extend over an insulation substrate 10 so as to cross each other at right angles, and capacitor lines 3 run between the gate lines 1 so as to extend in parallel to the gate lines 1. The active matrix substrate 20h includes a first TFT 5d and a second TFT 5b at each intersection of the gate lines 1 and the source lines 2. A display region enclosed by a pair of capacitor lines 3 and a pair of source lines 2 has a pixel electrode 8. The pixel electrode 8 functions as a signal receiving section of the first TFT 5d and second TFT 5b and constitutes a pixel.

The source electrode 4b of the first TFT 5d is connected to the source line 2 through a contact hole 6d, and the drain electrode 4c of the first TFT 5d is connected to the pixel electrode 8 through a contact hole 7i, the pixel-electrode relaying electrode 7d and the contact hole 7c. With such a structure, the first TFT 5d normally functions as a switching element to drive the pixel electrode 8 as in embodiments 1 to 4 and comparative examples 1 to 3.

The structure of the first TFT 5d is different from that of the first TFT 5a described in embodiments 1 to 4 and comparative examples 1 to 3 in that the source electrode 4b of the first TFT 5d is connected to the source electrode 4b of the semiconductor film 4 of the second TFT 5b. A portion of the gate line 1 which overlaps the semiconductor film 4 constitutes a gate electrode 1d. The gate electrodes 1a and 1d constitute a multi-gate.

The second TFT 5b is a spare TFT which itself does not function as a switching element in the normal state because the second drain electrode-extended electrode 9 is not connected to the pixel-electrode relaying electrode 7d although the source electrode-extended electrode 6b is connected to the source line 2 (precisely, the source electrode-extended electrode 6b is a part of the source line 2). The second drain electrode-extended electrode 9 has an overlapping region with the pixel-electrode relaying electrode 7d (region Y2 in FIGS. 27 and 8).

In the second TFT 5b of the active matrix substrate 20h, the source electrode side (the source electrode-extended electrode 6b) is connected in advance. With such a structure, the burden imposed on the source line 2 is reduced as described in embodiment 2, and a driver can be designed to have a lower capacity. Thus, the power consumption of the liquid crystal display device can be reduced.

The counter substrate and the liquid crystal layer of embodiment 5 are substantially the same as those of embodiment 1 and, therefore, the detailed descriptions thereof are herein omitted.

The production method of the liquid crystal display device of embodiment 5 of the present invention is not specifically described because it is only necessary to modify the thin film pattern shape which is used for forming the layered film of the active matrix substrate 20a of embodiment 1.

Next, a defect repair method used in the liquid crystal display device of embodiment 5 of the present invention is described.

Figure 29:
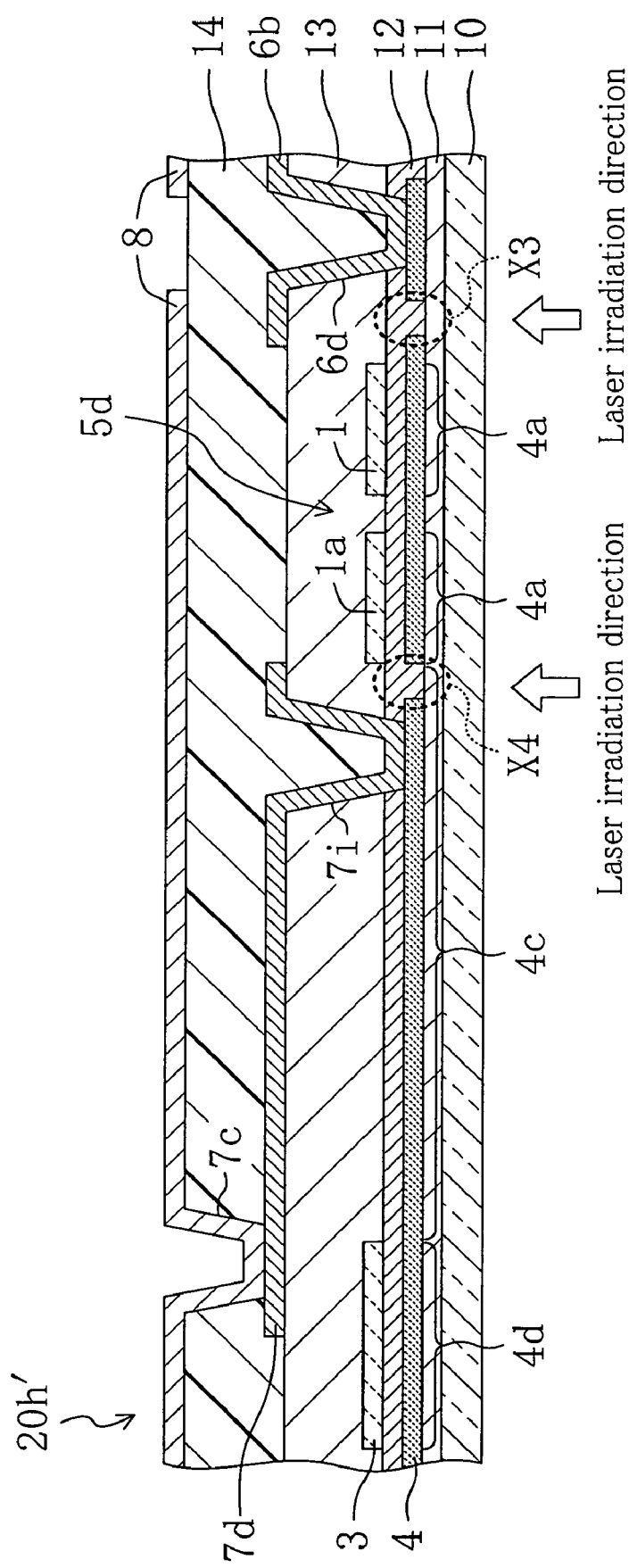
FIG. 29 is a schematic cross-sectional view of the active matrix substrate (after defect repair) according to embodiment 5 of the present invention, which corresponds to the schematic cross-sectional view of FIG. 28.

FIG. 29 is a schematic cross-sectional view of an active matrix substrate 20h' obtained after the defect repair process, which corresponds to the schematic cross-sectional view of FIG. 28 (before defect repair).

In the example of FIG. 29, disconnection portions X3 and X4 of the semiconductor film 4 are irradiated with laser light emitted through the glass substrate 10 such that the source electrode 4b and the drain electrode 4c of the semiconductor film 4 are disconnected.

The defect repair method of the liquid crystal display device of embodiment 5 and the effects of the method are the same as those of embodiment 2, and therefore, the detailed descriptions thereof are herein omitted.

As described above, in the liquid crystal display device of embodiment 5, the source line 2 and the drain electrodes 4b of the first TFT 5d and the second TFT 5b are electrically connected through the same contact hole 6d and, therefore, part of the elements that constitute the first TFT 5d and the second TFT 5b, i.e., the contact hole for connecting the source line 2 and the drain electrodes 4c, is shared among the first TFT 5d and the second TFT 5b. Thus, the area occupied by the contact hole in a pixel is decreased and, accordingly, the aperture ratio of the pixel is increased. Further, the number of elements that constitute a TFT is decreased and, accordingly, the production yield is improved.

Embodiment 6

A liquid crystal display device of the present invention may have a structure described below, which is a variation of the structure of embodiment 4.

Figure 30:
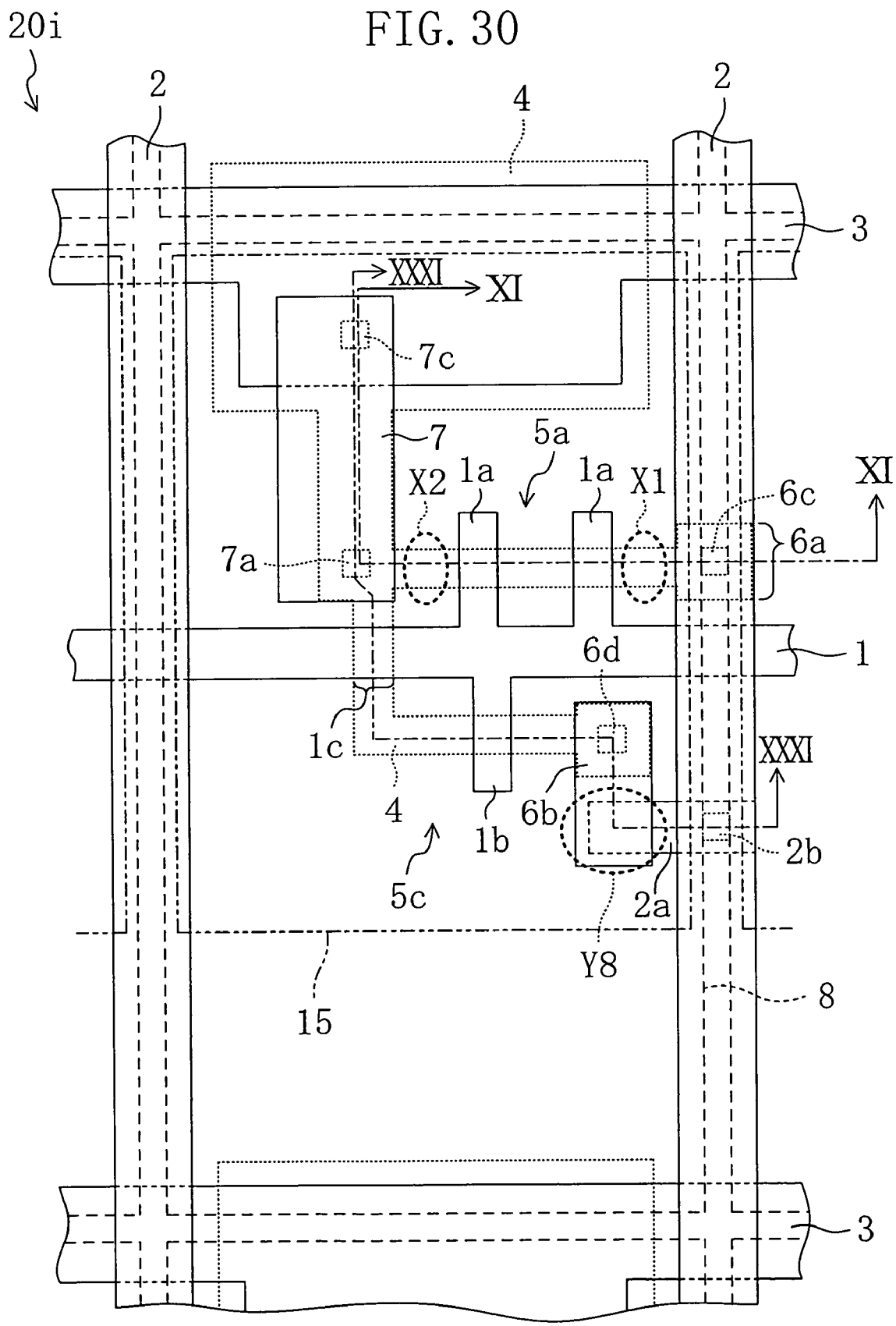
FIG. 30 is a schematic plan view of an active matrix substrate according to embodiment 6 of the present invention.
Figure 31:
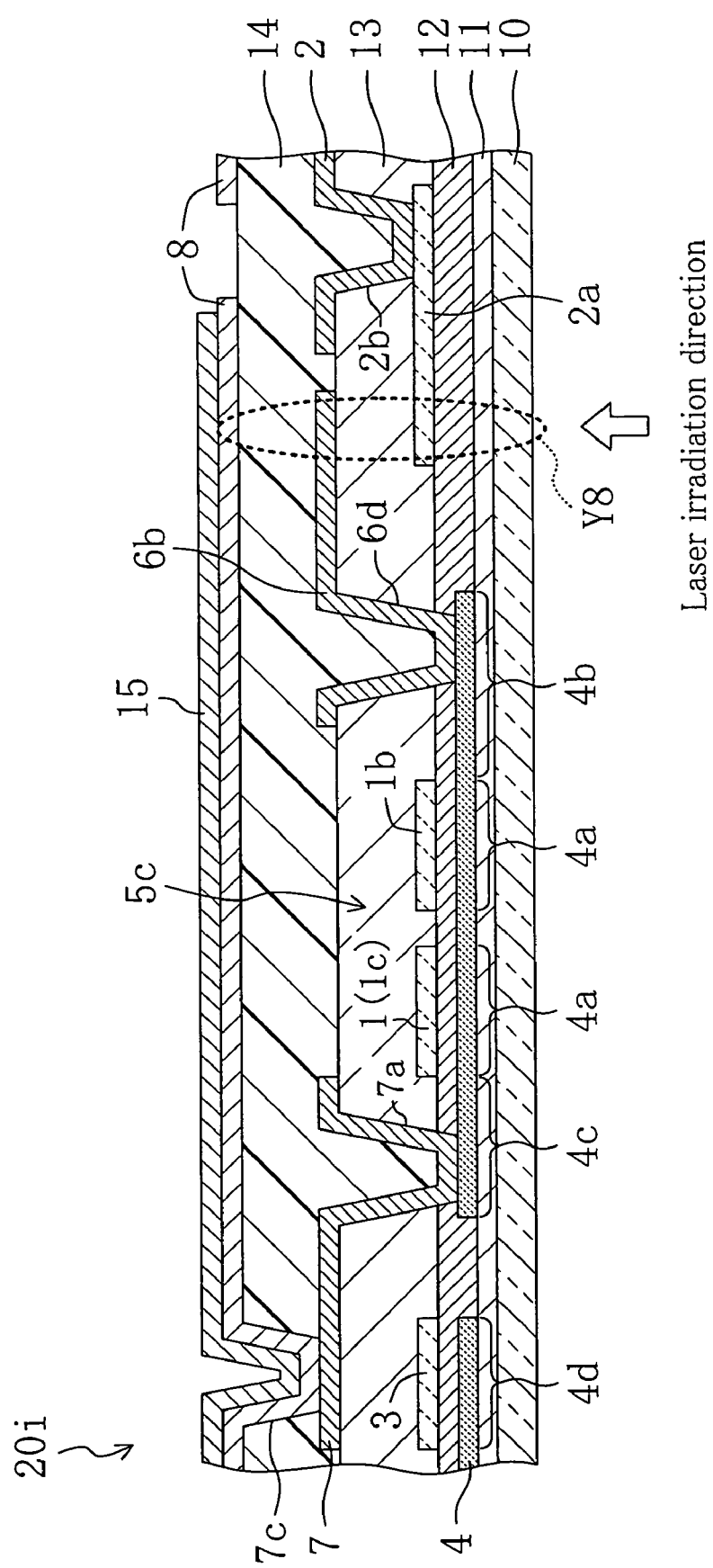
FIG. 31 is a schematic cross-sectional view of the active matrix substrate (before defect repair) according to embodiment 6 of the present invention, which is taken along line XXXI—XXXI of FIG. 30.

FIG. 30 is a schematic plan view of an active matrix substrate 20i of the liquid crystal display device of embodiment 6. FIG. 31 is a schematic cross-sectional view of the active matrix substrate 20i taken along line XXXI—XXXI of FIG. 30. The cross-sectional structure of the active matrix substrate 20i taken along line XI—XI of FIG. 30 is substantially the same as that of the active matrix substrate 20c of FIG. 11, and therefore, the cross-sectional view thereof is not provided herein.

The liquid crystal display device of embodiment 6 includes the active matrix substrate 20i, a counter substrate that faces the active matrix substrate 20i, and a liquid crystal layer interposed between these substrates.

As shown in FIG. 31, in the active matrix substrate 20i, a layered film structure between a base coat film 11 and a pixel electrode 8 is substantially the same as that of the active matrix substrate 20g of embodiment 4. A reflector electrode 15 is provided on the pixel electrode 8 so as to cover a first TFT 5a and a second TFT 5c, and an alignment film is provided so as to cover the pixel electrode 8 and the reflector electrode 15.

The reflector electrode 15 overlaps about 70% area of the pixel electrode 8 as in embodiment 3 and comparative example 3. The reflector electrode 15 constitutes a reflection region. The remaining area, i.e., about 30%, of the pixel electrode 8 that the reflector electrode 15 does not overlap constitutes a transmission region.

The counter substrate and the liquid crystal layer of embodiment 6 are substantially the same as those of embodiment 1 and, therefore, the detailed descriptions thereof are herein omitted.

In the liquid crystal display device of embodiment 6, a predetermined charge is written in the pixel electrode 8 and the reflector electrode 15 in each pixel, so that a potential difference occurs between the pixel electrode 8 and reflector electrode 15 and the common electrode 17, whereby a predetermined voltage is applied to the liquid crystal capacitance formed by the liquid crystal layer 40 and the auxiliary capacitor, as in embodiment 3 and comparative example 3. The transmittance of light coming from the outside is adjusted using the mechanism that the orientation of liquid crystal molecules changes according to the largeness of the applied voltage, whereby an image is displayed. In the reflection region, light coming from the outside through the counter substrate is reflected by the reflector electrode 15, while the transmission region transmits light coming from the outside through the active matrix substrate 20i, whereby an image is displayed.

Next, a fabrication method of the active matrix substrate 20i included in a liquid crystal device of embodiment 6 of the present invention is partially described.

At the first step, the active matrix substrate 20g of embodiment 4 is prepared.

Then, as in embodiment 3 and comparative example 3, a molybdenum film (about 100 nm thick) and an aluminum film (about 150 nm thick) are formed on the pixel electrode 8 over the active matrix substrate 20g by sputtering. The films are patterned using PEP technology to form a reflector electrode 15.

Thus, as described above, the active matrix substrate 20i has been fabricated. Thereafter, a thin film of a polyimide resin is formed by printing over the active matrix substrate 20i. The surface of the thin film is subjected to an alignment treatment by a rubbing method to form an alignment film.

Next, a defect repair method used in the liquid crystal display device of embodiment 6 of the present invention is described.

Figure 32:
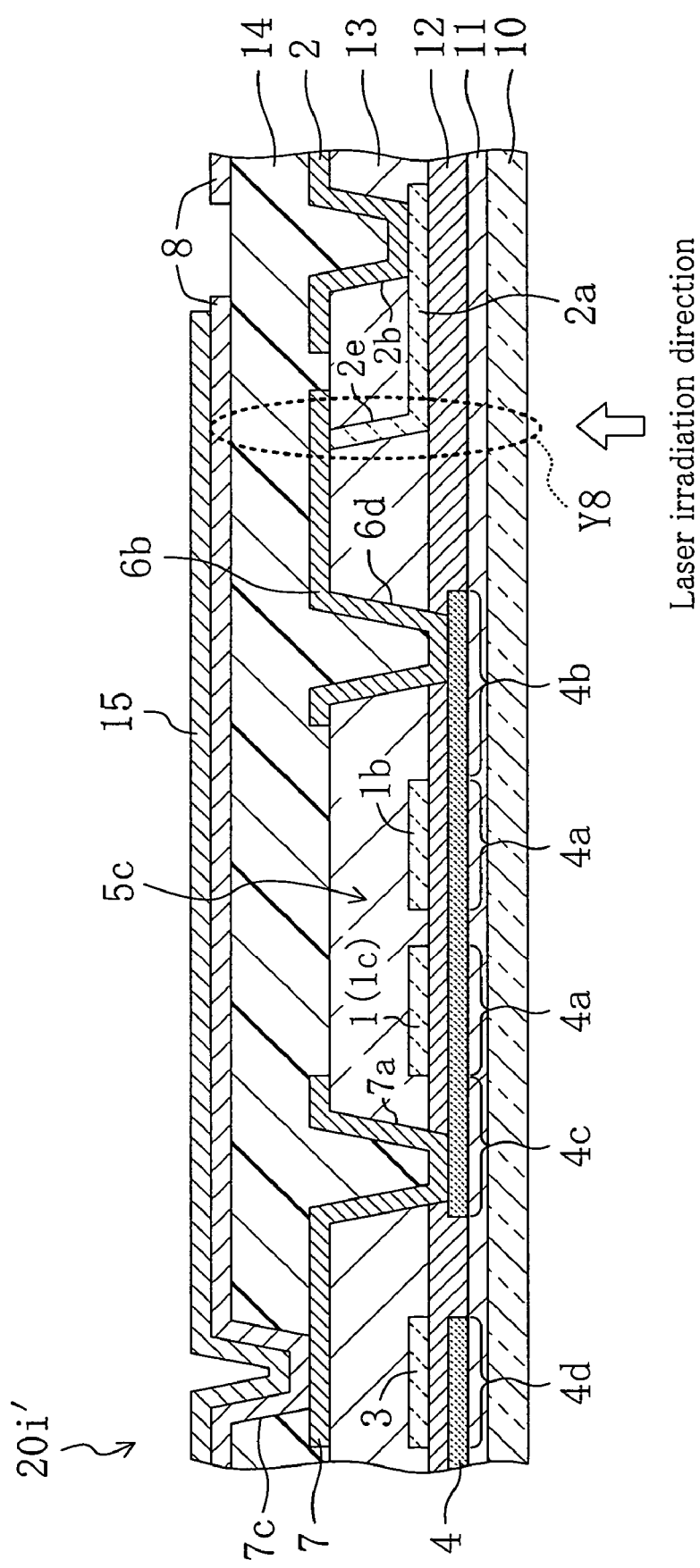
FIG. 32 is a schematic cross-sectional view of the active matrix substrate (after defect repair) according to embodiment 6 of the present invention, which corresponds to the schematic cross-sectional view of FIG. 31.
Figure 33:
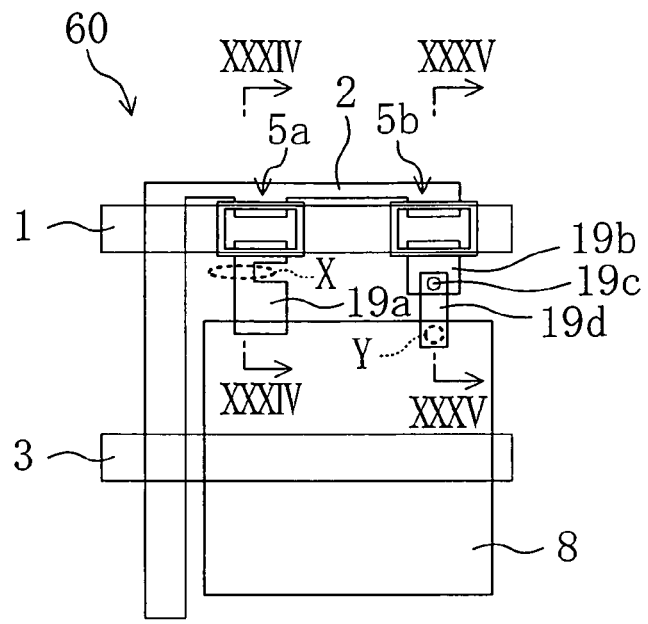
FIG. 33 is a schematic plan view of a conventional active matrix substrate.
Figure 34:
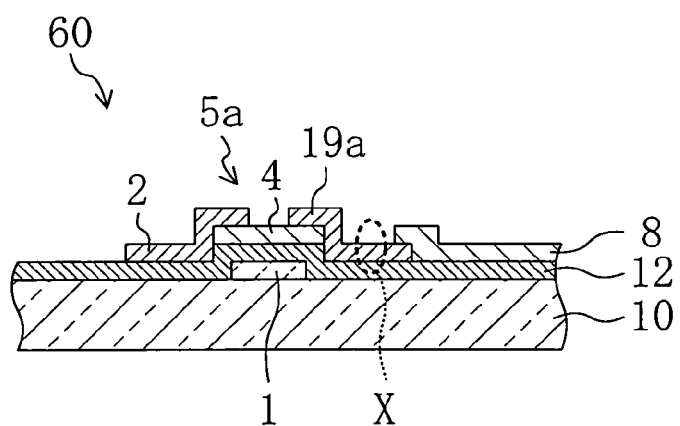
FIG. 34 is a schematic cross-sectional view of the conventional active matrix substrate taken along line XXXIV—XXXIV of FIG. 33.
Figure 35:
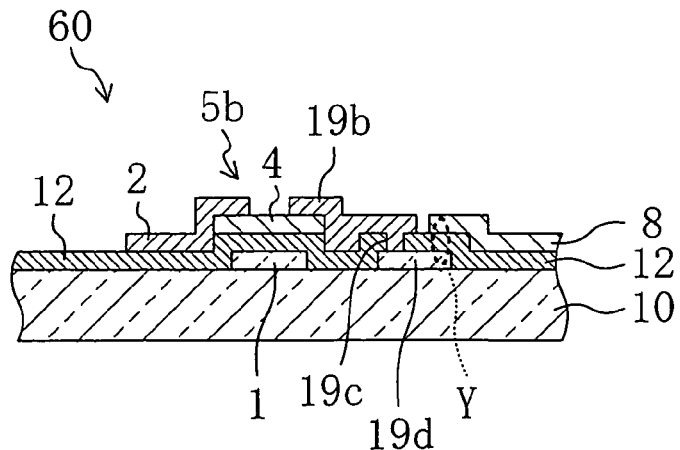
FIG. 35 is a schematic cross-sectional view of the conventional active matrix substrate taken along line XXXV—XXXV of FIG. 35.

FIG. 32 is a schematic cross-sectional view of an active matrix substrate 20i' obtained after the defect repair process, which corresponds to the schematic cross-sectional view of FIG. 31 (before defect repair).

In the example of FIG. 32, the overlapping region Y8 is irradiated with laser light emitted through the glass substrate 10 such that a contact hole 2e is formed in the overlapping region Y8.

The defect repair method of the liquid crystal display device of embodiment 6 and the effects of the method are the same as those of embodiment 1, and therefore, the detailed descriptions thereof are herein omitted.

As described above, in the liquid crystal display device of embodiment 6, the pixel electrode 8 and the drain electrodes 4c of the first TFT 5a and the second TFT 5c are electrically connected through the same contact hole 7a as in embodiment 4 and, therefore, part of the elements that constitute the first TFT 5a and the second TFT 5c, i.e., the contact hole for connecting the pixel electrode 8 and the drain electrodes 4c, is shared among the first TFT 5a and the second TFT 5c. Thus, the area occupied by the contact hole in a pixel is decreased and, accordingly, the aperture ratio of the pixel is increased. Further, the area of the reflector electrode 15 is decreased and, accordingly, the aperture ratio of the transmission region is also improved. Furthermore, the number of elements that constitute a TFT is decreased and, accordingly, the production yield is also improved.

In the above-described example of embodiment 6, the semitransmissive liquid crystal display device which has both a reflection region and a transmission region in each pixel has been described. However, the liquid crystal display device of embodiment 6 may be a reflective liquid crystal display device wherein the reflective region extends over the entire area of each pixel. In this case, the pixel electrode 8 formed of ITO may be replaced by a reflector electrode 15 formed of an aluminum film. Alternatively, a reflector electrode may be added to the active matrix substrate 20h of embodiment 5.

In the examples of embodiments 4 to 6, the technique of sharing a contact hole to improve the aperture ratio is applied to the liquid crystal display devices of embodiments 1 to 3 wherein a contact hole is formed in the interlayer insulation film to enable the operation of the second TFT. Alternatively, according to the present invention, the technique of improving the aperture ratio may be applied to the liquid crystal display devices of comparative examples 1 to 3 wherein a contact hole is formed in the gate insulation film to enable the operation of the second TFT.

It should be noted that the present invention is applicable to an electronic device having a switching element, such as an X-ray sensor, a light receiving device, or the like.

As described above, the present invention suppresses a decrease in the production yield even when a spare TFT is provided and is therefore useful for an active-driven liquid crystal display device wherein TFTs are provided in a matrix.

What is claimed is:

1. An electronic device, comprising:
   a signal supplying section;
   a signal receiving section;
   a first switching element for switching an electrical connection between the signal supplying section and the signal receiving section; and
   a second switching element as a spare,
   wherein the second switching element includes a semiconductor film and a gate electrode, the semiconductor film including a source electrode and a drain electrode, the gate electrode being provided on the semiconductor film with a gate insulation film interposed therebetween, the electronic device includes an interlayer insulation film between the signal supplying section and the semiconductor film of the second switching element, the interlayer insulation film being thicker than the gate insulation film, the signal supplying section is electrically connectable to the source electrode of the semiconductor film by forming a contact hole in the interlayer insulation film, the electronic device includes an interlayer insulation film between the signal receiving section and the semiconductor film of the second switching element, the interlayer insulation film being thicker than the gate insulation film, the signal receiving section is electrically connectable to the drain electrode of the semiconductor film by forming a contact hole in the interlayer insulation film, and when the first switching element is unusable, the electrical connection between the signal supplying section and the signal receiving section is rendered switchable by the second switching element by forming a contact hole in the interlayer insulation film.

2. An electronic device, comprising:

a signal supplying section;

a signal receiving section;

a first switching element for switching an electrical connection between the signal supplying section and the signal receiving section; and a second switching element as a spare, wherein the second switching element includes a semiconductor film and a gate electrode, the semiconductor film including a source electrode and a drain electrode, the gate electrode being provided on the semiconductor film with a gate insulation film interposed therebetween, the electronic device includes an interlayer insulation film between the signal supplying section and the semiconductor film of the second switching element, the interlayer insulation film being thicker than the gate insulation film, the signal supplying section is electrically connectable to the source electrode of the semiconductor film by forming a contact hole in the interlayer insulation film, and when the first switching element is unusable, the electrical connection between the signal supplying section and the signal receiving section is rendered switchable by the second switching element by forming a contact hole in the interlayer insulation film.

3. An electronic device, comprising:

a signal supplying section;

a signal receiving section;

a first switching element for switching an electrical connection between the signal supplying section and the signal receiving section; and a second switching element as a spare, wherein the second switching element includes a semiconductor film and a gate electrode, the semiconductor film including a source electrode and a drain electrode, the gate electrode being provided on the semiconductor film with a gate insulation film interposed therebetween, the electronic device includes an interlayer insulation film between the signal receiving section and the semiconductor film of the second switching element, the interlayer insulation film being thicker than the gate insulation film, the signal receiving section is electrically connectable to the drain electrode of the semiconductor film by forming a contact hole in the interlayer insulation film, and when the first switching element is unusable, the electrical connection between the signal supplying section and the signal receiving section is rendered switchable by the second switching element by forming a contact hole in the interlayer insulation film.

4. The electronic device of claim 2, wherein:

the first switching element includes a semiconductor film and a gate electrode, the semiconductor film including a source electrode and a drain electrode, the gate electrode being provided on the semiconductor film with a gate insulation film interposed therebetween; and the drain electrodes of the first switching element and the second switching element are electrically connected to the signal receiving section through a same contact hole.

5. The electronic device of claim 3, wherein:

the first switching element includes a semiconductor film and a gate electrode, the semiconductor film including a source electrode and a drain electrode, the gate electrode being provided on the semiconductor film with a gate insulation film interposed therebetween; and the source electrodes of the first switching element and the second switching element are electrically connected to the signal supplying section through a same contact hole.

6. A display device, comprising:

a source line;

a pixel electrode;

a first switching element for switching an electrical connection between the source line and the pixel electrode; and a second switching element as a spare, wherein the second switching element includes a semiconductor film and a gate electrode, the semiconductor film including a source electrode and a drain electrode, the gate electrode being provided on the semiconductor film with a gate insulation film interposed therebetween, the display device includes an interlayer insulation film between the source line and the semiconductor film of the second switching element, the interlayer insulation film being thicker than the gate insulation film, the source line is electrically connectable to the source electrode of the semiconductor film by forming a contact hole in the interlayer insulation film, the display device includes an interlayer insulation film between the pixel electrode and the semiconductor film of the second switching element, the interlayer insulation film being thicker than the gate insulation film, the pixel electrode is electrically connectable to the drain electrode of the semiconductor film by forming a contact hole in the interlayer insulation film, and when the first switching element is unusable, the electrical connection between the source line and the pixel electrode is rendered switchable by the second switching element by forming a contact hole in the interlayer insulation film.

7. A display device, comprising:
a source line;
a pixel electrode;
a first switching element for switching an electrical connection between the source line and the pixel electrode; and
a second switching element as a spare,
wherein the second switching element includes a semiconductor film and a gate electrode, the semiconductor film including a source electrode and a drain electrode, the gate electrode being provided on the semiconductor film with a gate insulation film interposed therebetween,
the display device includes an interlayer insulation film between the source line and the semiconductor film of the second switching element, the interlayer insulation film being thicker than the gate insulation film,
the source line is electrically connectable to the source electrode of the semiconductor film by forming a contact hole in the interlayer insulation film, and
when the first switching element is unusable, the electrical connection between the source line and the pixel electrode is rendered switchable by the second switching element by forming a contact hole in the interlayer insulation film.

8. A display device, comprising:
a source line;
a pixel electrode;
a first switching element for switching an electrical connection between the source line and the pixel electrode; and
a second switching element as a spare,
wherein the second switching element includes a semiconductor film and a gate electrode, the semiconductor film including a source electrode and a drain electrode, the gate electrode being provided on the semiconductor film with a gate insulation film interposed therebetween,
the display device includes an interlayer insulation film between the pixel electrode and the semiconductor film of the second switching element, the interlayer insulation film being thicker than the gate insulation film,
the pixel electrode is electrically connectable to the drain electrode of the semiconductor film by forming a contact hole in the interlayer insulation film, and
when the first switching element is unusable, the electrical connection between the source line and the pixel electrode is rendered switchable by the second switching element by forming a contact hole in the interlayer insulation film.

9. The display device of claim 6, wherein the source electrode of the semiconductor film of the second switching element is electrically connected to the source line in advance.

10. The display device of claim 6, further comprising a gate line electrically connected to the gate electrode of the second switching element,
wherein the first and second switching elements are provided at opposite sides of the gate line.

11. The display device of claim 6, further comprising a reflector electrode which covers the first and second switching elements.

12. The display device of claim 7, wherein the source electrode of the semiconductor film of the second switching element is electrically connected to the source line in advance.

13. The display device of claim 7, further comprising a gate line electrically connected to the gate electrode of the second switching element,
wherein the first and second switching elements are provided at opposite sides of the gate line.

14. The display device of claim 7, further comprising a reflector electrode which covers the first and second switching elements.

15. The display device of claim 7, wherein:
the first switching element includes a semiconductor film and a gate electrode, the semiconductor film including a source electrode and a drain electrode, the gate electrode being provided on the semiconductor film with a gate insulation film interposed therebetween; and
the drain electrodes of the first switching element and the second switching element are electrically connected to the pixel electrode through a same contact hole.

16. The display device of claim 8, wherein the source electrode of the semiconductor film of the second switching element is electrically connected to the source line in advance.

17. The display device of claim 8, further comprising a gate line electrically connected to the gate electrode of the second switching element,
wherein the first and second switching elements are provided at opposite sides of the gate line.

18. The display device of claim 8, further comprising a reflector electrode which covers the first and second switching elements.

19. The display device of claim 8, wherein:
the first switching element includes a semiconductor film and a gate electrode, the semiconductor film including a source electrode and a drain electrode, the gate electrode being provided on the semiconductor film with a gate insulation film interposed therebetween; and
the source electrodes of the first switching element and the second switching element are electrically connected to the source line through a same contact hole.

20. A display device, comprising:
a source line;
a pixel electrode;
a first switching element for switching an electrical connection between the source line and the pixel electrode; and
a second switching element as a spare,
wherein the second switching element includes a semiconductor film and a gate electrode, the semiconductor film including a source electrode and a drain electrode, the gate electrode being provided on the semiconductor film with a gate insulation film interposed therebetween,
the display device includes an interlayer insulation film between the source line and the semiconductor film of the second switching element, the interlayer insulation film being thicker than the gate insulation film,
the source line is electrically connectable to the source electrode of the semiconductor film by forming a contact hole in the interlayer insulation film,
the display device includes an interlayer insulation film between the pixel electrode and the semiconductor film of the second switching element, the interlayer insulation film being thicker than the gate insulation film,
the pixel electrode is electrically connectable to the drain electrode of the semiconductor film by forming a contact hole in the interlayer insulation film, and the first switching element is unusable, and the interlayer insulation film has the contact hole such that the electrical connection between the source line and the pixel electrode is switchable by the second switching element.

21. A display device, comprising:
a source line;
a pixel electrode;
a first switching element for switching an electrical connection between the source line and the pixel electrode; and
a second switching element as a spare,
wherein the second switching element includes a semiconductor film and a gate electrode, the semiconductor film including a source electrode and a drain electrode, the gate electrode being provided on the semiconductor film with a gate insulation film interposed therebetween,
the display device includes an interlayer insulation film between the source line and the semiconductor film of the second switching element, the interlayer insulation film being thicker than the gate insulation film,
the source line is electrically connectable to the source electrode of the semiconductor film by forming a contact hole in the interlayer insulation film, and
the first switching element is unusable, and the interlayer insulation film has the contact hole such that the electrical connection between the source line and the pixel electrode is switchable by the second switching element.

22. A display device, comprising:
a source line;
a pixel electrode;
a first switching element for switching an electrical connection between the source line and the pixel electrode; and
a second switching element as a spare,
wherein the second switching element includes a semiconductor film and a gate electrode, the semiconductor film including a source electrode and a drain electrode, the gate electrode being provided on the semiconductor film with a gate insulation film interposed therebetween,
the display device includes an interlayer insulation film between the pixel electrode and the semiconductor film of the second switching element, the interlayer insulation film being thicker than the gate insulation film,
the pixel electrode is electrically connectable to the drain electrode of the semiconductor film by forming a contact hole in the interlayer insulation film, and
the first switching element is unusable, and the interlayer insulation film has the contact hole such that the electrical connection between the source line and the pixel electrode is switchable by the second switching element.

23. The display device of claim 21, wherein:
the first switching element includes a semiconductor film and a gate electrode, the semiconductor film including a source electrode and a drain electrode, the gate electrode being provided on the semiconductor film with a gate insulation film interposed therebetween; and
the drain electrodes of the first switching element and the second switching element are electrically connected to the pixel electrode through a same contact hole.

24. The display device of claim 22, wherein:
the first switching element includes a semiconductor film and a gate electrode, the semiconductor film including a source electrode and a drain electrode, the gate electrode being provided on the semiconductor film with a gate insulation film interposed therebetween; and
the source electrodes of the first switching element and the second switching element are electrically connected to the source line through a same contact hole.

* * * * *